US006643196B2

(12) United States Patent
Sugio

(10) Patent No.: US 6,643,196 B2
(45) Date of Patent: Nov. 4, 2003

(54) REDUNDANT MEMORY CIRCUIT FOR ANALOG SEMICONDUCTOR MEMORY

(75) Inventor: Kenichiro Sugio, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/058,786

(22) Filed: Jan. 30, 2002

(65) Prior Publication Data
US 2002/0126550 A1 Sep. 12, 2002

(30) Foreign Application Priority Data

Mar. 9, 2001 (JP) ........................................ 2001-066277

(51) Int. Cl.[7] .......................... G11C 7/00; G11C 16/04; G11C 16/06
(52) U.S. Cl. .............. 365/200; 365/185.09; 365/185.11
(58) Field of Search ............................ 365/200, 185.09, 365/185.11

(56) References Cited

U.S. PATENT DOCUMENTS

| | | | | | |
|---|---|---|---|---|---|
| 5,359,570 A | * | 10/1994 | Hsu et al. | .................... | 365/200 |
| 5,691,945 A | * | 11/1997 | Liou et al. | .................... | 365/200 |
| 5,936,971 A | * | 8/1999 | Harari et al. | ................ | 365/200 |

* cited by examiner

Primary Examiner—Trong Phan
(74) Attorney, Agent, or Firm—Volentine Francos, PLLC

(57) ABSTRACT

A redundant memory circuit for use in an analog semiconductor memory has a cell array divided into sectors. To replace bad sectors, the cell array may include a pair of redundant sectors disposed at opposite ends of the cell array, or may have a centrally located redundant sector. Alternatively, the redundant memory circuit may have a sector selection circuit that selects the sectors and redundant sector in sequence from one end of the cell array to the other, or may have a word line selector located in the center of the cell array, or may have two cell arrays and a redundant sector selection circuit that enables a bad sector in one cell array to be replaced by a redundant sector in either of the two cell arrays. These arrangements improve the capability for redundancy replacement and the quality of the reproduced analog signal.

16 Claims, 52 Drawing Sheets

ASLDEC

SSL-U

SSL-D

REDUNDANT MEMORY CIRCUIT FOR ANALOG SEMICONDUCTOR MEMORY

BACKGROUND OF THE INVENTION

1. Field of the Invention

The present invention relates to an analog semiconductor memory such as an analog audio flash memory and, more particularly, to a redundant analog semiconductor memory circuit in which bad sectors are replaced with redundant sectors.

2. Description of the Related Art

As shown in FIGS. 1A and 1B, an analog audio flash memory comprises an input pad 1, an input amplifier 2, an input low-pass filter (LPF) 3, a write gate voltage generating circuit 4 (known also as a programming voltage generating circuit, referred to below as a VPP circuit), a memory circuit 13 including an address decoder 5 and a memory cell section 6, a shift voltage generating circuit (VSFT circuit) 7, a sense amplifier circuit (SA-AMP circuit) 8, a read gate voltage generating circuit 9 (known also as a verify voltage generating circuit, referred to below as a VVFY circuit), an analog output circuit 10 (known also as a shifted playback output circuit, referred to below as an SHPLYO circuit), an output low-pass filter (LPF) 11, and an output pad 12. The elements in FIG. 1A pertain to the recording process (the writing or programming of the audio signal into the memory); the elements in FIG. 1B pertain to the playback or reproduction process (the reading of the recorded audio signal from the memory).

In the recording process, an analog input voltage AIN1 representing an analog audio signal is received at the input pad 1 and supplied to the non-inverting input terminal of the input amplifier 2. An internally generated analog signal reference potential SG is supplied to the inverting input terminal of the input amplifier 2. The input amplifier 2 subtracts the analog signal reference potential SG from the input audio signal voltage AIN1 to generate an input audio signal voltage AIN, which is supplied to the input low-pass filter 3. This low-pass filter 3 rejects noise components and harmonics present in the input audio signal voltage AIN, and supplies the resulting filtered signal to the VPP circuit 4.

The VSFT circuit 7 generates an analog input shift voltage VSFT1, which is supplied to the VPP circuit 4. The purpose of the analog input shift voltage VSFT1 is to shift the input audio signal voltage AIN upward to a voltage suitable for programming memory cells. The shifting is carried out by the VPP circuit 4, which thereby generates a programming voltage VPP, referred to below as a write gate voltage, responsive to the input audio signal voltage AIN. The write gate voltage VPP is supplied to the address decoder 5 and applied to memory cells in the memory cell section 6. More specifically, the address decoder 5 writes the audio signal in the memory cell section 6 by sequentially selecting the memory cells in the memory cell section 6 and applying the write gate voltage VPP to the gate electrodes of transistors in the selected memory cells.

Referring to FIG. 1B, when the signal is reproduced, the VVFY circuit 9 generates a variable verify voltage VVFY, referred to below as a read gate voltage. The address decoder 5 sequentially selects the memory cells in the memory cell section 6, applies the read gate voltage VVFY to the gates of transistors in the selected memory cells, and outputs the signal read from each memory cell (the memory cell signal ICELL) to the sense amplifier (SA-AMP) circuit 8. The sense amplifier circuit 8 converts the memory cell signal ICELL to a sense amplifier output signal SAOUT which goes either high or low. The VVFY circuit 9 varies the read gate voltage VVFY while monitoring the sense amplifier output signal SAOUT, and finds the VVFY value at which SAOUT switches between high and low; this value is the threshold voltage of the memory cell being read. The VSFT circuit 7 generates an analog output shift voltage VSFT2, which is similar to the analog input shift voltage VSFT1 mentioned above but is supplied to the analog output (SHPLYO) circuit 10. The purpose of the analog output shift voltage VSFT2 is to shift the read gate voltage VVFY down to a value equivalent to the original input audio signal voltage AIN. When the read gate voltage VVFY has settled at the memory cell threshold value, the SHPLYO circuit 10 samples the VVFY value, shifts the sampled value down according to the analog output shift voltage VSFT2, thereby generates an output analog signal SHPLYO equivalent to the original input audio signal voltage AIN, and outputs SHPLYO to the output low-pass filter 11. This low-pass filter 11 rejects noise components and harmonic components present in the output analog signal SHPLYO, and outputs the filtered signal to the output pad 12.

An analog audio flash memory is a type of multi-level memory, in that each memory cell stores a value that can range over many different levels. In the present case, the analog voltage of the audio signal is sampled periodically, and each sample is written as an analog value into one memory cell, as the threshold voltage of a transistor in the memory cell. When the signal is reproduced, the stored values (threshold voltages) are read out as analog values. Accordingly, more information can be stored per memory cell than in a digital flash memory, in which each memory cell stores only a single bit of information (0 or 1). Moreover, the need for analog-to-digital and digital-to-analog conversion is eliminated.

Conventional Redundant Memory Circuit

To lengthen the recording and playback times of audio flash memory chips, memory capacities are being increased, necessitating fabrication processes with increasingly smaller feature sizes, and reduced yields due to defective memory cells have become a problem. To keep yields from declining, it has become common to incorporate a redundancy replacement function into the memory circuit 13, by providing redundant memory cells.

FIG. 46 shows the overall layout of a conventional redundant memory circuit comprising a predecoder PDEC and four memory units UMEU0, UMEU1, UMEU2, UMEU3. The notation UMEU will be used below to denote any one of these four memory units. The memory units include redundant sectors, indicated by hatching.

FIG. 47 shows the layout of a memory unit UMEU in more detail. The memory unit UMEU includes four cell arrays UCLA, (individually denoted UCLA-LU, UCLA-RU, UCLA-LD, UCLA-RD), four word line decoders WLDEC (WLDEC-LU, WLDEC-RU, WLDEC-LD, WLDEC-RD), four bit-line decoders UBLDEC (UBLDEC-LU, UBLDEC-RU, UBLDEC-LD, UBLDEC-RD), and four source line decoders USLDEC (USLDEC-LU, USLDEC-RU, USLDEC-LD, USLDEC-RD).

Each cell array UCLA has its own word line decoder WLDEC, bit line decoder UBLDEC, and source line decoder USLDEC. The memory cell section 6 in FIGS. 1A and 1B comprises sixteen cell arrays. The address decoder 5 in FIGS. 1A and 1B comprises the predecoder, the sixteen word line decoders, the sixteen bit line decoders, and the sixteen source line decoders.

Cell Arrays of the Conventional Redundant Memory Circuit

A cell array UCLA comprises sixty-four sectors SC (SC0, SC1, ..., SC63) and one redundant sector RSC. The cell array UCLA has two hundred fifty-six word lines WL (WL0, WL1, ..., WL255), five hundred twelve bit lines BL (BL0, BL1, ..., BL511), sixty-four source lines SL (SL0, SL1, ..., SL63), eight redundant bit lines RBL (RBL0, RBL1, ..., RBL7), and one redundant source line RSL. This cell array UCLA, incidentally is derivable by adding a redundant sector RSC, redundant bit lines RBL0 to RBL7, and a redundant source line RSL to a non-redundant cell array, shown in FIG. 3, which will be described later.

The word lines WL0–WL255 are controlled by the word line decoder WLDEC, the bit lines BL0–BL511 and RBL0–RBL7 by the bit line decoder UBLDEC, and the source lines SL0–SL63 and RSL by the source line decoder USLDEC.

Each sector SC (and the redundant sector RSC) is a two-kilocell array comprising two thousand forty-eight memory cells. (A kilocell is $2^{10}$ memory cells.) A cell array UCLA is a 128-kilocell array with an additional two-kilocell redundant sector comprising redundant memory cells. A memory unit UMEU thus has a (512+8)-kilocell configuration.

Sectors and Memory Cells

FIG. 4 illustrates the k-th sector SC<k> (where k is any integer from 0 to 63) in FIG. 47. The two thousand forty-eight memory cells (one of which is labeled MOL in the drawing) are located at the intersections of the two hundred fifty-six word lines WL0–WL255 and eight bit lines BL<8k>, BL<8k+1>, ..., BL<8k+7>. All of the memory cells in the k-th sector are connected to one source line SL<k>.

Redundant Sector and Redundant Memory Cells

FIG. 48 illustrates the redundant sector RSC in FIG. 47. The two thousand forty-eight redundant memory cells (one of which is labeled RMCL) are located at the intersections of the two hundred fifty-six word lines WL0–WL255 and the eight redundant bit lines RBL0 to RBL7. All of the redundant memory cells are connected to the redundant source line RSL. A redundant memory cell RMCL includes a non-volatile memory transistor MTr and an n-channel metal-oxide-semiconductor (NMOS) transistor NTr. The memory cells MCL in FIG. 4 have the same structure.

Predecoder

The predecoder PDEC controls the word line decoders WLDEC, the bit line decoders UBLDEC, and the source line decoders USLDEC, and selects the cell arrays UCLA sequentially when an audio signal is recorded or reproduced (when data are erased and written, or read).

Word Line Decoder

A word line decoder functions as a word line selector. FIG. 5 shows the circuit configuration of the left word line decoders WLDEC-LU and WLDEC-LD; FIG. 6 shows the circuit configuration of the right word line decoders WLDEC-RU and WLDEC-RD. The word lines WL0–WL255 are selected one by one according to row addresses Add0, ADD1, ..., ADD31 and word line selection signals SXH0, SXH1, ..., SXH7, SXHB0, SXHB1, ..., SXHB7. For recording, the write gate voltage VPP is supplied to the selected word line. For reproduction, the read gate voltage VVFY is supplied to the selected word line WL. A more detailed description will be deferred until later.

Conventional Bit Line Decoder

FIG. 49 shows an example of the circuit configuration of the conventional bit line decoder UBLDEC, comprising NMOS transistors NYB0, ..., NYB7, NYB504, NYB511, RNYB0, RNYB1, ..., RNYB7, further NMOS transistors NYA0, NYA1, NYA62, NYA63, RNYA, and still further NMOS transistors NYC0, NYC1, ..., NYC62, NYC63. This bit line decoder UBLDEC is derivable by adding NMOS transistors RNYB0–RNYB7 and RNYA to a bit line decoder BLDEC for a non-redundant memory circuit, shown in FIG. 7 and described later, in order to select the redundant bit lines RBL0–RBL7.

When data are written or read, the bit line decoder UBLDEC selects the bit lines BL0, ..., BL7, ..., BL504, ..., BL511 and redundant bit lines RBL0–RBL7 (if redundancy replacement has been performed) in sequence, one at a time, according to bit line selection signals YB0, YB1, ..., YB7, sector selection signals YA0, YA1, ..., YA7, YC0, YC1, ..., YC7, and a redundant sector selection signal RYA. When data are written, a memory cell write voltage VW is supplied to the selected bit line BL or redundant bit line RBL. For data reproduction, the memory cell signal ICELL is output on the selected bit line BL or redundant bit line RBL.

Conventional Source Line Decoder

FIG. 50 shows an example of the circuit configuration of the conventional source line decoder USLDEC, comprising NMOS transistors NYAB0, NYAB1, ..., NYAB62, NYAB63, RNYAB, and further NMOS transistors NYOB0, NYOB1, ..., NYCB62, NYCB63. This source line decoder USLDEC is derivable by adding one NMOS transistor RNYAB to a source line decoder SLDEC for a non-redundant memory circuit, shown in FIG. 8 and described later, in order to select the redundant source line RSL.

When data are erased, the source line decoder USLDEC selects the source lines SL0–SL63 and redundant source line RSL (if redundancy replacement has been performed) in sequence, one at a time, according to source line selection signals YAB0, YAB1, ..., YAB7, YCB0, YCB1, ..., YCB7, and a redundant sector selection signal RYAB. A memory cell erase voltage VERASE is supplied to the selected source line SL or redundant source line RSL.

Layout of the Conventional Redundant Memory Circuit

In the conventional redundant memory circuit, the predecoder PDEC is disposed at one end of the memory units UMEU (adjacent the top memory unit UMEU0 as in FIG. 46). The memory cell section 6 is divided into a left part including eight left cell arrays UCLA-L (UCLA-LU or UCLA-LD) and a right part including eight right cell arrays UCLA-R (UCLA-RU or UCLA-RD). Each part has a capacity of one megacell, giving the memory cell section 6 a capacity of two megacells. Each cell array UCLA has a capacity of 130 kilocells, of which 128 kilocells are memory cells MCL and 2 kilocells are redundant memory cells RMCL.

The word line decoders WLDEC in each memory unit UMEU are disposed between the left cell arrays UCLA-L and the right cell arrays UCLA-R. The bit line decoders BLDEC and source line decoders SLDEC are disposed between the upper and lower left cell arrays UCLA-LU and UCLA-LD, and between the upper and lower right cell arrays UCLA-RU and UCLA-RD.

In the conventional redundant memory circuit, one redundant sector RSC is disposed at the end of each cell array UCLA adjacent the word line decoder WLDEC, as shown in FIG. 47. The redundant sector RSC is thus disposed at the right end of a left cell array UCLA-L, and at the left end of a right cell array UCLA-R.

The sectors SC in each cell array UCLA-LU, UCLA-LD, UCLA-RU, UCLA-RD in FIG. 47 are numbered (from 0 to 63) in their order of access. The word lines WL (0–255), bit lines BL (0–511), and source lines SL (0–63) are numbered in their order of selection. The redundant bit lines RBL are numbered (from 0 to 7) in their order of selection when the redundant sector RSC is used to replace a bad sector.

In the upper cell arrays UCLA-LU and UCLA-RU in the memory unit UMEU in FIG. 47, sectors SC0 to SC63 are accessed, and thus numbered, starting from the end opposite the word line decoder WLDEC; that is, they are numbered from left to right in cell array UCLA-LU, and from right to left in cell array UCLA-RU, with the redundant sector RSC following sector SC63 in each case. In the lower cell arrays UCLA-LD and UCLA-RD, sectors SC0 to SC63 are accessed and numbered starting from the end adjacent the word line decoder WLDEC: from right to left in cell array UCLA-LD, and from left to right in cell array UCLA-RD, with the redundant sector RSC preceding sector SC0 in each case.

Similarly, in the upper cell arrays UCLA-LU and UCLA-RU in the memory unit UMEU, the bit lines BL0–BL511 and redundant bit lines RBL0–RBL7, and the source lines SL0–SL63 and redundant source line RSL, are numbered starting from the end opposite the word line decoder WLDEC; that is, they are numbered from left to right in cell array UCLA-LU, and from right to left in cell array UCLA-RU, the redundant bit lines and source line coming last in each sequence (e.g., RBL0 follows BL511). In the lower cell arrays UCLA-LD and UCLA-RD, the bit lines BL0–BL511 and redundant bit lines RBL0–RBL7, and the source lines SL0–SL63 and redundant source line RSL, are numbered starting from the end adjacent the word line decoder WLDEC: from right to left in cell array UCLA-LD, and from left to right in cell array UCLA-RD, the redundant bit lines and source line coming first in each sequence (e.g., BL0 follows RBL7).

The word lines WL0–WL255 in a cell array UCLA are numbered in sequence starting from the side adjacent the bit line decoder BLDEC. In the upper cell arrays UCLA-LU and UCLA-RU in the memory unit UMEU, accordingly, word lines WL0–WL255 are numbered in sequence from bottom to top; in the lower cell arrays UCLA-LD and UCLA-RD in the memory unit UMEU, word lines WL0–WL255 are numbered in sequence from top to bottom.

Procedures for Writing, Reading, and Erasing Data in a Memory Cell or Redundant Memory Cell First, with reference to memory cell A in FIG. 9, when data are written in a memory cell, the word line decoder WLDEC applies a write gate voltage VPP to the word line WL, thus to the gate of the memory transistor MTr, and the bit line decoder BLDEC applies a memory cell write voltage VW to the bit line BL, thus to the drain electrode of the memory transistor memory transistor MTr. The NMOS transistor NTr is switched on, grounding the source electrode of the memory transistor MTr. This operation injects an amount of charge responsive to the write gate voltage VPP into the floating gate of the memory transistor memory transistor MTr, the threshold voltage of which assumes a value responsive to the write gate voltage VPP.

With reference to memory cell B in FIG. 9, when data are read from a memory cell, the word line decoder WLDEC applies a read gate voltage VVFY to the word line WL. The NMOS transistor NTr is switched on, grounding the source electrode of the memory transistor MTr. The bit line decoder BLDEC and predecoder PDEC couple the bit line BL to the sense amplifier circuit 8. The VVFY circuit 9 monitors the voltage SAOUT output by the sense amplifier circuit 8, and adjusts the read gate voltage VVFY until it is substantially equal to the threshold voltage of the memory transistor MTr.

With reference to memory cell C in FIG. 9, when the data in memory cell MCL are erased, the word line decoder WLDEC grounds the word line WL, the bit line decoder BLDEC opens (disconnects) the bit line BL, and the NMOS transistor NTr is switched off. The source line decoder SLDEC applies a memory cell erase voltage VERASE to the source line SL, thus to the source electrode of the memory transistor MTr. This operation draws charge out of the floating gate of the memory transistor MTr, returning its threshold voltage to substantially the initial value prior to writing.

The procedures for writing, reading, and erasing a redundant memory cell RMCL are the same as the above.

Operation of the Conventional Redundant Memory Circuit

In continuous recording, for example, an audio signal may be recorded in all four memory units, which are accessed in the sequence UMEU0, UMEU1, UMEU2, UMEU3. The signal is then reproduced by accessing the memory units in the same sequence UMEU0, UMEU1, UMEU2, UMEU3. The arrows and circled numbers in FIG. 51 indicate the order in which the memory cells in each memory unit UMEU are accessed during continuous recording and reproduction. First the upper cell arrays UCLA-LU and UCLA-RU are accessed; then the lower cell arrays UCLA-LD and UCLA-RD are accessed.

To record an audio signal, first sector SC0 in the upper left cell array UCLA-LU is erased. Next, the audio signal is written into sector SC0 in this cell array UCLA-LU while the first sector SC0 in the upper right cell array UCLA-RU is being erased. The audio signal is then written into sector SC0 in the upper right cell array UCLA-RU while sector SC1 in the upper left cell array UCLA-LU is being erased. Next, the audio signal is written into sector SC1 in the upper left cell array UCLA-LU while sector SC1 in the upper right cell array UCLA-RU is being erased.

When the signal is reproduced, it is read first from sector SC0 in the upper left cell array UCLA-LU, then from sector SC0 in the upper right cell array UCLA-RU, then from sector SC1 in the upper left cell array UCLA-LU.

Accordingly, the order of sector access in the upper cell arrays is first SC0 in UCLA-LU, then SC0 in UCLA-RU, SC1 in UCLA-LU, SC1 in UCLA-RU, SC2 in UCLA-LU, and so on, concluding with SC63 in UCLA-LU, then SC63 in UCLA-RU. Following access to sector SC63 in UCLA-RU, access shifts to the lower cell arrays, which are accessed in a similar sequence: SC0 in UCLA-LD, SC0 in UCLA-RD, SC1 in UCLA-LD, SC1 in UCLA-RD, SC2 in UCLA-LD, . . . , SC63 in UCLA-LD, SC63 in UCLA-RD. Following access to sector SC63 in UCLA-RD, access shifts to the next memory unit (UMEU), which is accessed in the same sequence as above.

When sector SC0 in cell array UCLA-LU is erased, all of the word lines WL0–WL255 are grounded by turning on transistors NMD0–NMD31 (all at once) and switches SW0–SW255 (all at once or sequentially) in word line decoder WLDEC-LU (see FIG. 5). The bit lines BL0–BL7 in sector SC0 are all disconnected by turning off transistors NYB0–NYB7 in bit line decoder UBLDEC-LU (UBLDEC) in FIG. 49. The memory cell erase voltage VERASE is supplied to the source line SL0 of sector SC0 by turning on transistors NYAB0 and NYCB0 in the source line decoder USLDEC-LU (USLDEC) in FIG. 50. All of the memory cells (e.g., MOL in FIG. 4) in sector SC0 in cell array UCLA-LU are thereby erased.

When the audio signal is written in sector SC0 of cell array UCLA-LU, in word line decoder WLDEC-LU (FIG. 5), transistors PMB0–PMB31 are all turned on at once, If transistors PMA0–PMA31 are turned on sequentially, and switches SW0–SW255 are turned on sequentially. The word lines WL0–WL255 are thereby selected sequentially, one at a time, and the write gate voltage VPP is supplied to the selected word line. In bit line decoder UBLDEC-LU (UBLDEC) (FIG. 49), transistors NYA0 and NYC0 are both turned on and transistors NYB0–NYB7 are turned on sequentially. Bit lines BL0–BL7 are thereby selected sequentially, one at a time, and the memory cell write voltage VW is supplied to the selected bit line. The operation of selecting bit lines BL0–BL7 sequentially is repeated each time a new word line is selected. In each memory cell MCL (FIG. 48) in sector SC0, transistor NTr is turned on, grounding the source electrode of the memory transistor MTr. The memory cells in sector SC0 are thereby selected sequentially, one by one, and the memory transistor MTr in the selected memory cell is programmed by the voltage VPP applied to its gate electrode and the voltage VW applied to its drain electrode, which alter the threshold voltage of the transistor to a value responsive to VPP, thus to the audio signal voltage.

When the recorded audio signal is read from sector SC0 in cell array UCLA-LU, in word line decoder WLDEC-L (FIG. 5), transistors NMB0–NMB31 are all turned on at once, transistors NMA0–NMA31 are turned on sequentially, and switches SW0–SW255 are turned on sequentially. The word lines WL0–WL255 are thereby selected sequentially, one at a time, and the read gate voltage VVFY is supplied to the selected word line. In bit line decoder UBLDEC-LU (UBLDEC) (FIG. 49), transistors NYA0 and NYC0 are both turned on and transistors NYB0–NYB7 are turned on sequentially. Bit lines BL0–BL7 are thereby selected sequentially, one at a time, and the memory cell read signal ICELL is output onto the selected bit line (see BL(ICELL) in FIG. 9). The operation of selecting bit lines BL0–BL7 sequentially is repeated each time a new word line is selected. In each memory cell MCL (FIG. 48) in sector SC0, transistor NTr is turned on, grounding the source electrode of the memory transistor MTr. The memory cells in sector SC0 are thereby selected sequentially, one by one, and the memory cell signal ICELL of the selected memory cell is supplied to the sense amplifier circuit 8. The VVFY circuit 9 generates a read gate voltage VVFY that is brought to a value substantially equal to the threshold voltage of the memory transistor MTr in the selected memory cell (thus a value responsive to the audio signal voltage written into the selected memory cell) as described above.

When sector SC0 in the upper right cell array UCLA-RU is erased, written, or read, word line decoder WLDEC-RU, bit line decoder UBLDEC-RU, and source line decoder USLDEC-RU control word lines WL0–WL255, bit lines BL0–BL7, and source line SL0 in the same way as during the erasing, writing, and reading of sector SC0 in the upper left cell array UCLA-LU.

When sector SC1 in cell array UCLA-LU is erased, written, or read, word line decoder WLDEC-LU, bit line decoder UBLDEC-LU, and source line decoder USLDEC-LU control word lines WL0–WL255, bit lines BL8–BL15, and source line SL1 in the same way as during the erasing, writing, and reading of sector SC0 in cell array UCLA-LU.

Conventional Redundancy Replacement

FIG. 52 illustrates the sector access sequence when a bad sector BSC (sector SC<k>) in cell array UCLA-LU is replaced by the redundant sector RSC. The address of the bad sector is programmed into a non-volatile memory provided in the address decoder 5. During initialization operations, which will not be described so as to avoid obscuring the invention with unnecessary detail, the address of the bad sector BSC is read into the predecoder PDEC, bit line decoder UBLDEC, and source line decoder USLDEC. Subsequent accesses to the bad sector BSC are then redirected to the redundant sector RSC in the same cell array UCLA, so that in effect the bad sector BSC is replaced by the redundant sector RSC in the same cell array UCLA.

In the left cell array UCLA-LU shown in FIG. 52, sectors SC0 to SC<k-1> are accessed sequentially; then, at the timing at which the bad sector BSC would be accessed, the redundant sector RSC is accessed instead, followed sequentially by sectors SK<k+1> to SC63. As explained above, however, the upper left and upper right cell arrays UCLA-LU and UCLA-RU are accessed alternately, so sector SC<k-1> in cell array UCLA-RU is accessed between sector SC<k-1> and the redundant sector RSC in cell array UCLA-LU, and sector SC<k> in cell array UCLA-RU is accessed between the redundant sector RSC and sector SC<k+1> in cell array UCLA-LU.

In the bit line decoder UBLDEC in FIG. 49, at the timing at which transistors NYA<k> and NYC<k> would be turned on to select the bad sector BSC, transistor RNYA is turned on instead, selecting the redundant sector RSC. In the source line decoder USLDEC in FIG. 50, at the timing at which transistors NYAB<k> and NYCB<k> would be turned on to select the bad sector BSC, transistor RNYAB is turned on instead, selecting the redundant sector RSC.

As explained above, when an audio signal is recorded in an analog (multi-level) audio flash memory, the audio signal is sampled at predetermined intervals to obtain analog voltage values, which are programmed into successive memory cells by altering the threshold voltage of the memory transistor in each memory cell. When the audio signal is reproduced from the memory, analog voltage levels obtained from the memory cells are amplified and output directly (after a level shift). The recording and reproducing processes have a voltage resolution of, for example, twenty millivolts (20 mV). An analog audio flash memory, accordingly, does not require an analog-to-digital converter or a digital-to-analog converter, both of which would be necessary if the audio signal were stored in a digital (bi-level) audio flash memory.

As explained above, when an audio signal is recorded in the analog audio flash memory, a write gate voltage VPP responsive to the analog voltage level of the audio signal is supplied to the memory cells through the word lines WL and applied to the gates of memory transistors, the threshold voltages of which are thereby programmed to levels responsive to the analog value of the audio signal. When the audio signal is reproduced, a read gate voltage VVFY is supplied to the memory cells through the word lines WL and applied to the gates of the memory transistors to read the programmed threshold voltage. The quality of the reproduced audio signal is therefore affected by the parasitic capacitance and parasitic resistance of the word lines between the word line decoder WLDEC and the memory cells MCL.

The parasitic capacitance and parasitic resistance are illustrated in FIG. 53, which shows the memory cells MCL0, MCL1, . . . , MCL511 and redundant memory cells RMCL0, RMCL6, RMCL7 connected to a word line WL. The letter 'c' denotes the parasitic capacitance of the word line between each mutually adjacent pair of memory cells (including the redundant memory cells); the letter 'r' denotes the parasitic resistance of the word line between each such pair of memory cells (including the redundant memory cells). The memory cells and redundant memory cells are assumed to be equally spaced along the word line WL.

The parasitic capacitance and parasitic resistance of the word line between the word line decoder WLDEC and a memory cell MCL increase in proportion to the length of the word line between the word line decoder WLDEC and that memory cell MCL. The total parasitic capacitance and parasitic resistance of the word line are greatest for memory cell MCL0, which is farthest from the word line decoder WLDEC; the parasitic capacitance and parasitic resistance of the word line decrease in sequence from memory cell MCL1 to memory cell MCL511.

As a result of the parasitic capacitance and parasitic resistance, when a word line is selected, the gate voltage of the memory transistors in different memory cells rises (to the write gate voltage VPP or read gate voltage VVFY) at different rates, depending on the location of the memory cells, as shown in FIG. 54. VG1 is the gate voltage of the memory transistor in, for example, memory cell MCL511, which is closest to the word line decoder WLDEC; VG2 is the gate voltage of the memory transistor in, for example, memory cell MCL0, which is farthest from the word line decoder WLDEC. The length of time for which the appropriate voltage (VPP or VVFY) is to be applied to the gate of the memory transistor is denoted T, while TD denotes the delay from the rise of VG1 to the rise of VG2.

The reason for the delay TD is that the parasitic capacitance of the word line WL from the word line decoder WLDEC out to a relatively distant memory cell such as MCL0 is greater than the parasitic capacitance of the word line WL from the word line decoder WLDEC out to a closer memory cell such as MCL511.

FIGS. 55A and 55B show the results of experiments in which memory cells were programmed to a nominal threshold voltage of 6.12 V. FIG. 55A is a histogram of threshold voltages Vt obtained in memory cells close to the word line decoder WLDEC (for example, memory cell MCL511); all of the threshold voltages are within twenty millivolts (±20 mV) of the nominal value. The threshold voltage is indicated in volts on the horizontal axis, and the number of memory cells 0–1400 in which the voltage was obtained is indicated on the vertical axis. FIG. 55B is a histogram of threshold voltages Vt obtained in memory cells far from the word line decoder WLDEC (for example, memory cell MOL0); some of the threshold voltages differ from the nominal value by as much as eighty millivolts (6.12−6.04=0.08 V=80 mV).

Differences in the programmed threshold voltage such as the differences between FIG. 55A and FIG. 55B tend in particular to occur when the programming time is shortened in order to increase the operating speed of the memory. Such differences can also occur if fabrication process variations increase the parasitic capacitance and resistance of the word lines. These differences lead to differences in the values read from the memory cells (the read gate voltage VVFY).

A further cause of differences in the programmed threshold voltage is the gate disturb effect, in which the reading or writing of a memory cell disturbs the threshold voltages programmed into other memory cells on the same word line. For example, if data are first written into the memory cells MCL at the end of the word line near the word line decoder WLDEC, the threshold voltages of these memory cells may further increase, altering the stored analog data values, when data are written into the memory cells at the end of the word line distant from the word line decoder WLDEC.

Thus the parasitic capacitance and parasitic resistance of the word lines tends to reduce the programmed threshold voltages of memory cells at the far end of the word line, while the gate disturb effect can raise the programmed threshold voltages of memory cells at the near end of the word line, as seen from the word line decoder WLDEC.

If the programmed voltage of a single memory cell MCL differs by more than twenty millivolts from the intended value, or if the programmed threshold voltages of two memory cells in two different sectors that are accessed consecutively deviate in opposite directions from the intended values and the sum of the absolute values of the deviations exceeds twenty millivolts, a listener may notice a defect in the reproduced audio signal. It is to prevent such audible defects that the memory cells are accessed in the sequence indicated in FIG. 51. Although the programmed threshold voltages differ depending on the distance of the memory cell MCL from the word line decoder WLDEC, if the cells are accessed in the sequence in FIG. 51, the profile of deviations in the programmed threshold voltage will be free of sharp discontinuities, and the audio signal reproduced from the analog audio flash memory will not be noticeably degraded.

In the conventional analog audio flash memory described above, however, the smoothness of the voltage deviation profile is broken if a bad sector BSC distant from the word line decoder WLDEC is replaced with the redundant sector RSC disposed adjacent the word line decoder WLDEC. If the bad sector BSC is sector SC<k>, access jumps from sector SC<k−1> to the redundant sector RSC, then back to sector SC<k+1>. This can cause a major discontinuity in the threshold voltage deviation profile, and can degrade the quality of the reproduced audio signal (the reproduced analog signal).

A further problem is that redundancy replacement is limited to one sector per cell array, so if there are two bad sectors in a cell array, they cannot both be replaced with redundant sectors. This problem becomes increasingly severe as the size of the cell arrays is increased, adversely affecting production yields of high-capacity analog audio flash memories.

SUMMARY OF THE INVENTION

An object of the present invention is to reduce the adverse effect of redundancy replacement on the quality of the signal reproduced from an analog semiconductor memory.

Another object of the invention is to improve the fidelity of the reproduced signal.

Yet another object is to increase the capability of an analog semiconductor memory for redundancy replacement.

The invention provides a redundant memory circuit for use in an analog semiconductor memory. The redundant memory circuit includes a cell array having a first end and a second end, with a plurality of word lines extending from the first end to the second end and a plurality of memory cells connected to the word lines. Each memory cell stores an analog value. The cell array is divided into a plurality of sectors and includes at least one redundant sector that can be used to replace a bad sector. The redundant memory circuit also includes a word line selector for selecting the word lines.

According to a first aspect of the invention, the cell array includes a pair of redundant sectors, one disposed at the first end and the other disposed at the second end of the cell array. Aside from the redundant sectors, the sectors in the cell array are accessed in sequence from the first end to the second end, or from the second end to the first end. When there is a single bad sector in the cell array, it is replaced by the closer one of the two redundant sectors, and this redundant sector takes the place of the bad sector in the access sequence.

The first aspect of the invention improves the capability for redundancy replacement by providing two redundant sectors per cell array, so that two bad sectors can be replaced. In addition, redundancy replacement of a single bad sector changes the distance to the word line selector by at most half the length of the array, thus reducing the maximum size of any resulting discontinuity in the threshold voltage deviation profile. The adverse effect of the replacement on the quality of the reproduced audio signal is accordingly reduced.

According to a second aspect of the invention, the redundant sector in a cell array is located centrally in the array. This arrangement similarly reduces the adverse effect of redundancy replacement on the quality of the reproduced audio signal, by limiting the change in distance to the word line selector occasioned by the replacement to at most half the length of the array, thus limiting the size of any resulting discontinuity in the threshold voltage deviation profile.

According to a third aspect of the invention, the redundant memory circuit includes a sector selection circuit that selects the sectors and redundant sector in sequence from one end of the cell array to the other, skipping a bad sector if one is present. This arrangement virtually eliminates the discontinuity in the threshold voltage deviation profile caused by redundancy replacement, so the quality of the reproduced audio signal is scarcely affected by the redundancy replacement.

According to a fourth aspect of the invention, the word line selector is located in the center of the cell array. This arrangement not only reduces the adverse effect of redundancy replacement on the reproduced audio signal quality, by limiting the change in distance to the word line selector occasioned by replacement to at most half the length of the array, but also improves the fidelity of the reproduced audio signal, regardless of whether redundancy replacement is carried out or not, by reducing the maximum size of the threshold voltage deviations in the threshold voltage deviation profile.

According to a fifth aspect of the invention, the redundant memory circuit has two cell arrays with respective sectors, redundant sectors, and word line selectors. The redundant memory circuit also includes a redundant sector selection circuit that selects the redundant sectors in both cell arrays, so that a bad sector in one cell array can be replaced by a redundant sector in either of the two cell arrays. The capability for redundancy replacement is thereby improved, because any two bad sectors in the two cell arrays can be replaced, even if the two bad sectors are both situated in the same cell array.

DETAILED DESCRIPTION OF THE INVENTION

Figure 1A:
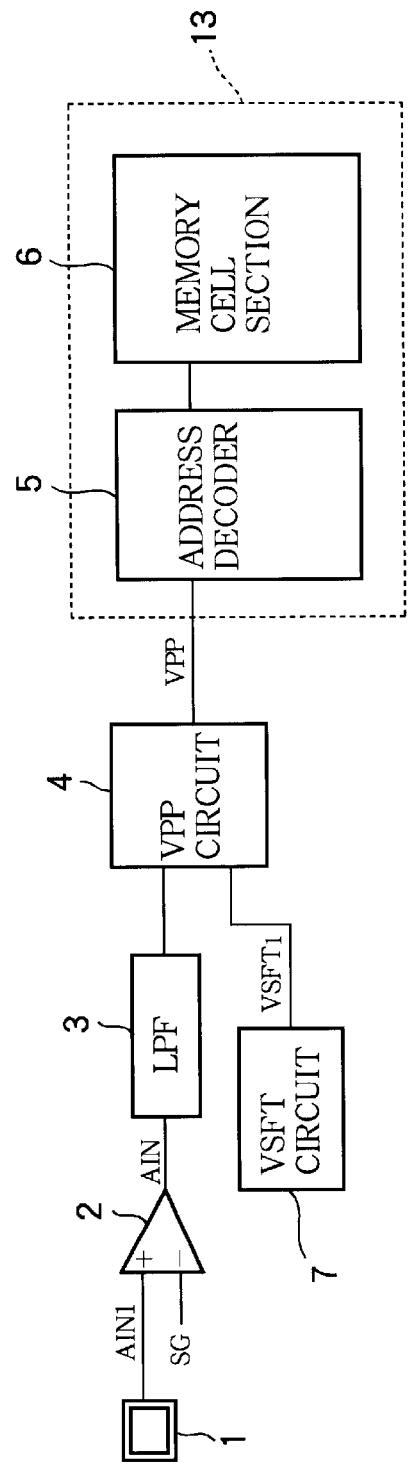
FIG. 1A is a block diagram of an analog audio flash memory, showing the circuits involved in writing data.

Embodiments of the invention will be described with reference to the attached drawings, in which like parts are indicated by like reference characters.

Figure 1B:
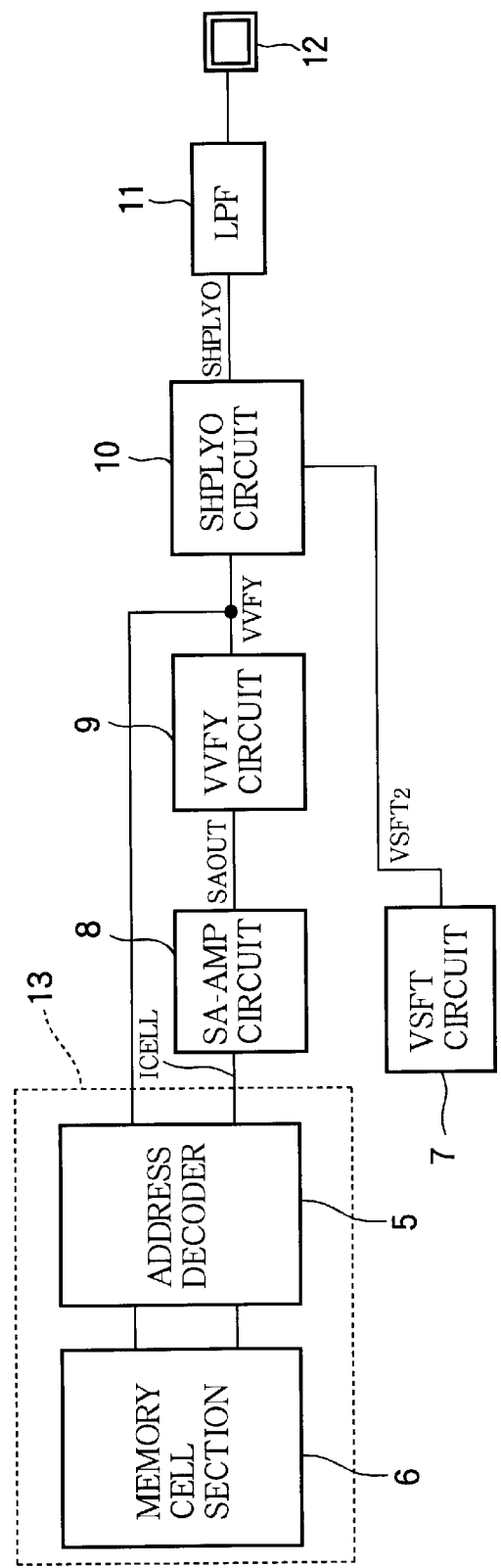
FIG. 1B is a block diagram of the same analog audio flash memory, showing the circuits involved in reading data.

An analog audio flash memory embodying the invented memory circuit has the block structure shown in FIGS. 1A and 1B, comprising an input pad 1, an input amplifier 2, an input low-pass filter (LPF) 3, a programming gate voltage generating circuit (VPP circuit) 4, an address decoder 5, a memory cell section 6, a shift voltage generating circuit (VSFT circuit) 7, a sense amplifier circuit (SA-AMP circuit) 8, a read gate voltage generating circuit (VVFY circuit) 9, an analog output circuit (SHPLYO circuit) 10, an output low-pass filter (LPF) 11, and an output pad 12. The address decoder 5 and memory cell section 6 constitute a memory circuit 13. The elements in FIG. 1A pertain to the recording process; the elements in FIG. 1B pertain to the reproduction process.

In recording, as explained above, an analog audio signal voltage AINN received at the input pad 1 is supplied to the non-inverting input terminal of the input amplifier 2, and an internally generated analog signal reference potential SG is supplied to the inverting input terminal of the input amplifier 2. The analog signal reference potential SG is equal to, for example, 1.35 V, and can be adjusted by trimming. The analog signal reference potential SG is also supplied to the VPP circuit 4, VSFT circuit 7, VVFY circuit 9, and SHPLYO circuit 10, through signal lines not explicitly shown in the drawings.

The input amplifier 2 subtracts the analog signal reference potential SG from the input audio signal voltage AIN1 to generate an input audio signal voltage AIN, which is supplied to the input low-pass filter 3. The input low-pass filter 3 rejects noise components and harmonics included in the input audio signal voltage AIN, and supplies the resulting filtered signal to the VPP circuit 4.

The VSFT circuit 7 generates an analog input shift voltage VSFT1, which is also supplied to the VPP circuit 4. As in the conventional analog audio flash memory, the purpose of the analog input shift voltage VSFT1 is to shift the input audio signal voltage AIN to a voltage suitable to be applied to the gates of memory transistors. The value of VSFT1 is, for example, from 9.15 V to 9.35 V; this value can also be adjusted by trimming, as will be described later.

The VPP circuit 4 shifts the input audio signal voltage AIN upward by the analog input shift voltage VSFT1 to generate a write gate voltage VPP responsive to the input audio signal voltage AIN, and supplies the write gate voltage VPP to the address decoder 5, to be applied to the gates of transistors in memory cells. The value of the write gate voltage VPP varies in the range from, for example, 8.5 V to 10.5 V, this range being adjustable by trimming.

The address decoder 5 writes the analog value of the audio signal in the memory cell section 6 by sequentially selecting the memory cells in the memory cell section 6 and applying the write gate voltage VPP to the gate of a transistor in the selected memory cell. When power is switched on, the address decoder 5 begins recording from the first address in the memory cell section 6, unless particularly directed to do otherwise.

Referring to FIG. 1B, when the signal is reproduced, the address decoder 5 sequentially selects the memory cells in the memory cell section 6, applies a read gate voltage VVFY received from the VVFY circuit 9 to a control gate of a memory transistor in the selected memory cell, and outputs the signal ICELL read from this memory cell (the memory cell signal) to the sense amplifier circuit 8. The sense amplifier circuit 8 converts the memory cell signal ICELL to a bi-level (high or low) sense amplifier output signal SAOUT, which is supplied to the VVFY circuit 9.

The VVFY circuit 9 varies the read gate voltage VVFY while monitoring the value of the sense amplifier output signal SAOUT. The VVFY circuit 9 is adapted to make the read gate voltage VVFY converge toward the point at which the output signal SAOUT changes from low to high (or from high to low). When the read gate voltage VVFY has settled at this point, it is sampled and supplied to the SHPLYO circuit 10.

The VSFT circuit 7 generates an analog output shift voltage VSFT2, as well as the analog input shift voltage VSFT1 mentioned above, and supplies the analog output shift voltage VSFT2 to the SHPLYO circuit 10. The purpose of the analog output shift voltage VSFT2 is to shift the read gate voltage VVFY down to a value equivalent to the original input audio signal voltage AIN. The value of VSFT2 is in the range from, for example, 4.05 V to 4.35 V, this range being adjustable by trimming.

The SHPLYO circuit 10 shifts the read gate voltage VVFY down according to the analog output shift voltage VSFT2, thereby generating an output analog signal SHPLYO nominally equal to the original input audio signal voltage AIN, and outputs SHPLYO to the output low-pass filter 11. The output low-pass filter 11 rejects noise components and harmonics included in the output analog signal SHPLYO, and outputs the filtered signal to the output pad 12.

Figure 2:
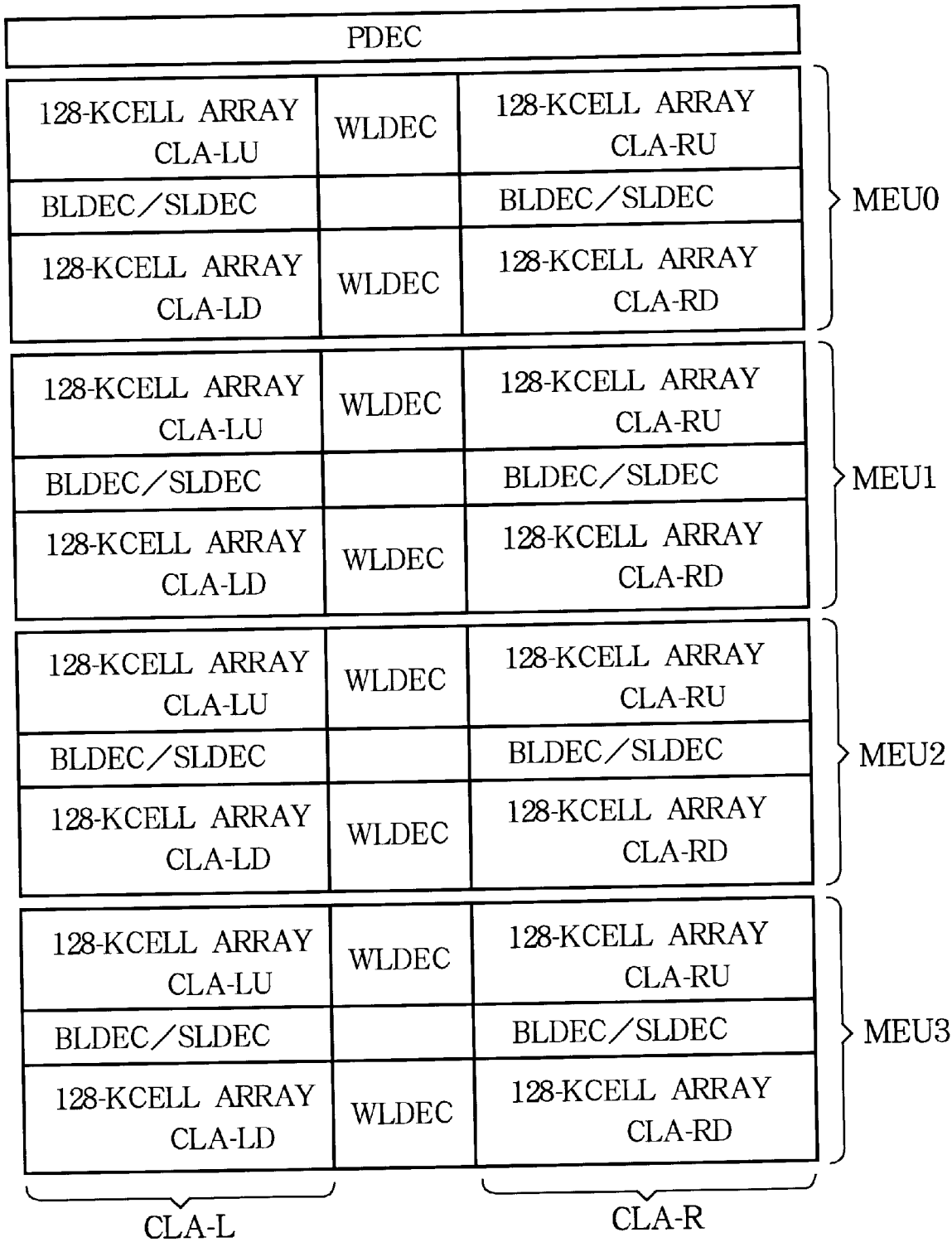
FIG. 2 illustrates the structure of a non-redundant memory circuit in an analog audio flash memory.

FIG. 2 shows the layout of a memory circuit 13 with a non-redundant configuration, on which the embodiments to be described below are based. The memory circuit 13 in FIG. 2 comprises a predecoder PDEC and four memory cell units MEU0, MEU1, MEU2, MEU3, an arbitrary one of which will be denoted MEU below.

Each memory unit MEU comprises four cell arrays CLA-LU, CLA-RU, CLA-LD, CLA-RD, an arbitrary one of which will be denoted CLA below. Each cell array CLA comprises one hundred twenty-eight kilocells (kcells). Each memory unit MEU thus comprises five hundred twelve kilocells. The sixteen cell arrays in FIG. 2 constitute the memory cell section 6 in FIGS. 1A and 1B.

Figure 3:
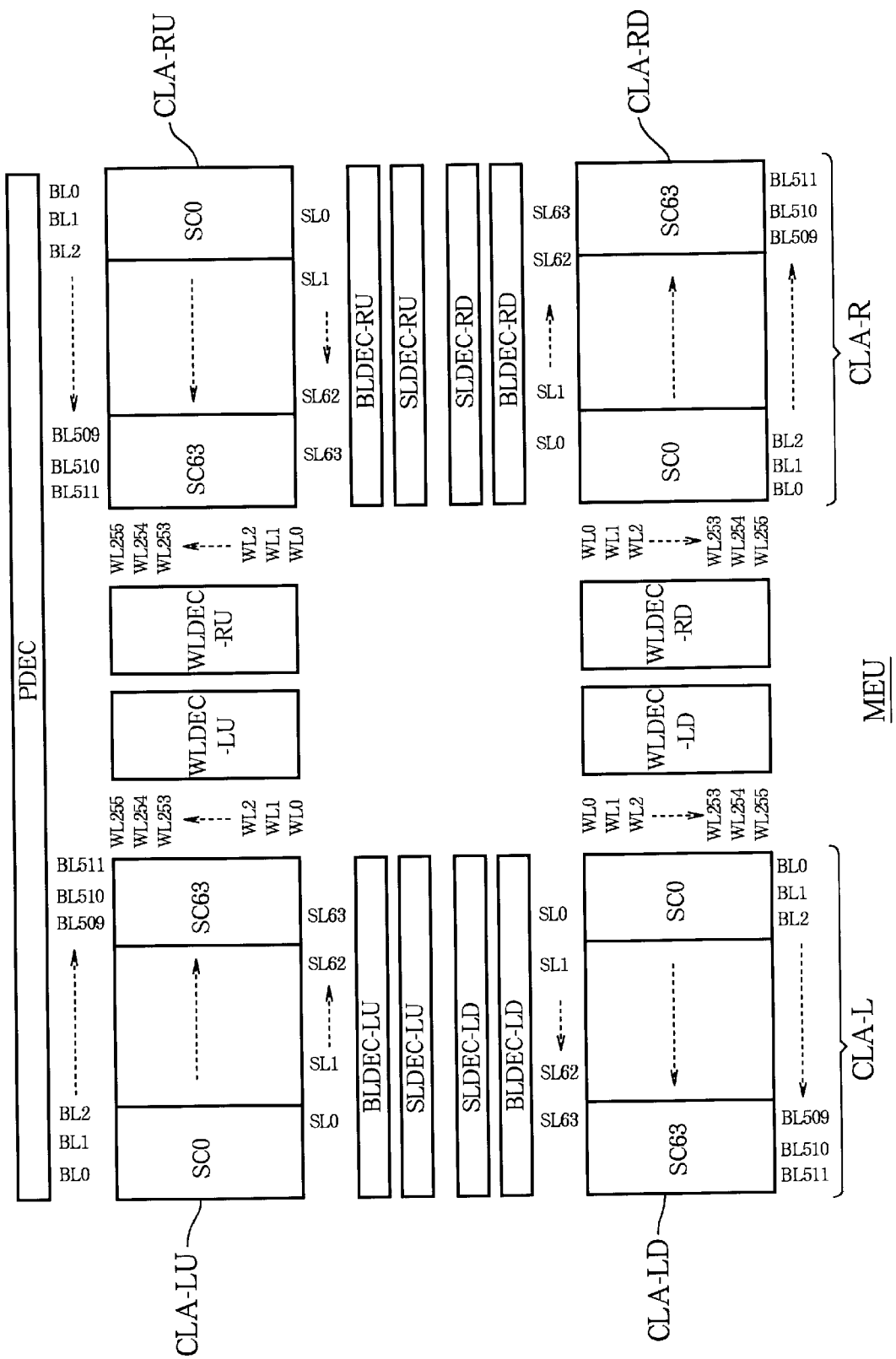
FIG. 3 illustrates the structure of a memory unit in the non-redundant memory circuit in FIG. 2 in more detail.

FIG. 3 shows the layout of a memory unit MEU in FIG. 2. The memory unit MEU includes four cell arrays CLA (CLA-LU, CLA-RU, CLA-LD, CLA-RD), four word line decoders WLDEC (WLDEC-LU, WLDEC-RU, WLDEC-LD, WLDEC-RD), four bit-line decoders BLDEC (BLDEC-LU, BLDEC-RU, BLDEC-LD, BLDEC-RD), and four source line decoders SLDEC (SLDEC-LU, SLDEC-RU, SLDEC-LD, SLDEC-RD).

Each cell array CLA has its own word line decoder WLDEC, bit line decoder BLDEC, and source line decoder SLDEC. In the non-redundant memory circuit illustrated in FIGS. 2 and 3, the predecoder PDEC, sixteen word line decoders WLDEC, sixteen bit line decoders BLDEC, and sixteen source line decoders SLDEC constitute the address decoder 5 in FIGS. 1A and 1B.

In the following description, the cell arrays CLA-LU and CLA-LD disposed on the left side in FIG. 2 will be denoted CLA-L, and the cell arrays CLA-RU and CLA-RD disposed on the right side in FIG. 2 will be denoted CLA-R. Similarly, the word line decoders WLDEC-LU and WLDEC-LD, bit lines decoders BLDEC-LU and BLDEC-LD, and source line decoders SLDEC-LU and SLDEC-LD that control the word lines WL, bit lines BL, and source lines SL in the left cell arrays CLA-L will be denoted WLDEC-L, BLDEC-L, and SLDEC-L, respectively, and the word line decoders WLDEC-RU and WLDEC-RD, bit lines decoders BLDEC-RU and BLDEC-RD, and source line decoders SLDEC-RU and SLDEC-RD that control the word lines WL, bit lines BL, and source lines SL in the right cell arrays CLA-R will be denoted WLDEC-R, BLDEC-R, and SLDEC-R, respectively.

A cell array CLA comprises sixty-four sectors SC (SC0, SC1, ..., SC63). The cell array CLA has two hundred fifty-six word lines WL (WL0, WL1, ..., WL255), five hundred twelve bit lines BL (BL0, BL1, ..., BL511), and sixty-four source lines SL (SL0, SL1, ..., SL63). The word lines WL0–WL255 are controlled by the word line decoder WLDEC. The bit lines BL0–BL511 and RBL0–RBL7 are controlled by the bit line decoder BLDEC. The source lines SL0–SL63 and RSL are controlled by the source line decoder SLDEC.

Sectors and Memory Cells

Figure 4:
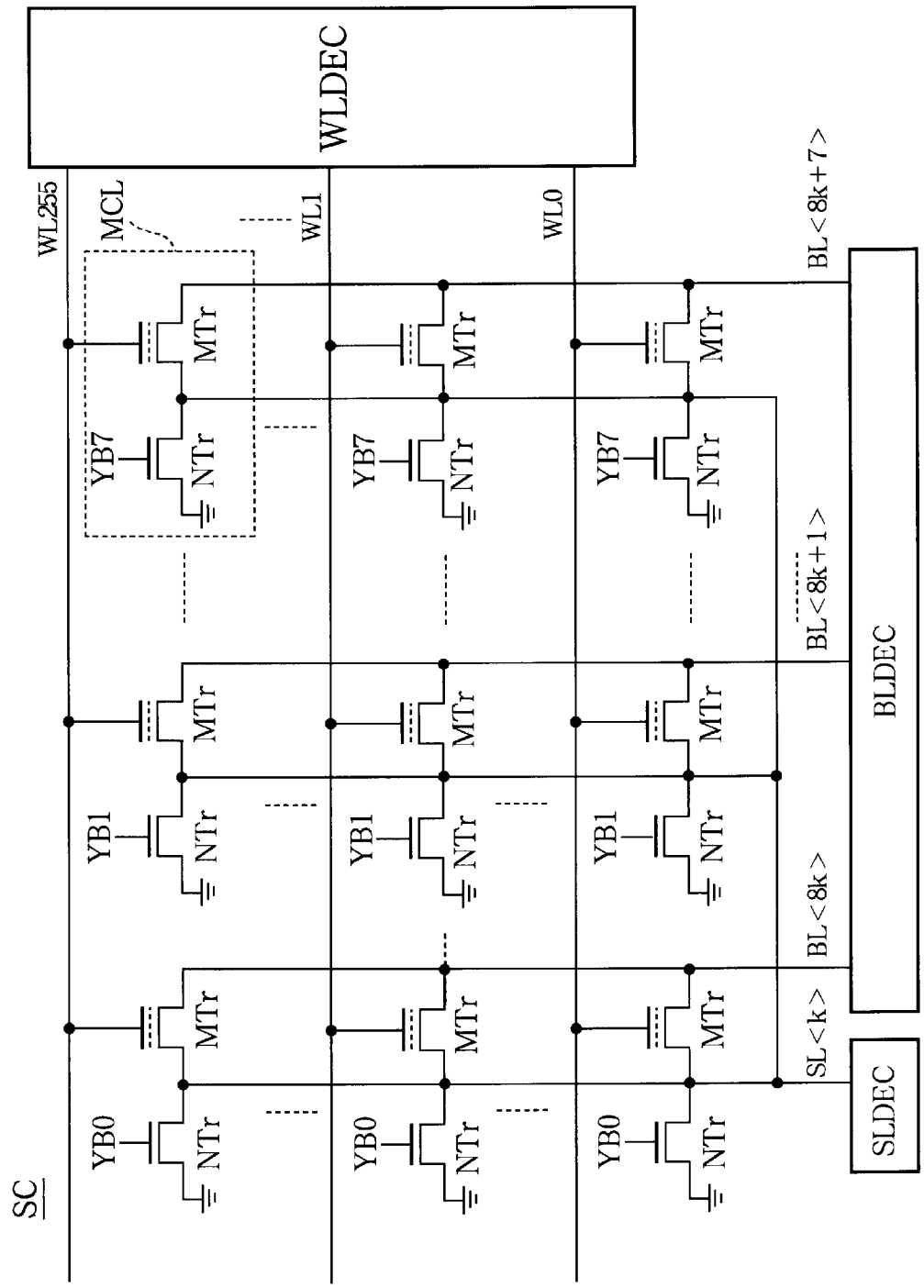
FIG. 4 illustrates the circuit structure of a sector in FIG. 3.

FIG. 4 illustrates the sector layout, showing the k-th sector SC<k> (where k is any integer from 0 to 63). The two thousand forty-eight memory cells (MCL) are located at the intersections of the two hundred fifty-six word lines WL0–WL255 and eight bit lines BL<8k> to BL<8k'7>, and all are connected to one source line SL<k>. A memory cell MCL comprises a non-volatile memory transistor MTr and an NMOS transistor NTr. The non-volatile transistor MTr is a metal-oxide-semiconductor (MOS) transistor with a double gate structure, including a control gate (referred to below simply as a gate) and a floating gate. The memory transistor MTr has its gate electrode connected to the corresponding word line WL, its drain electrode connected to the corresponding bit line BL, and its source electrode connected to the drain electrode of NMOS transistor NTr. The NMOS transistors NTr in the memory cells are coupled to bit lines BL<8k>, BL<8k+1>, ..., BL<8k+7> via memory transistors MTr, and NMOS transistors NTr receive respective bit selection signals YB0, YB1, ..., YB7. The source electrodes of these NMOS transistors NTr are grounded.

Predecoder

The predecoder PDEC controls the word line decoders WLDEC, the bit line decoders BLDEC, and the source line decoders SLDEC, and selects the cell arrays CLA sequentially when an audio signal is recorded (by erasing and writing data) or reproduced (by reading data).

Word Line Decoder

Figure 5:
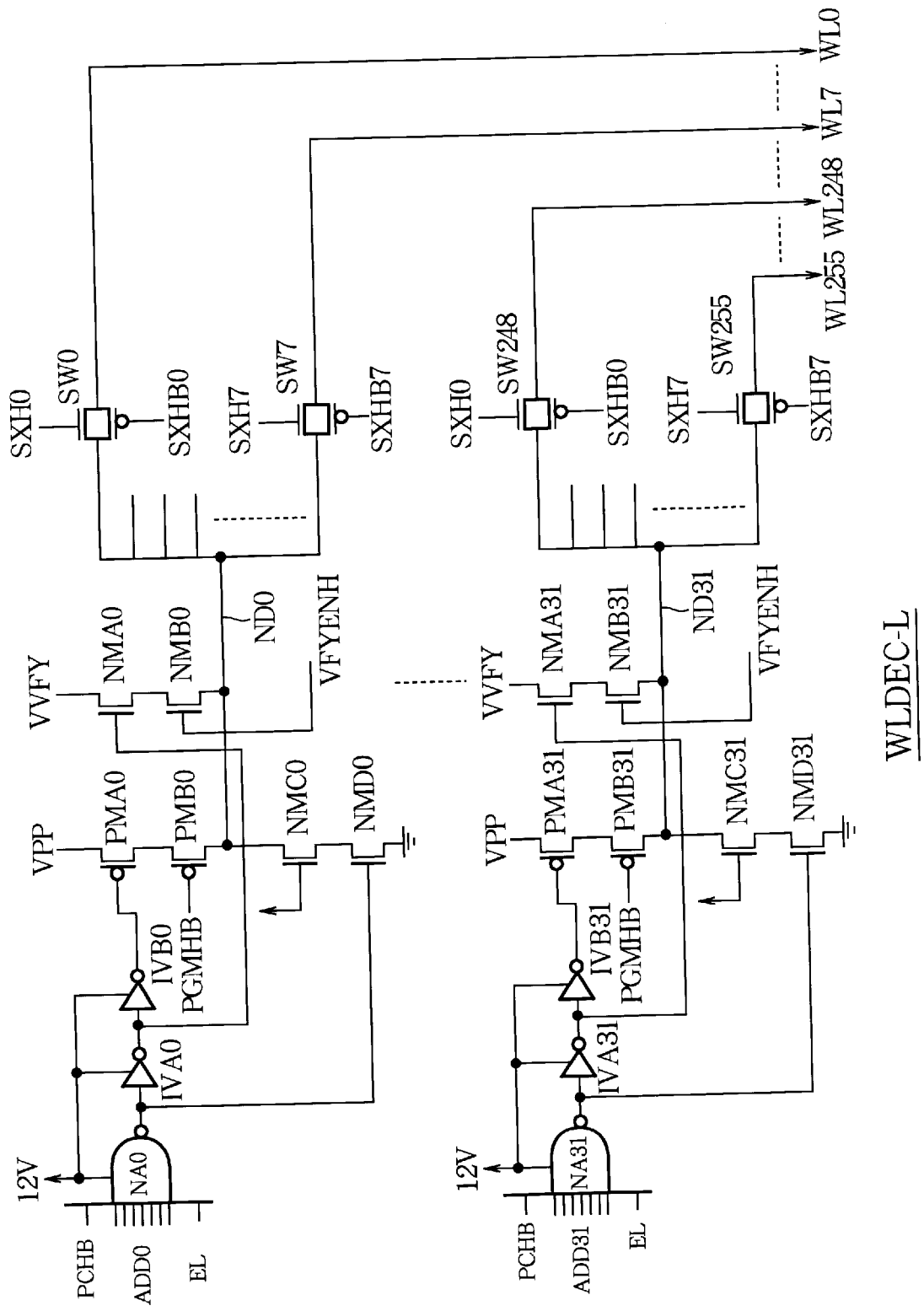
FIG. 5 shows an example of the circuit structure of the left word line decoders in FIG. 3.
Figure 6:
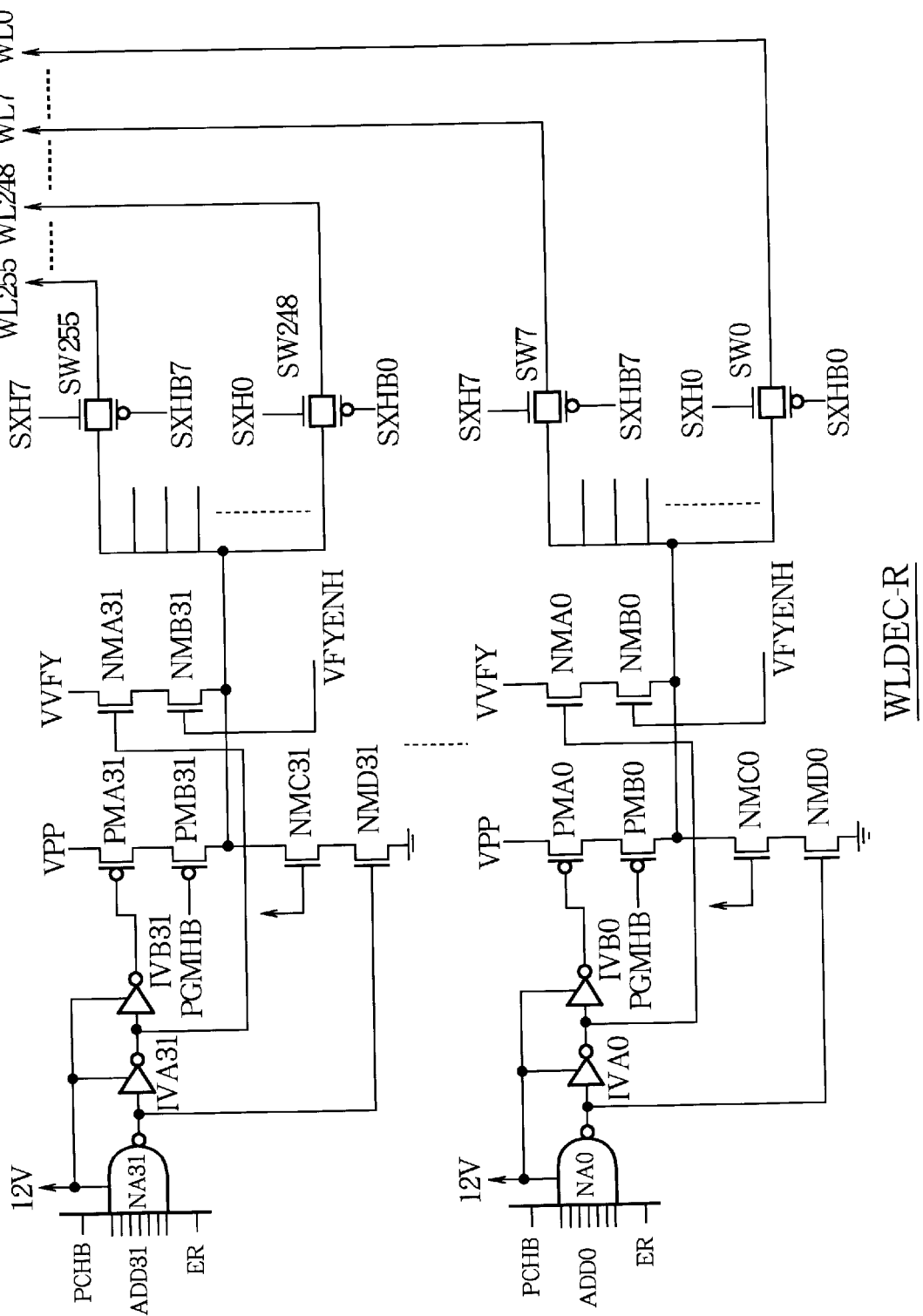
FIG. 6 shows an example of the circuit structure of the right word line decoders in FIG. 3.

FIG. 5 shows the circuit configuration of the left word line decoders WLDEC-L (WLDEC-LU and WLDEC-LD); FIG. 6 shows the circuit configuration of the right word line decoders WLDEC-R (WLDEC-RU and WLDEC-RD). Both word line decoders function as word line selectors. Each word line decoder comprises NAND gates NA0, NA1, . . . , NA31, inverters IVA0, IVA1, . . . , IVA31, IVB0, IVB1, . . . , IVB31, p-channel metal-oxide-semiconductor (PMOS) transistors PMA0, PMA1, PMA31, PMB0, PMB1, . . . , PMB31, NMOS transistors NMA0, NMA1, . . . , NMA31, NMB0, NMB1, . . . , NMB31, NMC0, NMC1, NMC31, NMD0, NMD1, . . . , NMD31, and MOS switches SW0, SW1, . . . , SW255. The MOS switches SW0, SW1, . . . , SW255 are connected to corresponding word lines WL0, WL1, . . . , WL255.

A left word line enable signal EL is input to the NAND gates NA0–NA31 in the left word line decoders WLDEC-LU, WLDEC-LD; a right word line enable signal ER is input to the NAND gates NA0–NA31 in the right word line decoders WLDEC-RU and WLDEC-RD. Each of the NAND gates NA0, NA1, . . . , NA31 also receives a reset signal (or precharge signal) PCHB and a seven-bit row address. The seven-bit row addresses are denoted Add0, ADD1, . . . , ADD31 in the drawings.

The output terminal of NAND gate NA<i> (where i is an arbitrary integer from 0 to 31) is connected to the input terminal of inverter IVA<i> and the gate of transistor NMD<i>. The output terminal of inverter IVA<i> is connected to the input terminal of inverter IVB<i> and the gate of transistor NMA<i>. The output terminal of inverter IVB<i> is connected to the gate of transistor PMA<i>. A boosted power supply potential (e.g., 12 V) is supplied to NAND gate NA<i> and inverters IVA<i> and IVB<i>.

A write enable signal PGMHB is supplied to the gate of transistor PMB<i>. The above-mentioned boosted power supply potential is supplied to the gate of transistor NMC<i>. A read enable signal VFYENH is supplied to the gate of transistor NMB<i>. The write gate voltage VPP generated by the VPP circuit 4 in FIGS. 1A and 1B is supplied to the source electrode of transistor PMA<i>. The drain electrode of transistor PMA<i> is connected to the source electrode of transistor PMB<i>. The drain electrode of transistor PMB<i> is connected to a node ND<i>.

The read gate voltage generated by the VVFY circuit 9 in FIGS. 1A and 1B is supplied to the drain electrode of transistor NMA<i>. The source electrode of transistor NMA<i> is connected to the drain electrode of transistor NMB<i>. The source electrode of transistor NMB<i> is connected to node ND<i>. The drain electrode of transistor NMC<i> is connected to node ND<i>. The source electrode of transistor NMC<i> is connected to the drain electrode of transistor NMD<i>. The source electrode of transistor NMD<i> is grounded.

Switches SW<8i>, SW<8i+1>, . . . , SW<8i+7> are disposed between word lines WL<8i>, WL<8i+1>, . . . , WL<8i+7> and node ND<i>. Word line selection signals SXH0, SXH1, . . . , SXH7 are supplied to the NMOS gate electrodes of switches SW<8i>, SW<8i+1>, . . . , SW<8i+7>. Word line selection signals SXHB0, SXHB1, . . . , SXHB7 are supplied to the PMOS gate electrodes of switches SW<8i>, SW<8i+1>, . . . , SW<8i+7>.

The output signal of NAND gate NA<i> is low if, and only if, the reset (precharge) signal PCHB, the left (or right) enable signal EL (or ER), and all bits of the corresponding row address signal ADD<i> are at the high logic level or '1' level.

The bit values of row address signal ADD<i> are all '1' only when word lines WL<8i>, WL<8i+1>, . . . , WL<8i+7> are selected. The reset (precharge) signal PCHB goes high when data are written or read, and goes low when data are erased. The write enable signal PGMHB goes low when data are written, and goes high when data are read or erased. The read enable signal VFYENH goes high when data are read, and goes low when data are written or erased. The left enable signal EL goes high when a left cell array is accessed, and goes low at other times. The right enable signal ER goes high when a right cell array block is accessed, and goes low at other times.

When the output signal of NAND gate NA<i> is high, transistor NMD<i> turns on. In addition, the output signal of inverter IVA<i> is low and the output signal of inverter IVB<i> is high, so transistors NMA<i> and PMA<i> are turned off. Node ND<i> is therefore grounded through transistors NMC<i> and NMD<i>. When the output signal of NAND gate NA<i> is low, transistor NMD<i> is turned off. In addition, the output signal of inverter IVA<i> is high and the output signal of inverter IVB<i> is low, so transistors NMA<i> and PMA<i> are turned on.

When data are written, the write enable signal PGMHB and the read enable signal VFYENH are both low, so transistor PMB<i> is turned on and transistor NMB<i> is turned off. When data are read, the write enable signal PGMHB and the read enable signal VFYENH are both high, so transistor PMB<i> is turned off and transistor NMB<i> is turned on. When data are erased, the write enable signal PGMHB is high and the read enable signal VFYENH is low, so transistors PMB<i> and NMB<i> are both turned off.

Thus when data are written, if the output signal of NAND gate NA<i> is low, the write gate voltage VPP is supplied through transistors PMA<i> and PMB<i> to node ND<i>. Switches SW<8i> to SW<8I+7> are turned on one by one in sequence by word line selection signals SXH0–SXH7 and SXHB0–SXHB7. If the write gate voltages VPP for successive samples of the analog signal voltage are denoted VPP<t>, VPP<t+1>, VPP<t+2>, . . . , then, for example, switch SW<8i> turns on when write gate voltage VPP<t> is generated, so that VPP<t> is applied to word line WL<8i>; switch SW<8i+1> turns on when write gate voltage VPP<t+1> is generated, so that VPP<t+1> is applied to word line WL<8i+1>; switch SW<8i+2> turns on when write gate voltage VPP<t+2> is generated, so that VPP<t+2> is applied to word line WL<8i+2>; and so on.

When data are read, if the output signal of NAND gate NA<i> is low, the read gate voltage VVFY is supplied through transistors NMA<i> and NMB<i> to node ND<i>. Switches SW<8i> to SW<8I+7> are turned on one by one in sequence by word line selection signals SXH0–SXH7 and SXHB0–SXHB7. If the read gate voltages VVFY for successive memory cell signals ICELL are denoted VVFY<t>, VVFY<t+1>, VVFY<t+2>, . . . , then, for example, switch SW<8i> turns on when read gate voltage VVFY<t> is generated, so that WVFY<t> is applied to word line WL<8i>; switch SW<8i+1> turns on when read gate voltage VVFY<t+1> is generated, so that VVFY<t+1> is applied to word line WL<8i+1>; switch SW<8i+2> turns on when read gate voltage VVFY<t+2> is generated, so that VVFY<t+2> is applied to word line WL<8i+2>; and so on.

When data are erased, the output signals of NAND gates NA0–NA31 all go high, so nodes ND0–ND31 are grounded through transistors NMC0–NMC31 and NMD0–NMD31. Switches SW<i> to SW<8i+7> are turned on one by one in sequence by word line selection signals SXH0–SXH7 and SXHB0–SXHB7, grounding word lines WL0–WL255.

The row address signals Add0–ADD31, reset (precharge) signal PCHB, write enable signal PGMHB, read enable signal VFYENH, left enable signal EL, right enable signal ER, and word line selection signals SXH0–SXH7 and SXHB0–SXHB7 are supplied from the predecoder PDEC, or are generated by the left word line decoders WLDEC-L and right word line decoders WLDEC-R according to control signals supplied from the predecoder PDEC.

Bit Line Decoder in Non-Redundant Memory Circuit

Figure 7:
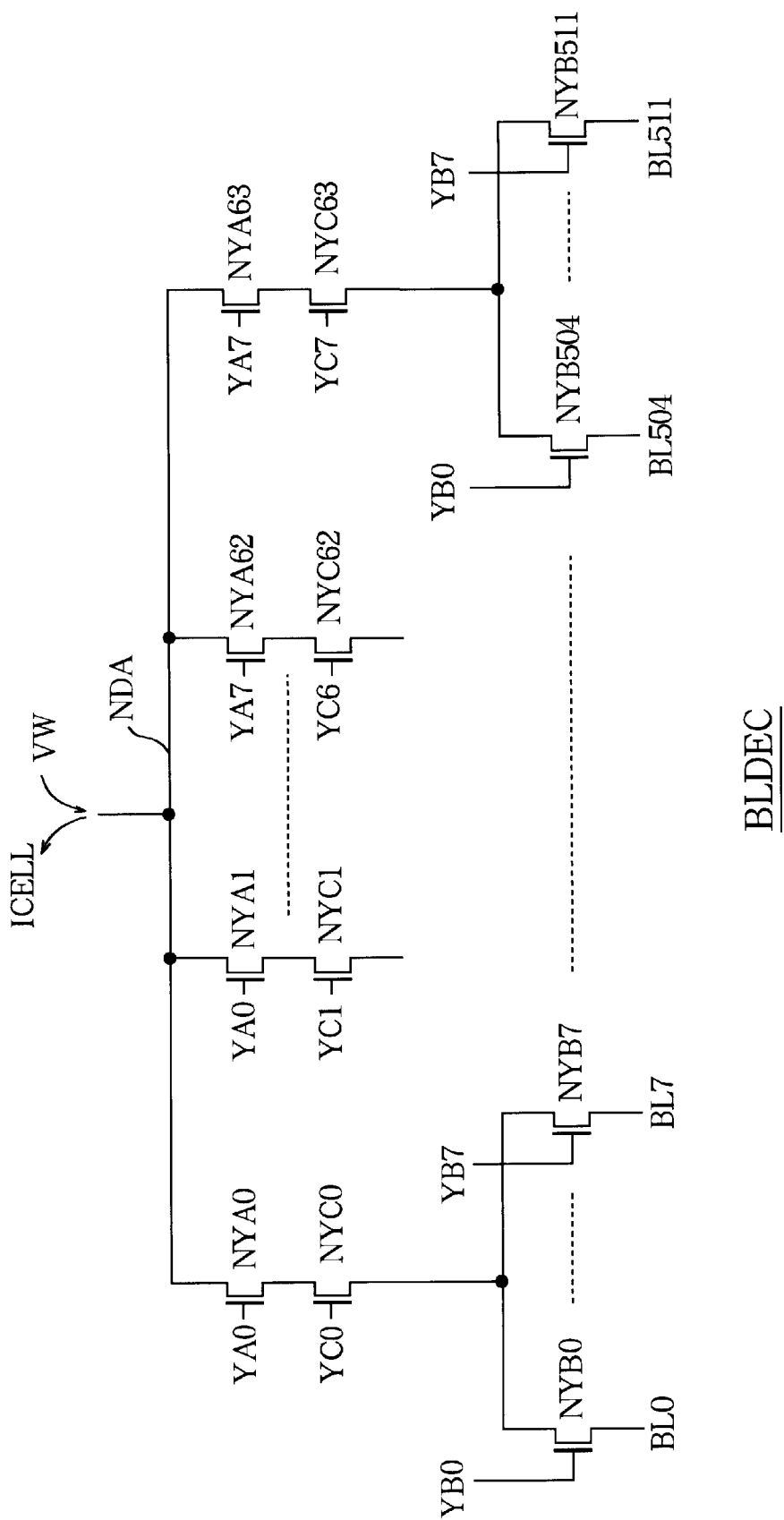
FIG. 7 shows an example of the circuit structure of the bit line decoders in FIG. 3.

FIG. 7 shows an example of the circuit layout of the bit line decoder BLDEC. The bit line decoder BLDEC in FIG. 7 comprises NMOS transistors NYB0, NYB1, ..., NYB511, NMOS transistors NYA0, NYA1, ..., NYA63, and NMOS transistors NYC0, NYC1, ..., NYC63.

The source electrodes of transistors NYB<8k>, NYB<8k+1>, ..., NYB<8k+7> are connected to bit lines BL<8k>, BL<8k+1>, ..., BL<8k+7> (where k is an arbitrary integer from 0 to 63). The gate electrodes of transistors NYB<8k>, NYB<8k+1>, ..., NYB<8k+7> receive respective bit line selection signals YB0, YB1, ..., YB7. The drain electrodes of transistors NYB<8k>, NYB<8k+1>, ..., NYB<8k+7> are connected to the source electrode of transistor NYC<k>. The gate electrodes of the first eight of these transistors NYC<k> (NYC0, NYC1, ..., NYC7) receive respective sector selection signals YC0, YC1, ..., YC7. The gate electrodes of transistors NYC8, NYC9, ..., NYC63 also receive these sector selection signals YC0, YC1, ..., YC7 (the gate electrode of transistor NYC<8m+n> receives sector selection signal YCn, where m=0, 1, ..., 7 and n=0, 1, ..., 7). The drain electrode of transistor NYC<k> is connected to the source electrode of transistor NYA<k>. The gate electrodes of transistors NYA0–NYA7 receive sector selection signal YA0. Similarly, the gate electrodes of transistors NYA8–NYA15, NYA16–NYA23, ..., NYA56–NYA63 receive sector selection signals YA1, YA2, ..., YA7. The drain electrodes of transistors NYA0–NYA63 are connected to a node NDA.

When a cell array CLA is selected and data are written or read, the sector selection signals YA0–YA7, sector selection signals YC0–YC7, and bit line selection signals YB0–YB7 go high sequentially, one by one. When the cell array CLA is selected and data are written, the memory cell write voltage VW is supplied to node NDA. When the cell array CLA is selected and data are read, node NDA is coupled to the sense amplifier circuit 8, and supplies the memory cell signal ICELL to the sense amplifier circuit 8.

Consequently, when the cell array CLA is selected and data are written, the memory cell write voltage VW is applied to bit lines BL0–BL511 sequentially. When the cell array CLA is selected and data are read, the memory cell signal ICELL is supplied from bit lines BL0–BL511 sequentially to the sense amplifier circuit 8.

The sector selection signals YA0–YA7, YC0–YC7, and bit line selection signals YB0–YB7 are supplied from the predecoder PDEC, or are generated by the bit line decoder BLDEC according to control signals supplied from the predecoder PDEC.

Source Line Decoder in Non-Redundant Memory Circuit

Figure 8:
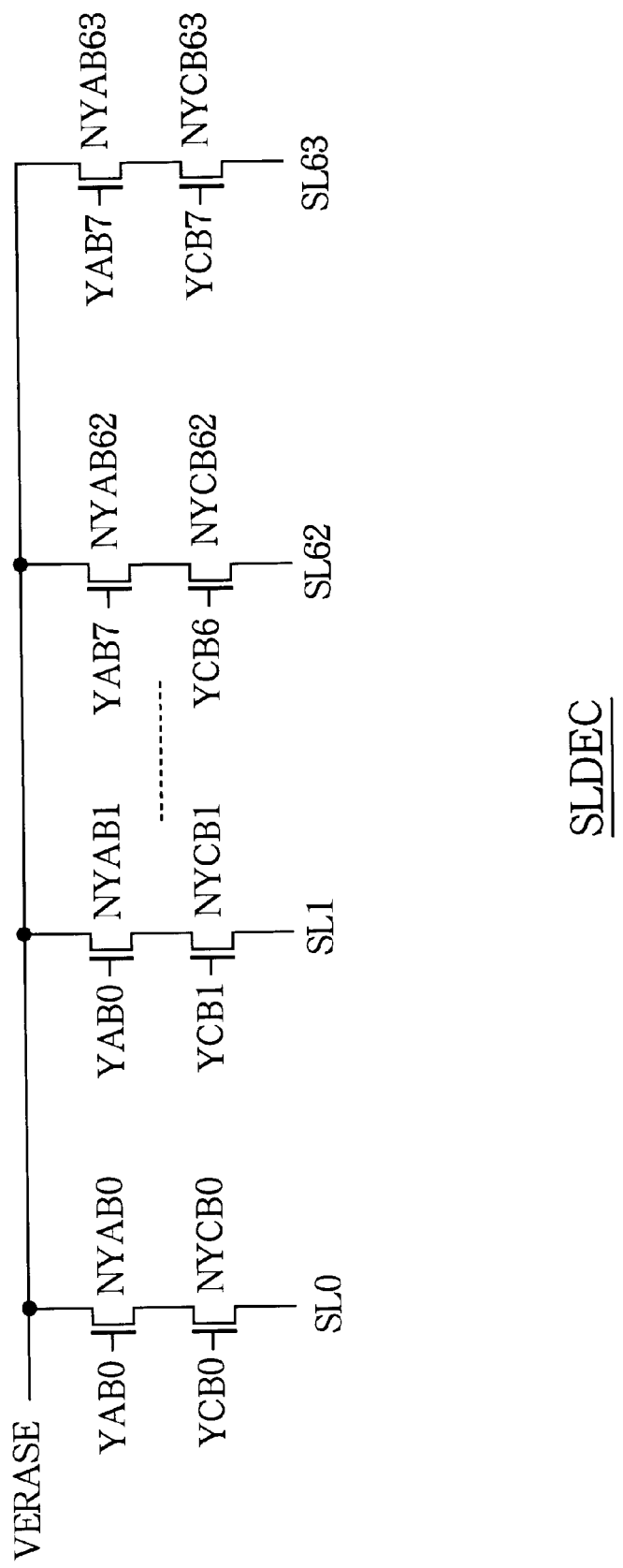
FIG. 8 shows an example of the circuit structure of the source line decoders in FIG. 3.

FIG. 8 shows an example of the circuit layout of the source line decoder SLDEC. The source line decoder SLDEC in FIG. 8 comprises NMOS transistors NYAB0, NYAB1, ..., NYAB63 and NMOS transistors NYCB0, NYCB1, ..., NYCB63.

The source electrode of transistor NYCB<k> is connected to source line SL<k> (where k is an arbitrary integer from 0 to 63). Sector selection signals YCB0, YCB1, ..., YCB7 are supplied respectively to the gate electrodes of the first eight of these transistors NYCB0, NYCB1, ..., NYCB7. The same sector selection signals YCB0, YCB1, ..., YCB7 are similarly supplied to the gate electrodes of transistors NYCB8, NYCB9, ..., NYCB63. The drain electrode of transistor NYCB<k> is connected to the source electrode of transistor NYAB<k>. A sector selection signal YAB0 is supplied to the gate electrodes of transistors NYAB0–NYAB7. Similarly, sector selection signals YAB1, YAB2, ..., YAB7 are supplied to the gate electrodes of transistors NYAB8–NYAB15, NYAB16–NYAB23, ..., NYAB56–NYAB63. The memory cell erase voltage VERASE is supplied to the drain electrodes of transistors NYAB0–NYAB63.

When data are written or read, or when data are erased in a different cell array, transistors NYAB0–NYAB63 and NYCB0–NYCB63 are all turned off by sector selection signals YAB1–YAB7 and YCB1–YCB7. When cell array CLA is selected and the data therein are erased, sector selection signals YAB0–YAB7 and YCB0–YCB7 go high sequentially in such a way that the memory cell erase voltage VERASE is supplied to source lines SL0–SL63 in sequence.

The sector selection signals YAB0–YAB7 and YCB0–YCB7 are supplied from the predecoder PDEC, or are generated by the source line decoder SLDEC according to control signals supplied from the predecoder PDEC.

Procedures for Writing, Reading, and Erasing a Memory Cell

Figure 9:
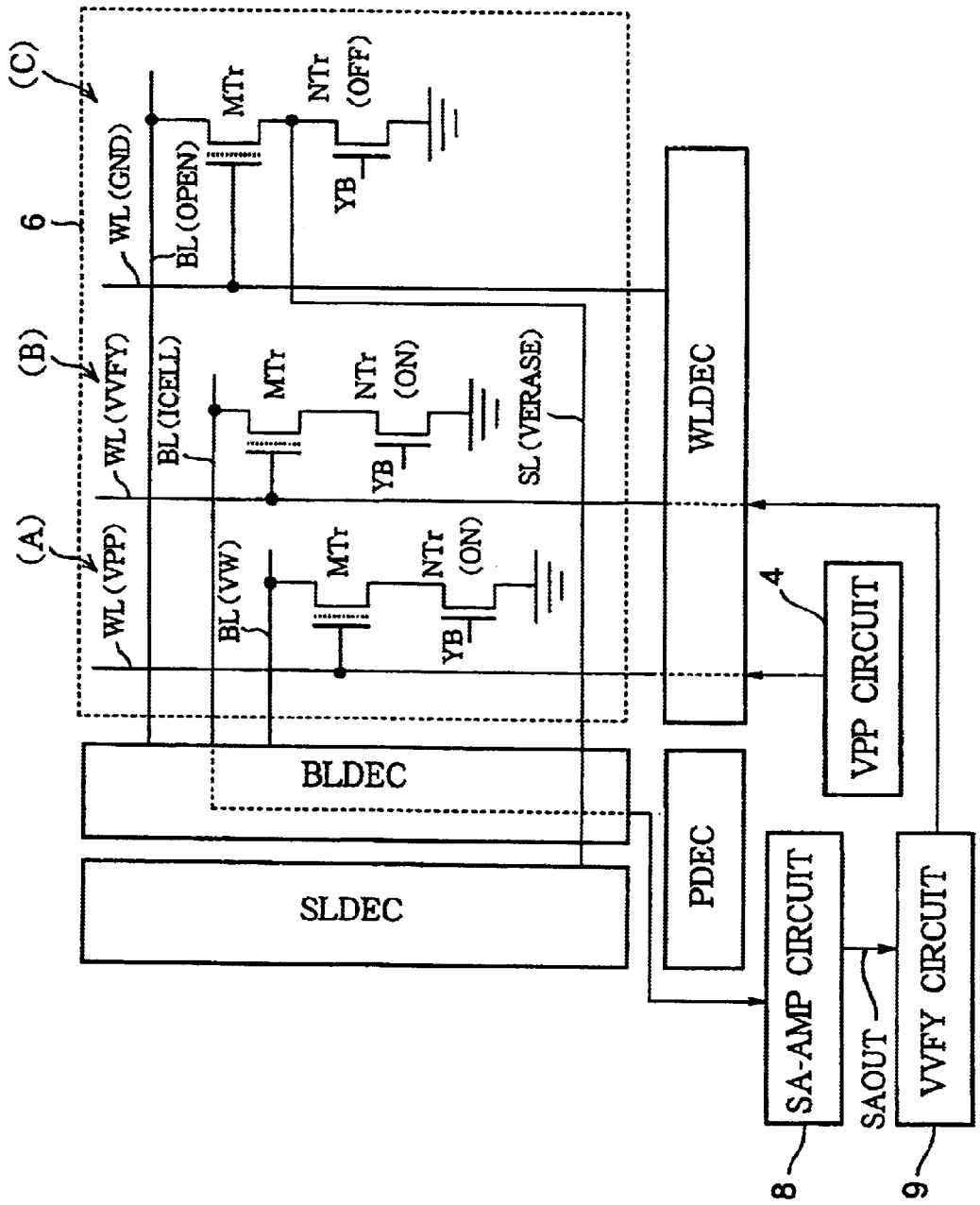
FIG. 9 illustrates the writing, reading, and erasing of memory cell data.

The procedures for writing, reading, and erasing data in a memory cell will be described with reference once again to FIG. 9, which shows three memory cells in the memory cell section 6 in FIGS. 1A and 1B. The writing of data is illustrated in memory cell A, the reading of data in memory cell B, and the erasing of data in memory cell C.

When data are written in memory cell A, a write gate voltage VPP equivalent to the input audio signal voltage AIN shifted up by the input shift voltage VSFT1 is applied from the word line decoder WLDEC to the word line WL connected to the gate of the memory transistor MTr in memory cell A, and the memory cell write voltage VW is applied from the bit line decoder BLDEC to the bit line BL connected to the drain electrode of this memory transistor MTr. A bit selection signal YB supplied from the bit line decoder BLDEC turns on the NMOS transistor NTr in memory cell A, grounding the source electrode of the memory transistor MTr. The memory cell write voltage VW is, for example, six volts (6 V). As a result, a charge responsive to the write gate voltage VPP is injected into the floating gate of the memory transistor MTr, raising its threshold voltage to a value responsive to the write gate voltage VPP.

When data are read from memory cell B, a read gate voltage VVFY is applied from the word line decoder WLDEC to the word line WL connected to the gate of the memory transistor MTr in memory cell B, and NMOS transistor NTr in memory cell B is turned on, grounding the source electrode of the memory transistor MTr. The bit line BL connected to the drain electrode of this memory transistor MTr is coupled through the bit line decoder BLDEC and predecoder PDEC to the sense amplifier circuit 8. The VVFY circuit 9 varies the read gate voltage VVFY to find the point at which the output SAOUT of the sense amplifier circuit 8 switches level, at which point WVFY is substantially equal to the threshold voltage of the memory transistor MTr. This read gate voltage VVFY is shifted down by the analog output shift voltage VSFT2 to obtain the output audio signal voltage SHPRYO.

When data are erased in memory cell C, the word line decoder WLDEC grounds the word line WL connected to the gate of the memory transistor MTr in memory cell C, and the bit line decoder BLDEC opens (disconnects) the bit line BL connected to the drain electrode of this memory transistor MTr. The NMOS transistor NTr in memory cell C is turned off, and the memory cell erase voltage VERASE is supplied from the source line decoder SLDEC to the source line SL connected to the source electrode of the memory transistor MTr. The memory cell erase voltage VERASE is, for example, eleven volts (11 V). Charge is thereby removed from the floating gate of the memory transistor MTr, reducing its threshold voltage to substantially the initial level.

Sense Amplifier Circuit

Figure 10:
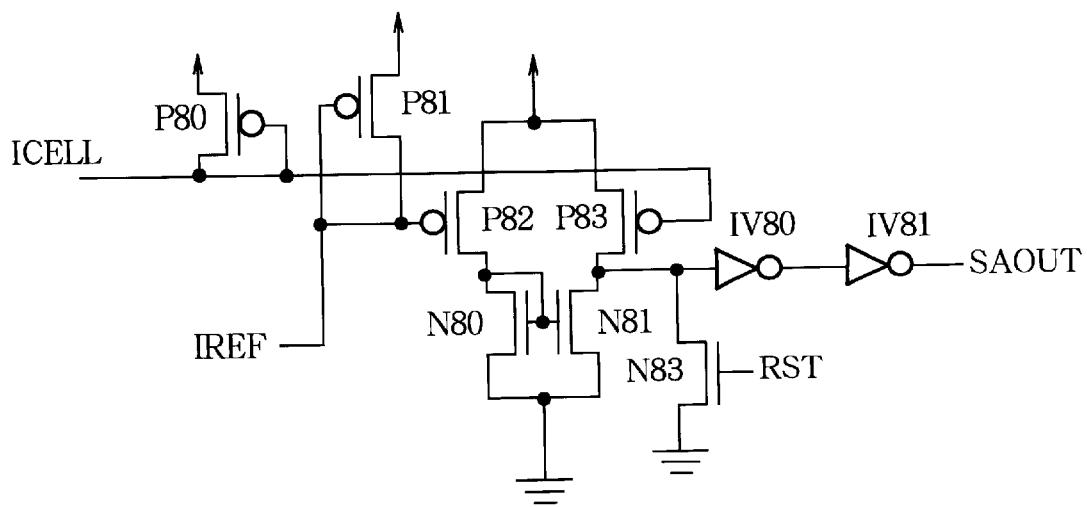
FIG. 10 shows an example of the circuit structure of the sense amplifier (SA-AMP) circuit in FIGS. 1A and 1B.

FIG. 10 shows an example of the circuit configuration of the sense amplifier (SA-AMP) circuit 8. The sense amplifier circuit 8 in FIG. 10 comprises PMOS transistors P80, P81, P82, P83, NMOS transistors N80, N81, N83, and inverters IV80, IV81.

Transistors P82, P83, N80, and N81 form a comparator circuit. The source electrodes of transistors P82 and P83 are connected to the power supply. The drain electrode of transistor P82 is connected to the drain electrode of transistor N80 and to the gate electrodes of transistors N80 and N81. The drain electrode of transistor P83 is connected to the drain electrode of transistor N81. The source electrodes of transistors N80 and N81 are grounded. The gate electrode of transistor P82 receives a reference signal IREF. The gate electrode of transistor P83 receives the memory cell signal ICELL.

The output terminal of this comparator circuit is the drain electrode of transistor P83, which is also connected to the input terminal of inverter IV80 and the drain electrode of transistor N83. The output terminal of inverter IV80 is connected to the input terminal of inverter IV81. The bi-level sense amplifier output signal SAQUT is obtained from the output terminal of inverter IV81. The level (high or low) of this signal SAQUT depends on whether the memory cell signal ICELL is higher or lower than the reference signal IREF. When the read gate voltage VVFY applied to the memory cell being read is equal to or greater than the threshold voltage of the memory transistor in that memory cell, the memory transistor turns on, the memory cell signal ICELL is C pulled below the level of the reference signal IREF, and the sense amplifier output signal SAQUT goes high.

The source electrode of transistor N83 is grounded. The gate electrode of transistor N83 receives a reset signal RST. When the reset signal RST goes high, transistor N83 turns on, grounding the drain electrode of transistor P83 and forcing the sense amplifier output signal SAOUT to the low logic level.

Transistors P80 and P81 function as pull-up elements for the ICELL and IREF signal lines.

VSFT Circuit

Figure 11:
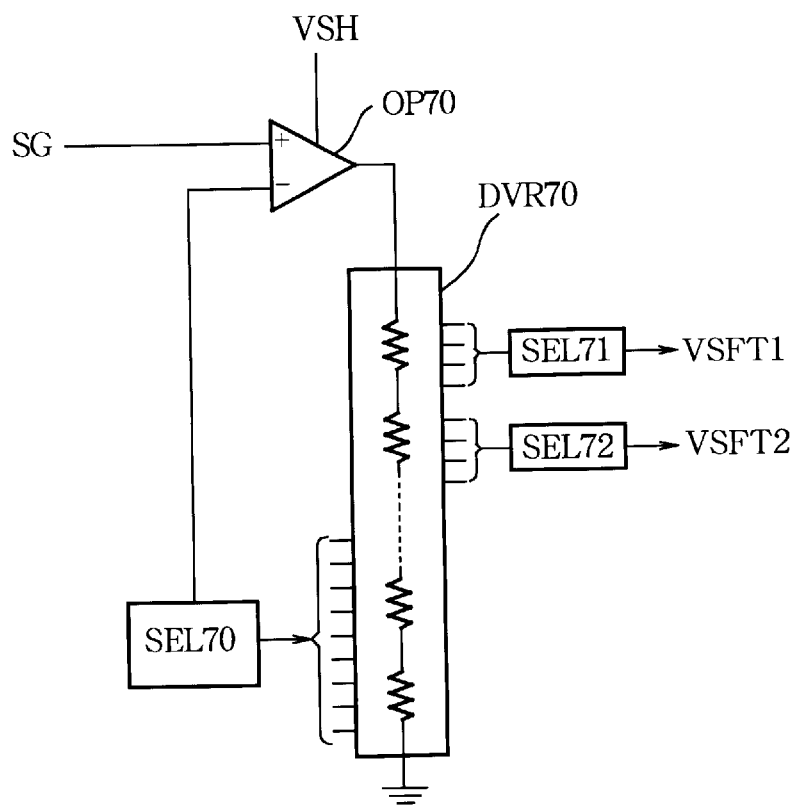
FIG. 11 shows an example of the circuit structure of the VSFT circuit in FIGS. 1A and 1B.

FIG. 11 shows an example of the circuit configuration of the VSFT circuit 7. The VSFT circuit 7 in FIG. 11 comprises an operational amplifier OP70, a resistor ladder DVR70, and selector circuits SEL70, SEL71, SEL72.

The resistor ladder DVR70 is coupled between the output terminal of the operational amplifier OP70 and ground. The resistor ladder DVR70 is a divided resistance circuit comprising a plurality of resistive elements that divide the output voltage of the operational amplifier OP70 into predetermined proportions, and a plurality of output terminals at which the divided voltages are output.

Selector SEL70 selects one of the divided voltages output from the resistor ladder DVR70, and supplies the selected voltage to the inverting input terminal of the operational amplifier OP70. The non-inverting input terminal of the operational amplifier OP70 receives the analog signal reference potential SG (which is, for example, 1.35 V). As its power supply, the operational amplifier OP70 receives a boosted power supply VSH (for example, 12 V). The output voltage of the operational amplifier OP70 takes on values between zero volts (0 V) and the boosted power supply level VSH, as determined by the analog signal reference potential SG and the output voltage of selector SEL70.

Selector SEL71 selects one of the divided voltages output by the resistor ladder DVR70 for use as the analog input shift voltage VSFT1. Selector SEL72 selects another one of the divided voltages output by the resistor ladder DVR70 for use as the analog output shift voltage VSFT2. Examples of the values of the analog input shift voltage VSFT1 and analog output shift voltage VSFT2 are values of from 9.15 V to 9.35 V for VSFT1, and values from 4.05 V to 4.35 V for VSFT2, as mentioned above. Selectors SEL71 and SEL72 enable these shift voltages VSFT1, VSFT2 to be trimmed.

VPP circuit

Figure 12A:
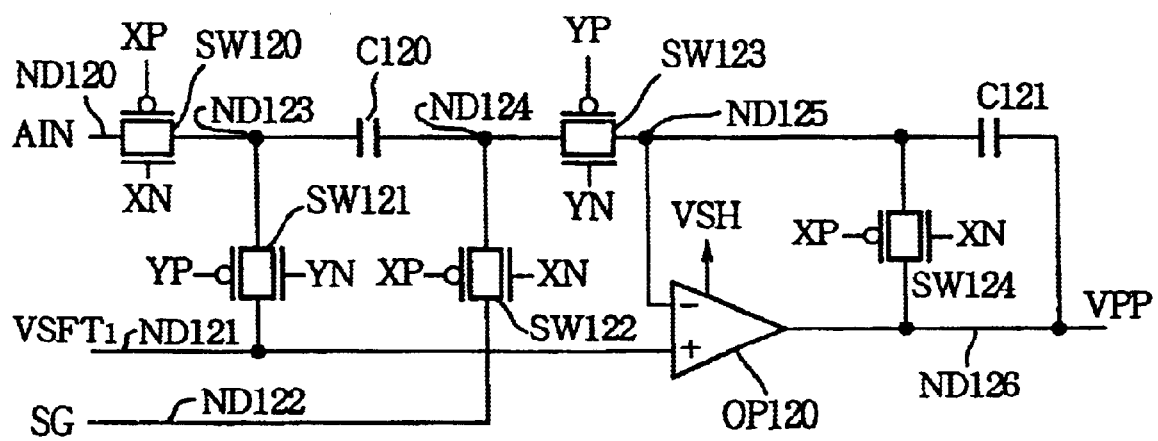
FIG. 12A shows an example of the circuit structure of the VPP circuit in FIGS. 1A and 1B.

FIG. 12A shows an example of the circuit configuration of the VPP circuit 4. The VPP circuit 4 in FIG. 12A comprises MOS switches SWI 20, SWi 21, SW122, SW123, SW124, capacitors 0120, 0121, and an operational amplifier OP120, and has nodes ND120–ND126.

The input analog audio signal voltage AIN is received at node ND120. The analog input shift voltage VSFT1 (e.g., 9.15 V to 9.35 V) is received at node ND121, which is connected to the non-inverting input terminal of the operational amplifier OP120. The analog signal reference potential SG (e.g., 1.35 V) is received at node ND122. The write gate voltage VPP is output from node ND126, which is connected to the output terminal of the operational amplifier OP120. The inverting input terminal of the operational amplifier OP120 is connected to node ND125. As its power supply, the operational amplifier OP120 receives the boosted power supply VSH (e.g., 12 V).

Switch SW120 is coupled between nodes ND120 and ND123, switch SW121 between nodes ND121 and ND123, switch SW122 between nodes N122 and ND124, switch SW123 between nodes ND124 and ND125, and switch SW124 between nodes ND125 and ND126. Capacitor C120 is coupled between nodes ND123 and ND124, and capacitor C121 between nodes ND125 and ND126. A switching clock signal XP is supplied to the PMOS input terminals, and a switching clock signal XN to the NMOS input terminals, of switches SW120, SW122, SW124. A switching clock signal YP is supplied to the PMOS input terminals, and a switching clock signal YN to the NMOS input terminals, of switches SW121 and SW123.

Figure 12B:
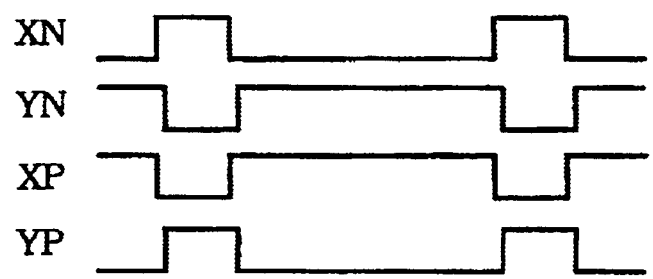
FIG. 12B is a timing waveform diagram illustrating the operation of the VPP circuit in FIG. 12A.

Waveforms of the switching clock signals XN, YN, XP, YP are shown in FIG. 12B. When switches SW120, SW122, and SW124 turn on, switches SW121 and SW123 turn off. When switches SW120, SW122, and SW124 turn off, switches SW121 and SW123 turn on. As a result of these switching operations, a write gate voltage VPP representing the input analog audio signal voltage AIN shifted up by the analog input shift voltage VSFT1 is generated at the output terminal of the operational amplifier OP120 (node ND126). More precisely, the difference between AIN and the analog signal reference potential SG, multiplied by a constant, is shifted up by VSFT1. If the capacitance of capacitor C120 is c120 and the capacitance of capacitor C121 is c121, then VPP has the following value.

$$VPP=(c120/c121)(AIN-SG)+VSFT1$$

VVFY Circuit

Figure 13A:
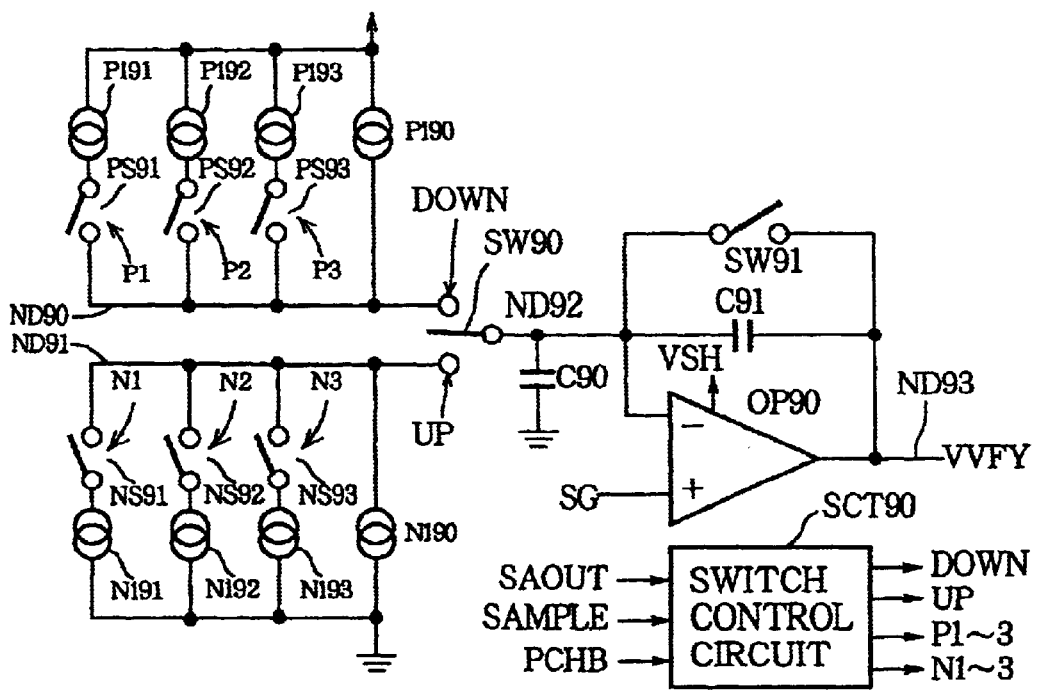
FIG. 13A shows an example of the circuit structure of the VVFY circuit in FIGS. 1A and 1B.

FIG. 13A shows an example of the circuit configuration of the VVFY circuit 9. The VVFY circuit 9 in FIG. 13A comprises PMOS current sources P190, P191, P192, P193, NMOS current sources N190, N191, N192, N193, PMOS switches PS91, PS92, PS93, NMOS switches NS91, NS92, NS93, switches SW90, SW91, capacitors C90, C91, an operational amplifier OP90, and a switch control circuit SCT90, and has nodes ND90, ND91, ND92, ND93.

The switch control circuit SCT90 receives the sense amplifier output signal SAOUT, a sampling signal denoted SAMPLE, and a precharge signal denoted PCHB, which was also referred to above as a reset signal. From these inputs, the VVFY circuit 9 generates an output-voltage-up clock signal UP, an output-voltage-down clock signal DOWN, PMOS switch clock signals P1, P2, P3, and NMOS switch clock signals N1, N2, N3.

Current source P190 is connected between the power supply and node ND90. Current source P191 and switch PS91 are connected in series between the power supply and node ND90. Current source P192 and switch PS92 are also connected in series between the power supply and node ND90, as are current source P193 and switch PS93. In similar fashion, current source N190 is connected between node ND91 and ground, and current source N191 and switch NW91, current source N192 and switch NW92, and current source N193 and switch NW93 are respectively connected in series between node ND91 and ground. Switch PS91 is controlled by switch clock P1, switch PS92 by switch clock P2, switch PS93 by switch clock P3, switch NS91 by switch clock N1, switch NS92 by switch clock N2, and switch NS93 by switch clock N3.

Switch SW90 has three terminals, of which one is connected to node ND90, another to node ND91, and another to node ND92. Node ND92 is connected to the inverting input terminal of the operational amplifier PP90. Switch SW90 connects node ND92 to nodes ND91 and ND90 according to the output-voltage-up clock (UP) and the output-voltage-down clock (DOWN). Node ND92 is also coupled through capacitor C90 to ground. Node ND92 is further coupled through capacitor O91 and switch SW91, in parallel, to node ND93. Node ND93 is connected to the output terminal of the operational amplifier OP90, and is the node from which the read gate voltage VVFY is output. The non-inverting input terminal of the operational amplifier OP90 receives the analog signal reference potential SG. Switch SW91 is switched off while the VVFY circuit 9 is operating, and is switched on, short-circuiting capacitor O91, while the VVFY circuit 9 is not operating.

Figure 13B:
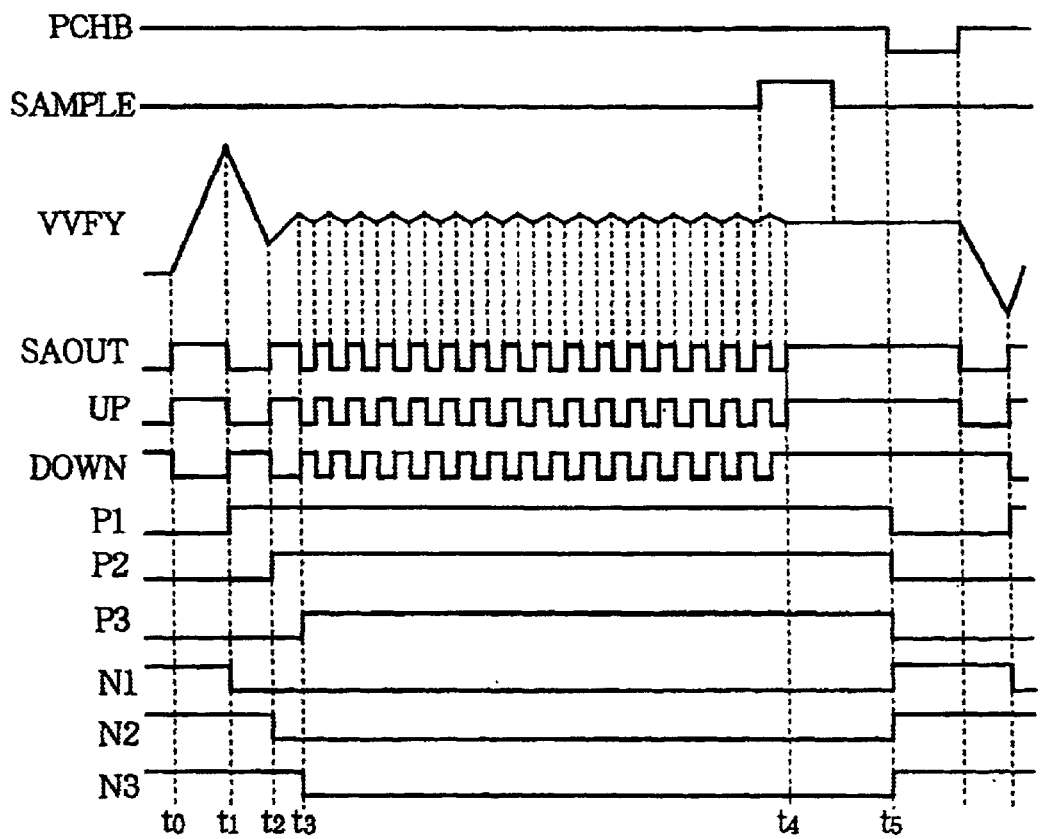
FIG. 13B is a timing waveform diagram illustrating the operation of the VVFY circuit in FIG. 13A.

The operation of the VVFY circuit 9 is conceptually illustrated in FIG. 13B. The operation starts when the sense amplifier output signal SAOUT goes high at time $t_0$. The switch control circuit SCT90 responds by driving the output-voltage-up clock (UP) to the high logic level and the output-voltage-down clock (DOWN) to the low logic level, causing switch SW90 to connect node ND92 to node ND91. Switch clocks P1–P3 are all low and switch clocks N1–N3 are all high, so switches PS91–PS93 and NS91–NS93 are all switched on. The current sunk by current sources N190–N193 drains charge from capacitors C90 and C91, reducing the potential of node ND92 and causing the read gate voltage VVFY to rise.

At time $t_1$, the read gate voltage VVFY rises above the threshold voltage of the memory cell transistor and the sense amplifier output signal SAOUT goes low. The switch control circuit SCT90 responds by driving the output-voltage-up clock (UP) low and the output-voltage-down clock (DOWN) high, causing switch SW90 to couple node ND92 to node ND90. The switch control circuit SCT90 also drives switch clock P1 high and switch clock N1 low, turning off switches PS91 and NS91. Current sources P190, P192, and P193 now charge node ND92, raising its potential and causing the read gate voltage VVFY to fall.

At time $t_2$, the read gate voltage VVFY falls below the threshold voltage of the memory cell transistor and the sense amplifier output signal SAOUT goes high again. The switch control circuit SCT90 drives the output-voltage-up clock (UP) high and the output-voltage-down clock (DOWN) low, causing switch SW90 to couple node ND92 to node ND91, and drives switch clock P2 high and switch clock N2 low, turning off switches PS92 and NS92. Current sources N190 and N193 discharge node ND92, lowering its potential and causing the read gate voltage VVFY to rise again, although at a slower rate than between times $t_0$ and $t_1$ because only two NMOS current sources are active instead of four.

At time $t_3$, the read gate voltage VVFY again rises above the threshold voltage of the memory cell transistor and the sense amplifier output signal SAOUT goes low once more. The switch control circuit SCT90 drives the output-voltage-up clock (UP) low and the output-voltage-down clock (DOWN) high, causing switch SW90 to couple node ND92 to node ND90, and drives switch clock P3 high and switch clock N3 low, turning off switches PS93 and NS93. Current source P190 charges node ND92, raising its potential and causing the read gate voltage VVFY to fall again, although at a slower rate than between times $t_1$ and $t_2$ because only one PMOS current source is now active.

Between times $t_3$ and $t_4$, the switch control circuit SCT90 continues to reverse the logic levels of the output-voltage-up clock (UP) and output-voltage-down clock (DOWN) each time the level of the sense amplifier output signal SAOUT changes, and the read gate voltage VVFY alternately rises and falls as current sources P190 and N190 alternately charge and discharge node ND92. Since the rise and fall are comparatively slow, the read gate voltage VVFY remains near the threshold voltage of the memory cell transistor.

Shortly before time $t_4$, the sampling signal SAMPLE goes high. At time $t_4$, the switch control circuit SCT90 drives both the output-voltage-up clock (UP) and the output-voltage-down clock (DOWN) high, causing switch SW90 to disconnect node ND92 from both nodes ND90 and ND91. The read gate voltage VVFY is thereby held constant.

At time $t_5$, the precharge signal PCHB goes low. The switch control circuit SCT90 drives switch clocks P1–P3 low and switch clocks N1–N3 high, turning on switches PS91–PS93 and NS91–NS93. When the PCHB signal goes high again, the switch control circuit SCT90 drives the output-voltage-up clock (UP) low for a certain interval to charge node ND92, thereby lowering the read gate voltage VVFY in preparation for the reading of the next memory cell.

SHPLYO Circuit

Figure 14:
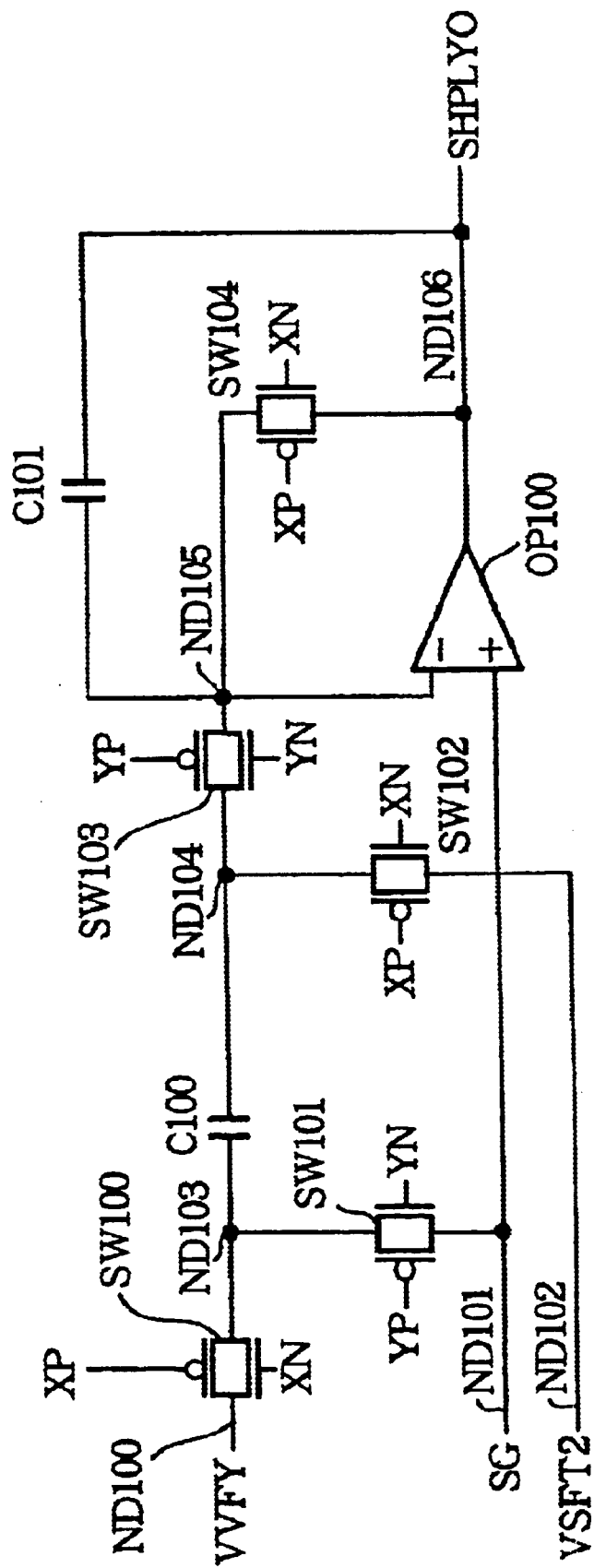
FIG. 14 shows an example of the circuit structure of the SHPLYO circuit in FIGS. 1A and 1B.

FIG. 14 shows an example of the circuit configuration of the SHPLYO circuit 10. The SHPLYO circuit 10 in FIG. 14 comprises MOS switches SW100, SW101, SW102, SW103, SW104, capacitors C100, C101, and an operational amplifier OP100, and has nodes ND100 to ND106.

The read gate voltage VVFY is received at node ND100. The analog signal reference potential SG (1.35 V, for example) is received at node ND101 and supplied to the non-inverting input terminal of operational amplifier OP101. The analog output shift voltage VSFT2 (a voltage between 4.05 V and 4.35 V, for example) is received at node ND102. The inverting input terminal of operational amplifier OP100 is connected to node ND105. The output analog audio signal voltage SHPLYO is produced from the output terminal of operational amplifier OP100 at node ND106.

Switch SW100 is coupled between nodes ND100 and ND103, switch SW101 between nodes ND103 and ND101, switch SW102 between nodes ND102 and ND104, switch SW103 between nodes ND104 and ND105, and switch SW104 between nodes ND105 and ND106. Capacitor C100 is coupled between nodes NO103 and ND104; capacitor C101 is coupled between nodes ND105 and ND106.

Switching clock signal XP is supplied to the PMOS gate electrodes of switches SW100, SW102, and SW104. Switching clock signal XN is supplied to the NMOS gate electrodes of switches SW100, SW102, and SW104. Similarly, switching clock signal YP is supplied to the PMOS and switching clock signal YN to the NMOS gate electrodes of switches SW101 and SW103. (Waveforms of switching clock signals XP, XN, YP, and YN were shown in FIG. 12B.)

Switches SW100–SW104 in the SHPLYO circuit 10 are analogous to switches SW120–SW124 in the VPP circuit 4: when switches SW100, SW102, and SW104 are on, switches SW101 and SW103 are off, and when switches SW100, SW102, and SW104 are off, switches SW101 and SW103 are on. Due to these switching operations, the SHPLYO circuit 10 puts out an output analog audio signal voltage SHPLYO equal to the read gate voltage VVFY shifted down according to the output shift voltage VSFT2 (and equivalent to the input analog audio signal voltage AIN), which is generated at the output terminal (node ND106) of operational amplifier OP100. More precisely, if the capacitance of capacitor C100 is c100 and the capacitance of capacitor C101 is c101, then SHPLYO has the following value.

$$SHPLYO = (c100/c101)(VVFY-VSFT2)+SG$$

Although the circuits and circuit operations described above form a basis for the embodiments to be described below, they can be modified in many ways. For example, the relationship between the polarity of the SAOUT signal and the rise and fall of the VVFY potential in FIG. 13B can be reversed.

FIRST EMBODIMENT

Figure 15:
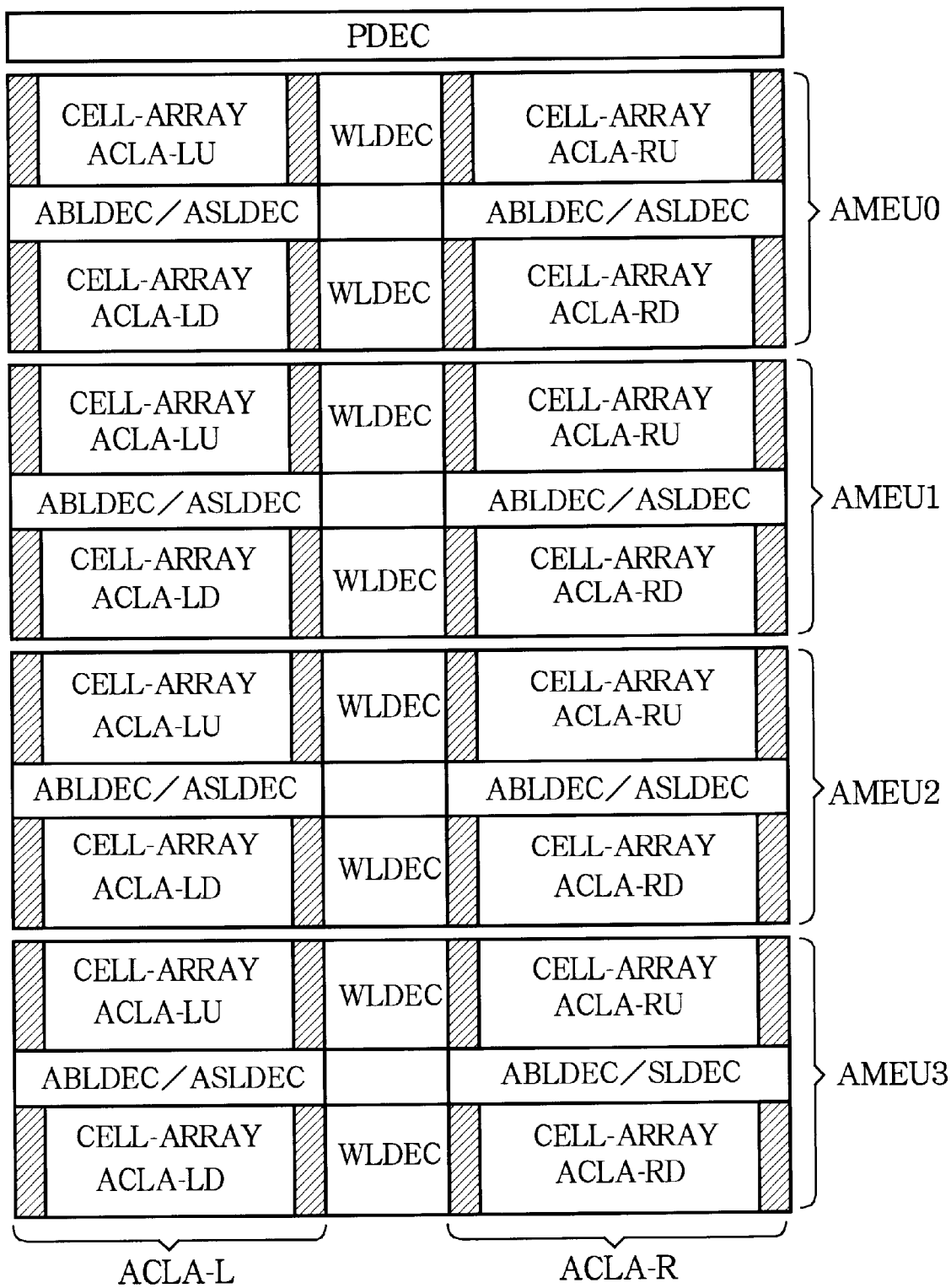
FIG. 15 illustrates the structure of a redundant memory circuit in an analog audio flash memory according to a first embodiment of the invention.

FIG. 15 shows the layout of the redundant memory circuit of an analog audio flash memory according to a first embodiment of the invention. Elements identical to corresponding elements in the non-redundant memory circuit in FIG. 2 are denoted by the same reference characters. The redundant memory circuit in FIG. 15 includes a predecoder PDEC and four memory units AMEU0, AMEU1, AMEU2, AMEU3, an arbitrary one of which will be denoted AMEU below. Hatching is used to denote the positions of redundant sectors in the memory units.

Figure 16:
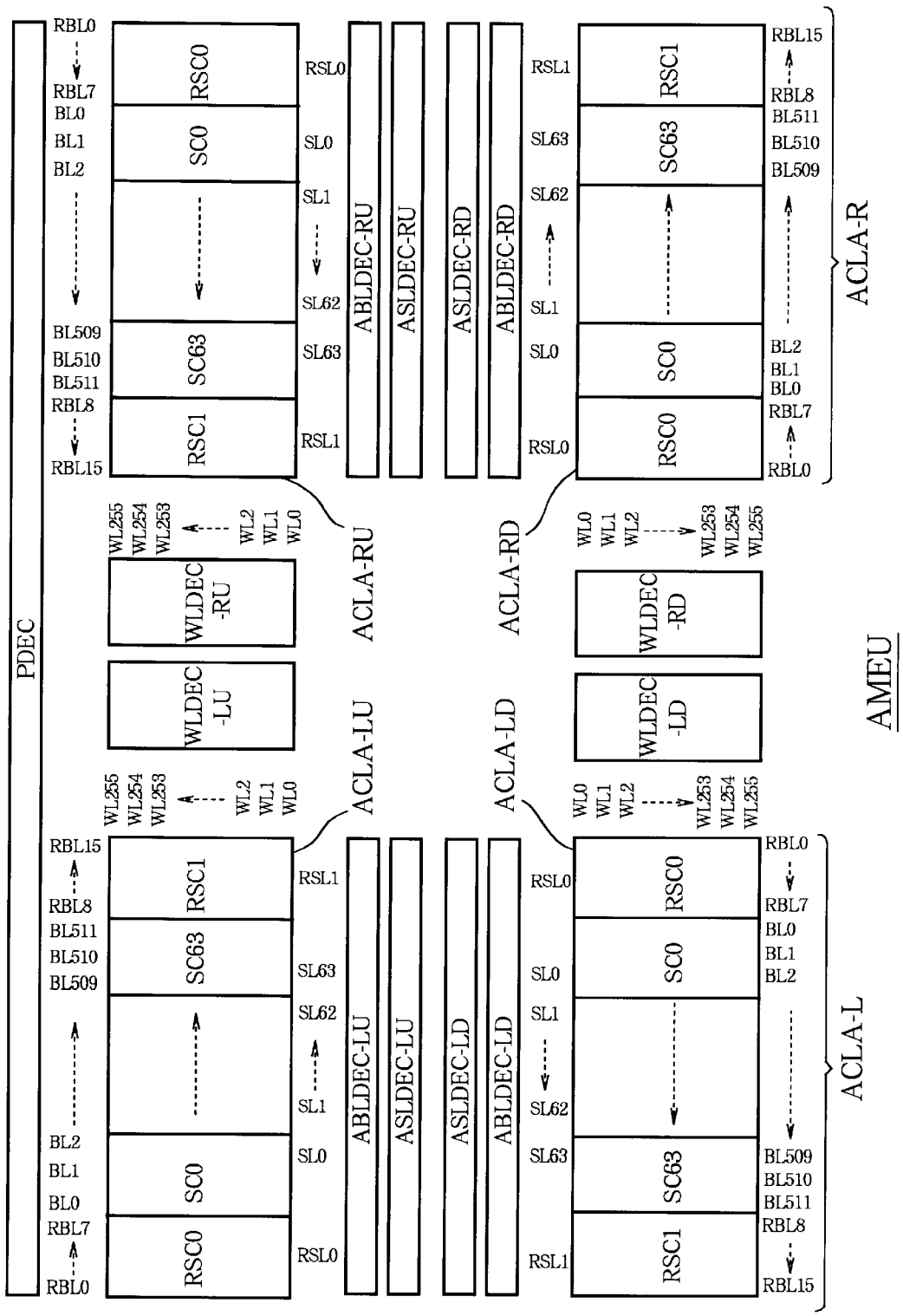
FIG. 16 illustrates the structure of a memory unit in the first embodiment in more detail.

FIG. 16 shows the layout of a memory unit AMEU in FIG. 15. The memory unit AMEU includes four cell arrays ACLA (ACLA-LU, ACLA-RU, ACLA-LD, ACLA-RD), four word line decoders WLDEC (WLDEC-LU, WLDEC-RU, WLDEC-LD, WLDEC-RD), four bit-line decoders ABLDEC (ABLDEC-LU, ABLDEC-RU, ABLDEC-LD, ABLDEC-RD), and four source line decoders ASLDEC (ASLDEC-LU, ASLDEC-RU, ASLDEC-LD, ASLDEC-RD).

The sixteen cell arrays ACLA constitute a memory cell section corresponding to the memory cell section 6 in FIGS. 1A and 1B. Each cell array ACLA has its own word line decoder WLDEC, bit line decoder ABLDEC, and source line decoder ASLDEC. The predecoder PDEC, sixteen word line decoders WLDEC, sixteen bit line decoders ABLDEC, and sixteen source line decoders ASLDEC constitute an address decoder corresponding to the address decoder 5 in FIGS. 1A and 1B.

The memory cell section of the redundant memory circuit of the first embodiment has eight left cell arrays ACLA-L (ACLA-LU and ACLA-LD) and eight right cell arrays ACLA-R (ACLA-RU and ACLA-RD). Each cell array ACLA is a 132-kilocell array including a 128-kilocell array of memory cells MCL and an additional 4-kilocell array of redundant memory cells RMCL. If redundancy is not counted, the memory cell section has a 2-megacell total effective size, of which a 1-megacell portion is on the left and another 1-megacell portion is on the right. The word line decoders WLDEC are disposed between the left and right cell arrays, at the right ends of the left cell arrays ACLA-L and at the left ends of the right cell arrays ACLA-R.

Cell Array in the First Embodiment

As shown in FIG. 16, a cell array ACLA comprises sixty-four sectors SC (SC0, SC1, ... , SC63) and two redundant sectors RSC (RSC0, RSC1). The cell array ACLA has two hundred fifty-six word lines WL (WL0, WL1, ... , WL255), five hundred twelve bit lines BL (BL0, BL1, BL511), sixty-four source lines SL (SL0, SL1, ... , SL63), sixteen redundant bit lines RBL (RBL0, RBL1, ... , RBL7, RBL8, ... , RBL15), and two redundant source lines RSL (RSL0, RSL1).

The two redundant sectors RSC0, RSC1 are disposed at opposite ends of the cell array ACLA in the first embodiment: one is disposed at the first end of the cell array ACLA, near the word line decoder WLDEC; the other is disposed at the second end of the cell array ACLA, far from the word line decoder WLDEC. The memory cell array ACLA thus adds a second redundant sector RSC to the cell array UCLA of the conventional redundant memory circuit, shown in FIG. 47, at the end distant from the word line decoder WLDEC. This end (the second end) is the left end of the left cell arrays ACLA-L (ACLA-LU and ACLA-LD) and the right end of the right cell arrays ACLA-R (ACLA-RU and ACLA-RD).

In the upper cell arrays ACLA-LU and ACLA-RU, redundant sector RSC0 is disposed at the end far from the word line decoder WLDEC and redundant sector RSC1 is disposed at the end near the word line decoder WLDE0. In the lower cell All arrays ACLA-LD and ACLA-RD, redundant sector RSC1 is disposed at the end far from the word line decoder WLDEC and redundant sector RSC0 is disposed at the end near the word line decoder WLDEC. Sectors SC0 to SC63 are numbered in order starting from the first end (far from the word line decoder WLDEC) in the upper cell arrays ACLA-LU and ACLA-RU, and from the second end (near the word line decoder WLDEC) in the lower cell arrays ACLA-LD and ACLA-RD. In cell arrays ACLA-LU and ACLA-RD, redundant sector RSC0 is disposed at the left end, followed in left-to-right order by sectors SC0 to SC63, then by redundant sector RSC1 at the right end. In cell arrays ACLA-RU and ACLA-LD, redundant sector RSC0 is disposed at the right end, followed in right-to-left order by sectors SC0 to SO63, then by redundant sector RSC1 at the left end.

Figure 48:
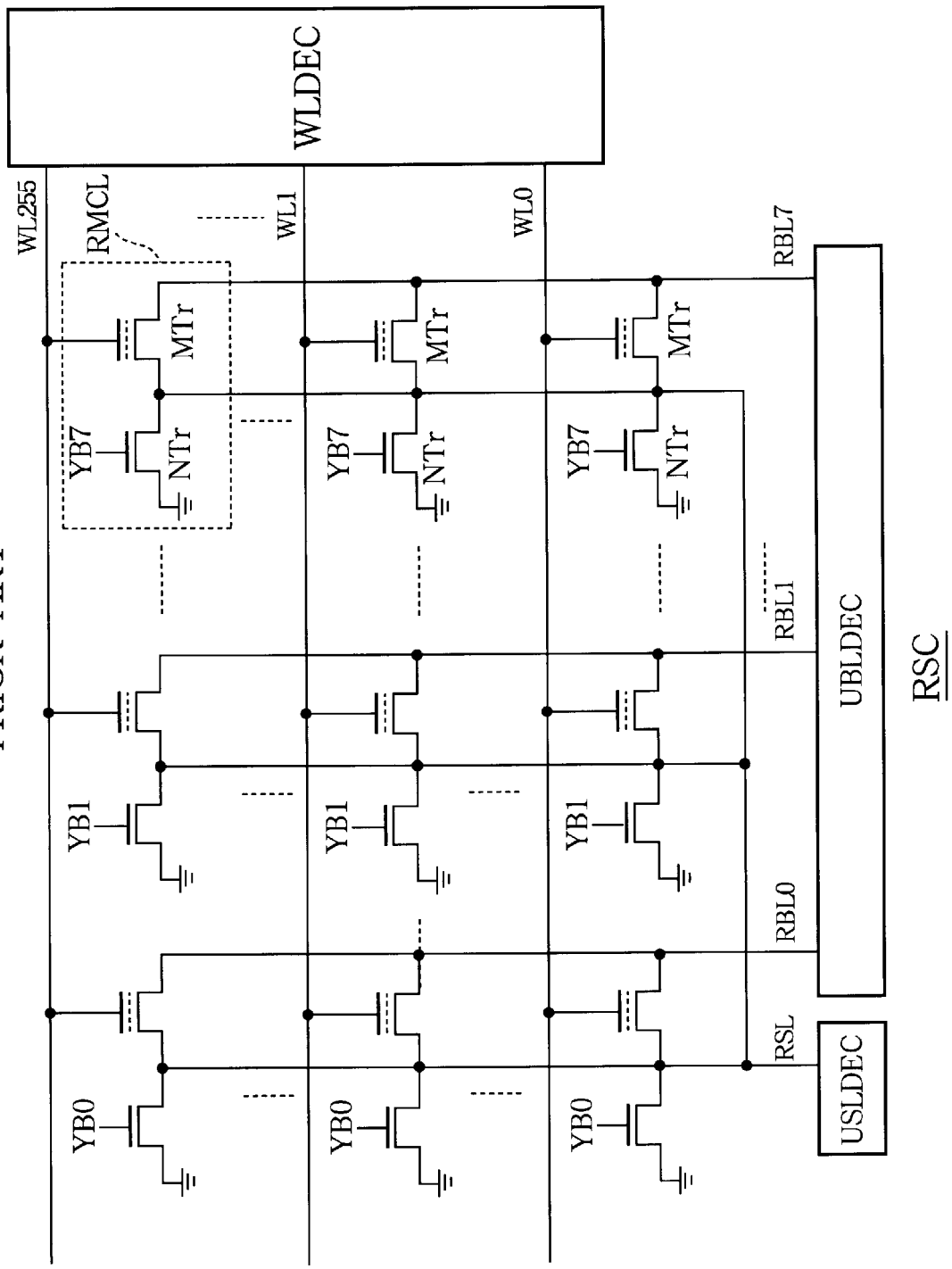
FIG. 48 illustrates the circuit structure of the redundant sectors in FIG. 47.

The redundant sectors RSC0, RSC1 in FIG. 16 both have the circuit configuration shown in FIG. 48, each being a 2-kilocell array of redundant memory cells. As noted above, the 128-kilocell size of a memory cell array ACLA is thus augmented by a 4-kilocell reserve of redundant memory cells. A memory unit AMEU has four times this size (512+16 kilocells). Redundant sector RSC0 is connected to two hundred fifty-six word lines WL0–WL255, eight redundant bit lines RBL0–RBL7, and one redundant source line RSL0; redundant sector RSC1 is connected to the same two hundred fifty-six word lines WL0–WL255, eight redundant bit lines RBL8–RBL15, and one redundant source line RSL1. The bit lines and redundant bit lines RBL0–RBL7, BL0–BL511, and RBL8–RBL15 are controlled by the bit line decoder ABLDEC; the source lines and redundant source lines RSL0, SL0–SL63, RSL1 are controlled by the source line decoder ASLDEC.

The layout of the bit lines and source lines corresponds to the layout of the sectors and redundant sectors RSC0, SC0–SC63, RSC1. In the upper cell arrays ACLA-LU, ACLA-RU, bit lines RBL0–RBL7, BL0–BL511, RBL8–RBL15 are disposed in sequence from the end distant from the word line decoders WLDEC, as are source lines RSL0, SL0–SL63, RSL1. In the lower cell arrays ACLA-LD, ACLA-RD, bit lines RBL0–RBL7, BL0–BL511, RBL8–RBL15 are disposed in sequence from the end adjacent to the word line decoders WLDEC, as are source lines RSL0, SL0–SL63, RSL1. In cell arrays ACLA-LU and ACLA-RD, bit lines RBL0–RBL7, BL0–BL511, RBL8–RBL15 are disposed in sequence from left to right, as are source lines RSL0, SL0–SL63, RSL1. In cell arrays ACLA-RU and ACLA-LD, bit lines RBL0–RBL7, BL0–BL511, RBL8–RBL15 are disposed in sequence from right to left, as are source lines RSL0, SL0–SL63, RSL1.

Bit Line Decoder in the First Embodiment

Figure 17:
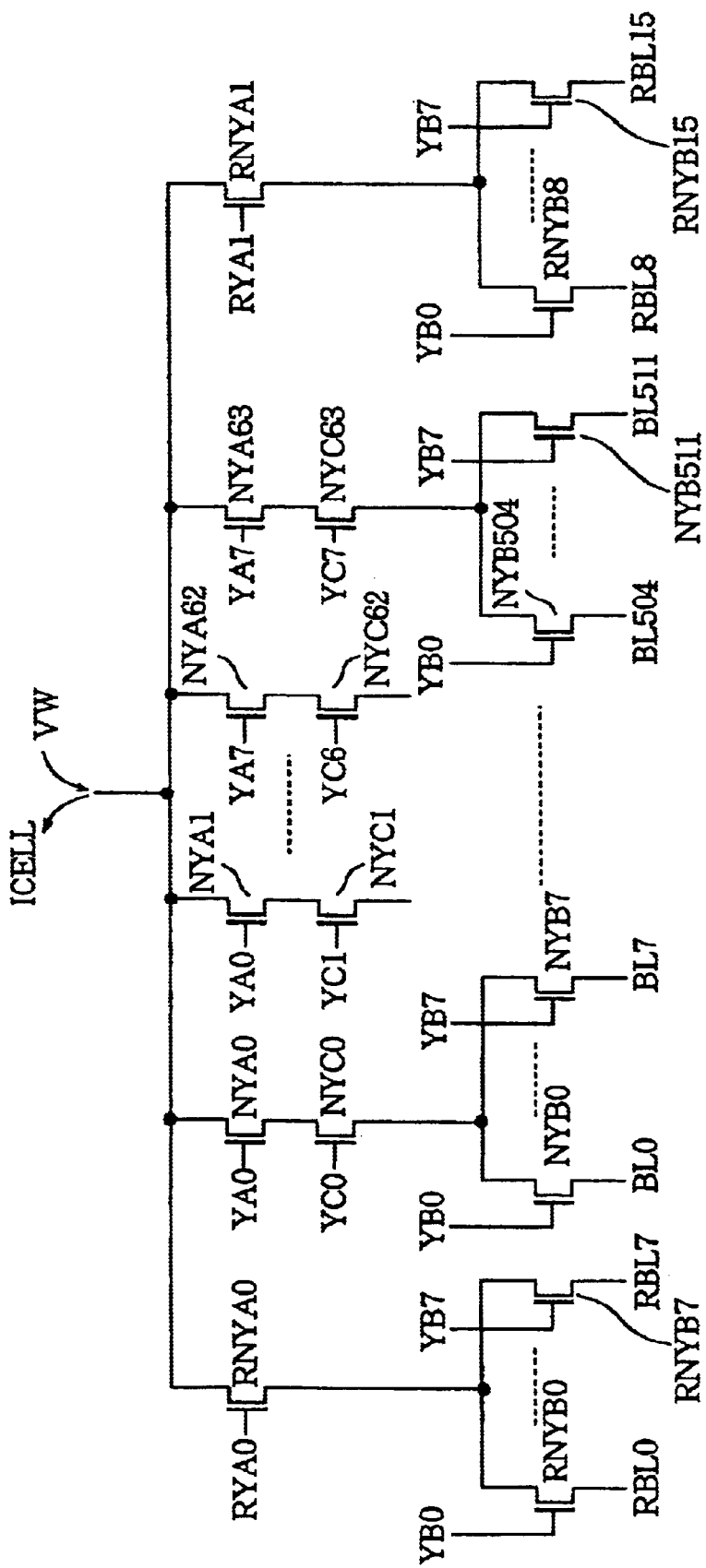
FIG. 17 shows an example of the circuit structure of the bit line decoders in FIG. 16.
Figure 49:
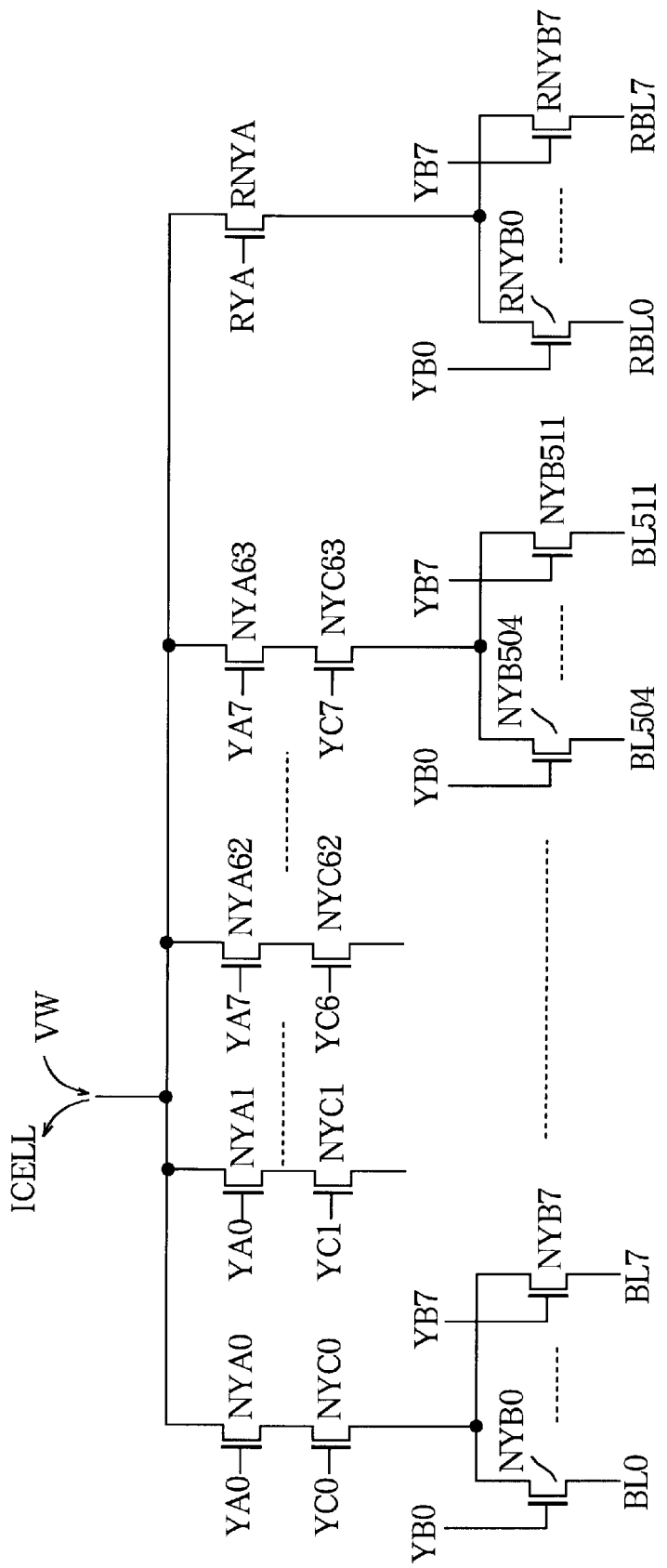
FIG. 49 illustrates the circuit structure of the bit line decoders in FIG. 47.

FIG. 17 shows an example of the circuit layout of the bit line decoder ABLDEC. Elements identical to corresponding elements in FIGS. 7 and 49 are denoted by the same reference characters. The bit line decoder ABLDEC in FIG. 17 comprises NMOS transistors NYB0, NYB7, . . . , NYB504, . . . , NYB511, RNYB0, RNYB1, . . . , RNYB15, NMOS transistors NYA0, NYA1, . . . , NYA62, NYA63, RNYA0, RNYA1, and NMOS transistors NYC0, NYC1, . . . , NYC62, NYC63. This bit line decoder ABLDEC thus adds NMOS transistors RNYB0–RNYB7 and RNYA0 for selecting redundant bit lines RBL0–RBL7, and NMOS transistors RNYB8–RNYB15 and RNYA1 for selecting redundant bit lines RBL8–RBL15, to the circuit configuration of the bit line decoder BLDEC in FIG. 7 (the bit line decoder of the non-redundant memory circuit).

When data are written or reproduced, the bit line decoder ABLDEC selects the bit lines BL0–BL511 and redundant bit lines RBL0–RBL15 (if redundancy replacement has been performed) in sequence according to bit lines selection signals YB0, YB1, . . . , YB7, sector selection signals YA0, YA1, . . . , YA7, YC0, YC1, . . . , YC7, and redundant sector selection signals RYA0, RYAL. To write data, the bit line decoder ABLDEC supplies the memory cell write voltage VW to the selected bit line BL or redundant bit line RBL. To reproduce data, the bit line decoder ABLDEC outputs the memory cell signal ICELL obtained from the selected bit line BL or redundant bit line RBL.

Since the redundant sectors RSC0, RSC1 are disposed at the two ends of cell array ACLA, the NMOS transistors RNYB0–RNYB7 and RNYA0 that select redundant bit lines RBL0–RBL7 are disposed at one end of the bit line decoder ABLDEC, and the NMOS transistors RNYB8–RNYB15 and RNYA1 that select redundant bit lines RBL8–RBL15 are disposed at the other end.

Transistors RNYB0–RNYB7, NYB0–NYB511, RNYB8–RNYB15, transistors RNYA0, NYA0–NYA63, RNYA1, and transistors NYC0–NYC63 are arranged in left-to-right order in bit line decoders ABLDEC-LU and ABLDEC-RD, and in right-to-left order in bit line decoders ABLDEC-RU and ABLDEC-LD, matching the arrangement of the bit lines RBL0–RBL7, BL0–BL511, RBL8–RBL15 in the corresponding memory cell arrays ACLA. The sector selection signals YA0–YA7, RYA0, RYA1, YC0–YC7, and bit line selection signals YB0–YB7 are supplied from the predecoder PDEC, or are generated in the bit line decoder ABLDEC according to control signals supplied from the predecoder PDEC.

Source Line Decoder in the First Embodiment

Figure 18:
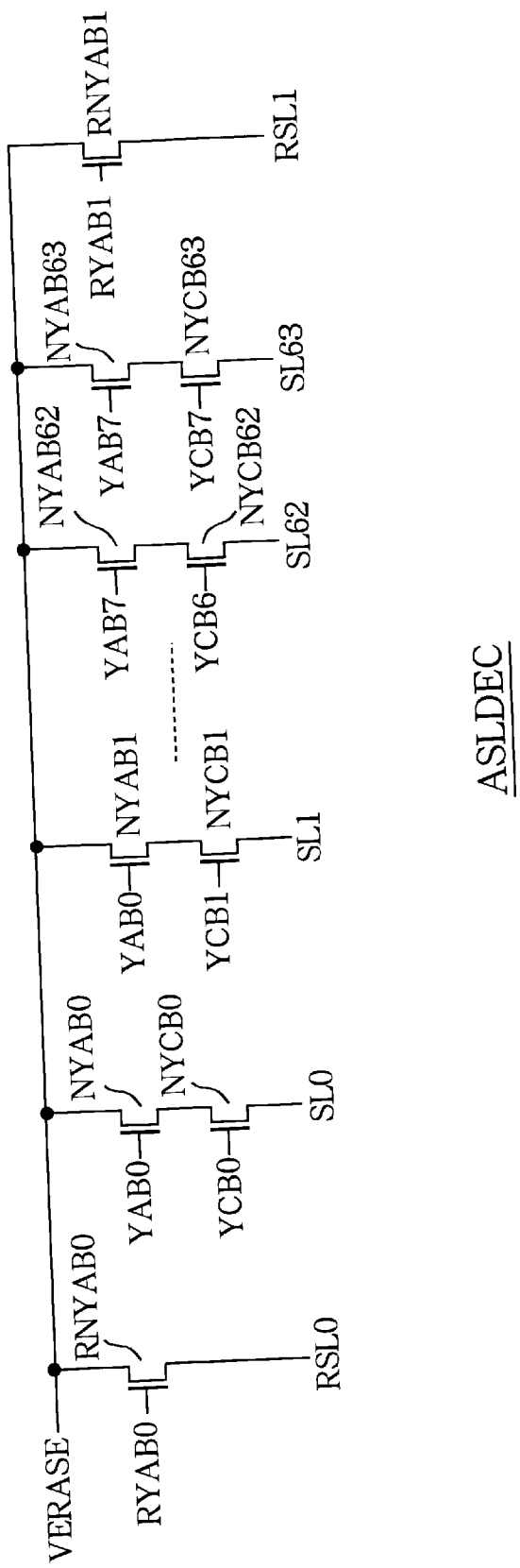
FIG. 18 shows an example of the circuit structure of the source line decoders in FIG. 16.

FIG. 18 shows an example of the circuit layout of the source line decoder ASLDEC. The source line decoder ASLOEC in FIG. 18 comprises NMOS transistors NYAB0, NYAB1, . . . , NYAB62, NYAB63, RNYAB0, RNYAB1 and NMOS transistors NYOB1, . . . , NYCB62, NYCB63. This source line decoder ASLDEC adds NMOS transistors RNYAB0 for selecting redundant source line RSL0 and RNYAB1 for selecting redundant source line RSL1 to the circuit configuration of the source line decoder SLDEC shown in FIG. 8 (the source line decoder in the non-redundant memory circuit).

To erase data, the source line decoder ASLDEC selects source lines SL0–SL63 and redundant source lines RSL0, RSL1 (if redundancy replacement has been performed) one by one in sequence according to sector selection signals YAB0, YAB1, . . . , YAB7, YCB0, YCB1, . . . , YCB7, and redundant sector selection signals RYAB0, RYAB1, and supplies the memory cell erase voltage VERASE to the selected source line SL or redundant source line RSL.

Since the redundant sectors RSC0, RSC1 are disposed at the two ends of a cell array ACLA, the NMOS transistor RNYAB0 that selects redundant source line RSL0 is disposed at one end of the source line decoder ASLDEC, and the NMOS transistor RNYAB1 that selects redundant source line RSL1 is disposed at the other end.

Transistors RNYAB0, NYAB0–NYAB63, RNYAB1 and transistors NYCB0–NYCB63 are arranged in left-to-right order in source line decoders ASLDEC-LU and ASLDC-RD, and in right-to-left order in source line decoders ASLDEC-RU and ASLDC-LD, matching the arrangement of the source lines RSL0, SL0–SL63, RSL1 in the corresponding memory cell arrays ACLA. The sector selection signals YAB0–YAB7, RYAB0, RYAB1, YCB0–YCB7 are supplied from the predecoder PDEC, or are generated in the source line decoder ASLDEC according to control signals supplied from the predecoder PDEC.

Redundancy Replacement in the First Embodiment

Figure 19:
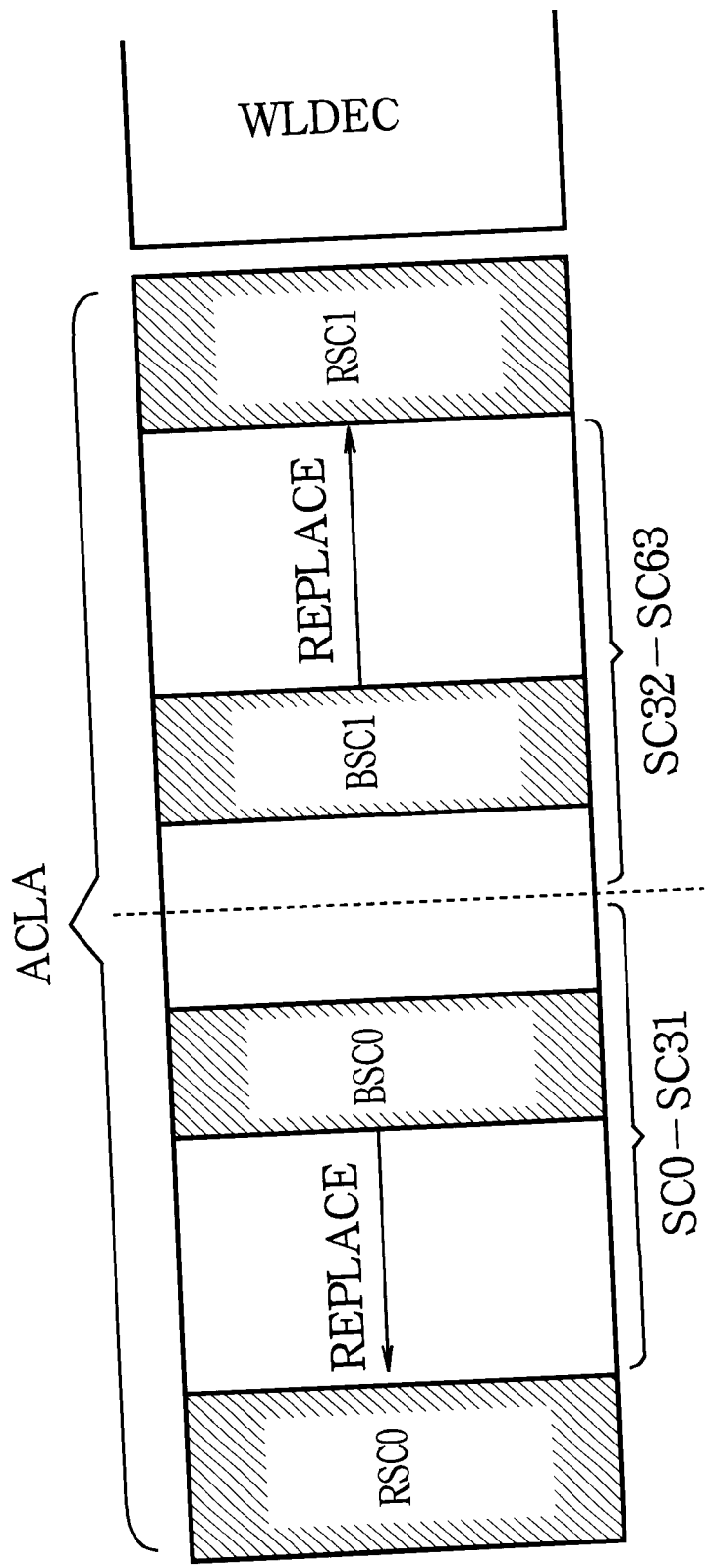
FIG. 19 illustrates redundancy replacement in the first embodiment.

Redundancy replacement in the first embodiment is illustrated in FIG. 19. This drawing shows a cell array ACLA having one bad sector BSC0 among the first thirty-two sectors SC0–SC31, and another bad sector BSC1 among the second thirty-two sectors SC32–SC63.

In the first embodiment, a bad sector BSC can be replaced by either of the two redundant sectors RSC0, RSC1 at the ends of the cell array. Basically, a bad sector is replaced by the closer of the two redundant sectors. Up to two bad sectors per cell array can be replaced in this way.

If, as in FIG. 19, there is at most one bad sector BSC0 among the sectors SC0–SC31 disposed between redundant sector RSC0 and the center of the cell array, and at most one bad sector BSC1 among the sectors SC32–SC63 disposed between the center of the cell array and redundant sector RSC1, then bad sector BSC0 is replaced by redundant sector RSC0, and bad sector BSC1 is replaced by redundant sector RSC1. If there were two bad sectors among sectors SC0–SC31 and no bad sectors among sectors SC32–SC63, or no bad sectors among sectors SC0–SC31 and two bad sectors among sectors SC32–SC63, then the bad sector closer to redundant sector RSC0 would be replaced by redundant sector RSC0, and the bad sector closer to redundant sector RSC1 would be replaced by redundant sector RSC1.

When the cell array in FIG. 19 is accessed, the sectors are accessed in their usual sequence, except that redundant sector RSC0 is accessed in place of bad sector BSC0, and redundant sector RSC1 in place of bad sector BSC1. FIG. 19 illustrates an upper cell array ACLA-LU or ACLA-RU, since redundant sector RSC1 is adjacent to the word line decoder WLDEC. In a lower cell array ACLA-LD or ACLA-RD, the word line decoder WLDEC would be disposed next to redundant sector RSC0.

In the first embodiment, since there is one redundant sector RSC at each end of the cell array, and since a single bad sector BSC occurring in a cell array is replaced by the closer of the two redundant sectors, the distance from the word line decoder WLDEC to the single bad sector BSC and the distance from the word line decoder WLDEC to the redundant sector RSC by which the bad sector is replaced do not differ greatly. The maximum possible difference is only half the length of the cell array, which is only half the maximum difference that can occur in the conventional redundant memory circuit having a redundant sector at only one end of the cell array UCLA. Accordingly, when a redundant memory cell is written or read, the maximum possible departure of the threshold value of the memory transistor from the desired value, due to the parasitic capacitance and resistance of the word line WL or the gate disturb effect, is less than in the conventional memory circuit. Redundancy replacement therefore does not cause such large disturbances to the threshold voltage deviation profile as can occur in the conventional redundant memory circuit, and noticeable degradation of the reproduced audio signal is reduced.

Furthermore, since the first embodiment provides two redundant sectors per cell array, it can repair a cell array having two bad sectors, which could not be repaired in the conventional memory circuit having only one redundant sector per cell array. As a result, the yield of the analog audio flash memory production process is improved. When a cell array with two bad sectors is repaired, although the difference between the distances of each bad sector and its replacement sector from the word line decoder WLDEC may exceed half the cell array length, the larger of the two differences is still, on average, less than the average difference when one bad sector in the conventional cell array UCLA is replaced. Accordingly, even when two bad sectors per cell array are replaced in the first embodiment, less degradation of the reproduced audio signal is expected than when one bad sector per cell array is replaced in the conventional memory circuit.

Figure 47:
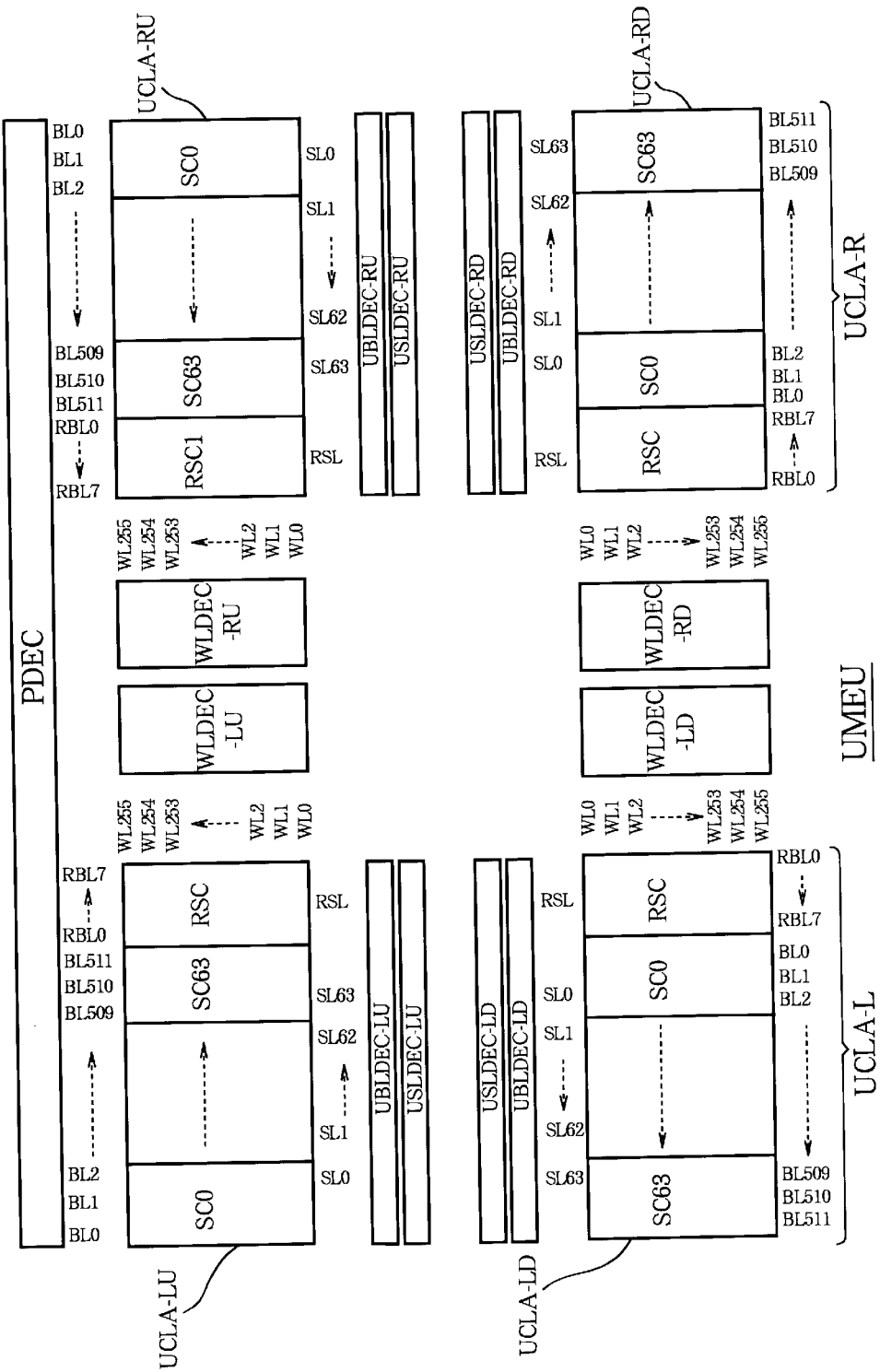
FIG. 47 illustrates the structure of a memory unit in the conventional redundant memory circuit in more detail.

Compared with the conventional memory circuit of FIG. 47, accordingly, the first embodiment improves both production yields and the average quality of the reproduced audio signal.

SECOND EMBODIMENT

Figure 20:
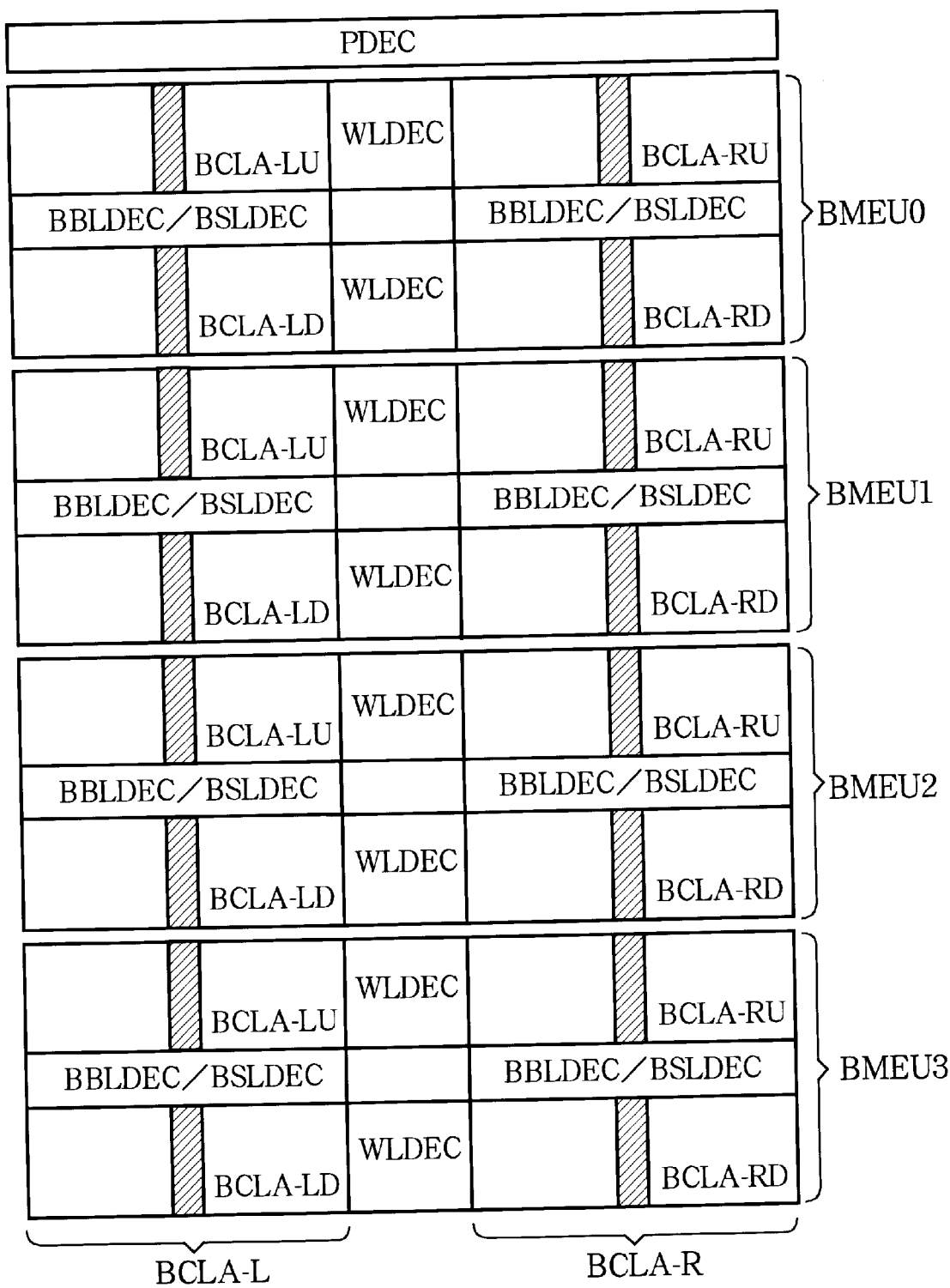
FIG. 20 illustrates the structure of a redundant memory circuit in an analog audio flash memory according to a second embodiment.

FIG. 20 shows the layout of the redundant memory circuit of an analog audio flash memory according to a second embodiment of the invention. Elements identical to corresponding elements in the non-redundant memory circuit in FIG. 2 are denoted by the same reference characters. The redundant memory circuit in FIG. 20 includes a predecoder PDEC and four memory units BMEU0, BMEU1, BMEU2, BMEU3, an arbitrary one of which will be denoted BMEU below.

Figure 21:
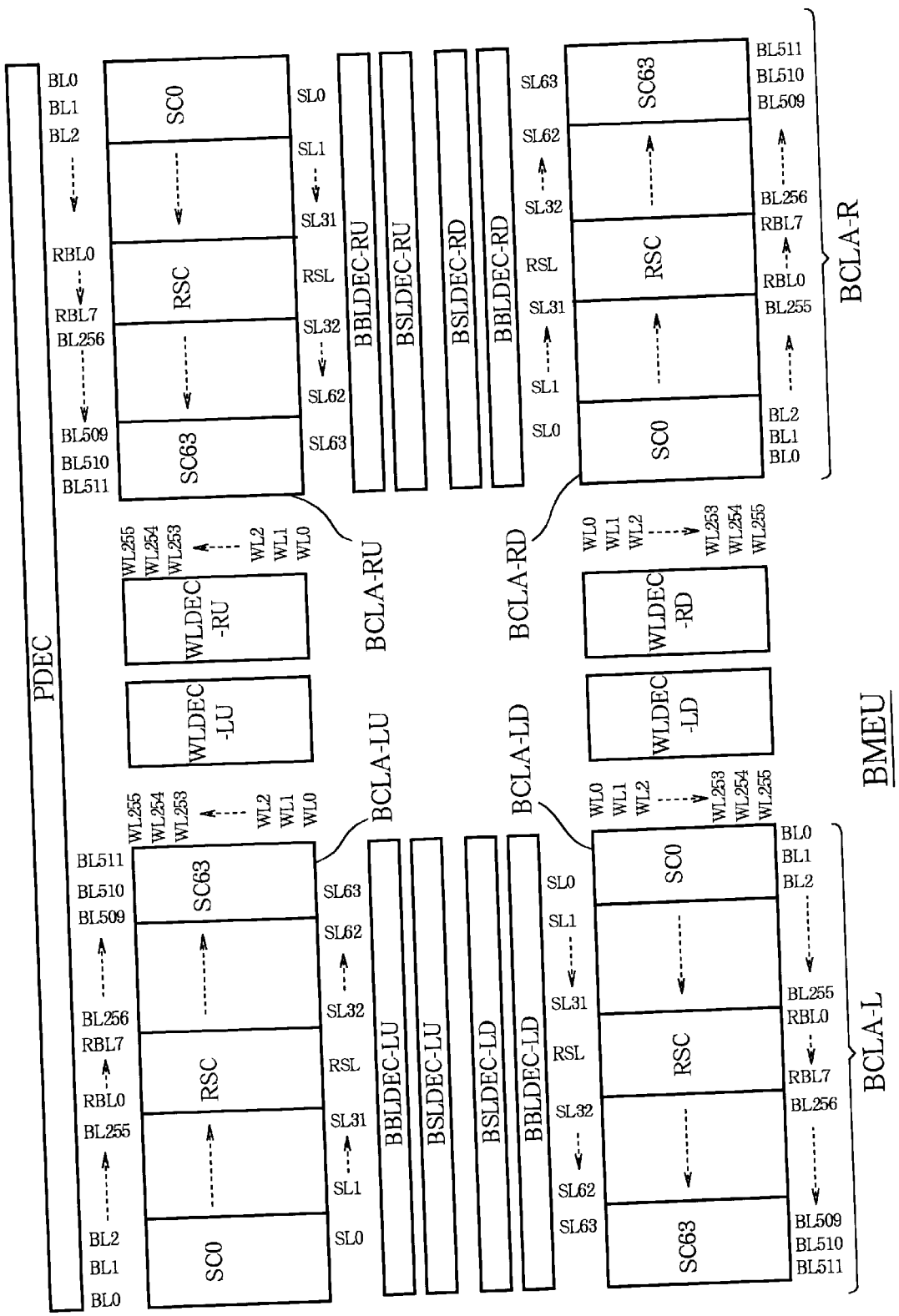
FIG. 21 illustrates the structure of a memory unit in the second embodiment in more detail.

FIG. 21 shows the layout of a memory unit BMEU in FIG. 20. The memory unit BMEU includes four cell arrays BCLA (BCLA-LU, BCLA-RU, BCLA-LD, BCLA-RD), four word line decoders WLDEC (WLDEC-LU, WLDEC-RU, WLDEC-LD, WLDEC-RD), four bit-line decoders BBLDEC (BBLDEC-LU, BBLDEC-RU, BBLDEC-LD, BBLDEC-RD), and four source line decoders BSLDEC (BSLDEC-LU, BSLDEC-RU, BSLDEC-LD, BSLDEC-RD).

The sixteen cell arrays BCLA constitute a memory cell section corresponding to the memory cell section 6 in FIGS. 1A and 1B. Each cell array BCLA has its own word line decoder WLDEC, bit line decoder BBLDEC, and source line decoder BSLDEC. The predecoder PDEC, sixteen word line decoders WLDEC, sixteen bit line decoders BBLDEC, and sixteen source line decoders BSLDEC constitute an address decoder corresponding to the address decoder 5 in FIGS. 1A and 1B.

Cell Array in the Second Embodiment

The memory cell array BCLA in the second embodiment is similar to the cell array UCLA of the conventional redundant memory circuit, shown in FIG. 47, except that the redundant sector RSC-is disposed in the center of the cell array. In FIG. 21, the redundant sector RSC is disposed between sectors SC31 and SC32. Corresponding to this sector arrangement (SC0–SC31, RSC, SC32–SC63), the redundant bit lines RBL0–RBL7 are disposed between bit lines BL255 and BL256, and the redundant source line RSL is disposed between source lines SL31 and SL32.

Bit Line Decoder in the Second Embodiment

Figure 22:
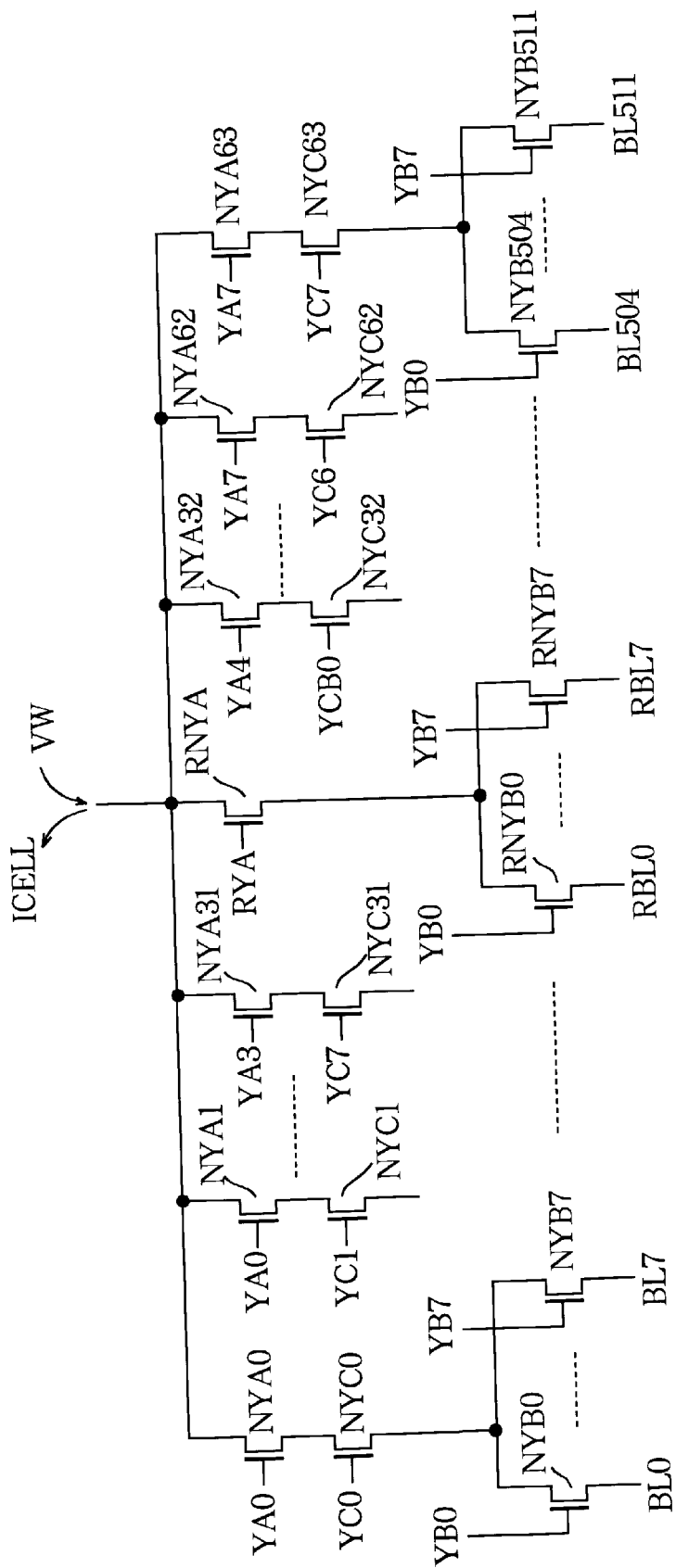
FIG. 22 shows an example of the circuit structure of the bit line decoders in FIG. 21.

FIG. 22 shows an example of the circuit layout of the bit line decoder BBLDEC. Elements identical to corresponding elements in FIGS. 7 and 49 are denoted by the same reference characters. The bit line decoder BBLDEC in FIG. 22 is similar to the conventional bit line decoder UBLDEC in FIG. 49, except that the NMOS transistors RNYB0–RNYB7 and RNYA that select the redundant bit lines RBL0–RBL7 are centrally located, corresponding to the central position of the redundant sector RSC in the cell array BCLA. Specifically, transistors RNYB0–RNYB7 are disposed between the transistor NYB255 that selects bit line BL255 and the transistor NYB256 that selects bit line BL256, and transistor RNYA is disposed between the transistors NYA31, NYC31 that select sector SC31 and the transistors NYA32, NYC32 that select sector SC32.

Transistors NYAB0–NYAB31, RNYAB, NYAB32–NYAB63 and transistors NYCB0–NYCB63 are arranged in left-to-right order in source line decoders BSLDEC-LU and BSLDEC-RD, and in right-to-left order in bit line decoders BSLDEC-RU and BSLDEC-LD, matching the arrangement of the source lines SL0–SL31, RSL, SL32–SL63 in the corresponding memory cell arrays BOLA. The sector selection signals YAB0–YAB7, RYAB, YCB0–YCB7 are supplied from the predecoder PDEC, or are generated in the bit line decoder BBLDEC according to control signals supplied from the predecoder PDEC.

Source Line Decoder in the Second Embodiment

Figure 23:
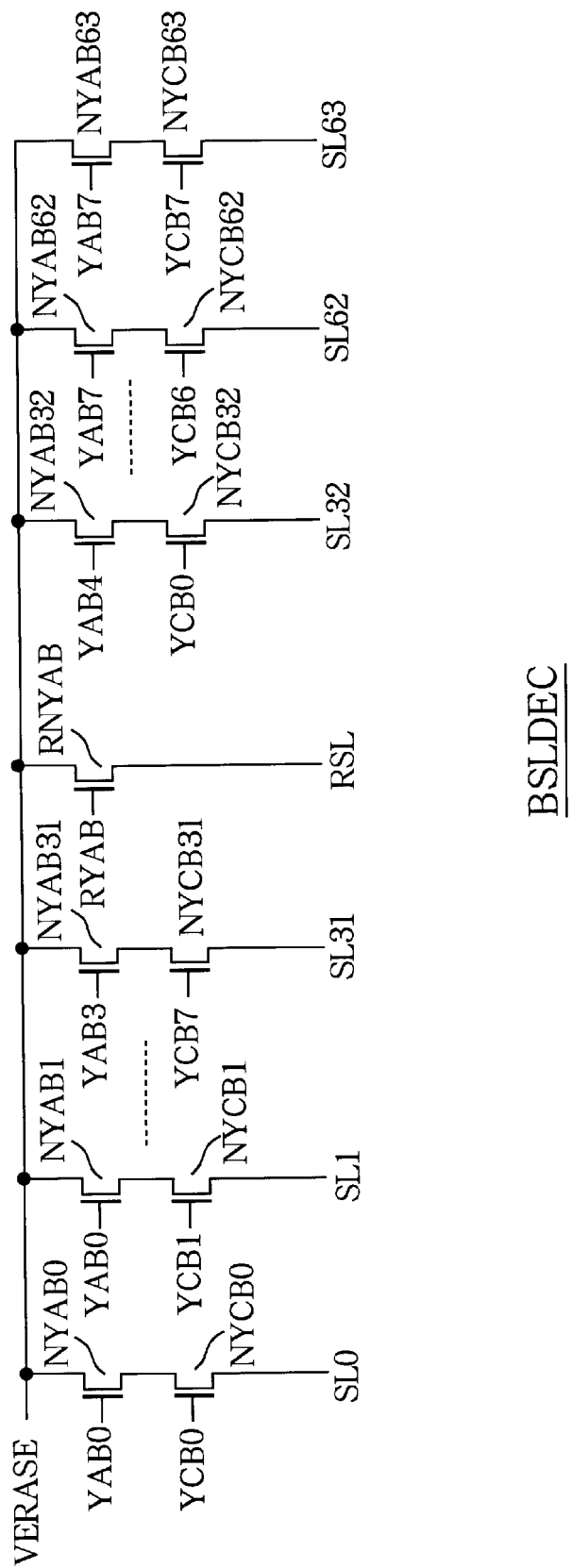
FIG. 23 shows an example of the circuit structure of the source line decoders in FIG. 21.

FIG. 23 shows an example of the circuit layout of the source line decoder BSLDEC. Elements identical to corresponding elements in FIGS. 8 and 50 have the same reference numerals. The source line decoder BSLDEC in FIG. 23 differs from the source line decoder USLDEC in FIG. 50 in that the NMOS transistor RNYAB that selects the redundant source line RSL is disposed in the center, corresponding to the central position of the redundant source line. Specifically, transistor RNYAB is disposed between the transistors NYAB31, NYCB31 that select source line SL31 and the transistors NYAB32, NYCB32 that select source line SL32.

Transistors NYAB0–NYAB31, RNYAB, NYAB32–NYAB63 and transistors NYAC0–NYAC63 are arranged in left-to-right order in source line decoders BSLDEC-LU and BSLDEC-RD, and in right-to-left order in bit line decoders BSLDEC-RU and BSLDEC-LD, matching the arrangement of the source lines SL0–SL31, RSL, SL32–SL63 in the corresponding memory cell arrays BCLA. The sector selection signals YAB0–YAB7, RYAB, YCB0–YCB7 are supplied from the predecoder PDEC, or are generated in the bit line decoder BBLDEC according to control signals supplied from the predecoder PDEC.

Redundancy Replacement in the Second Embodiment

Figure 24:
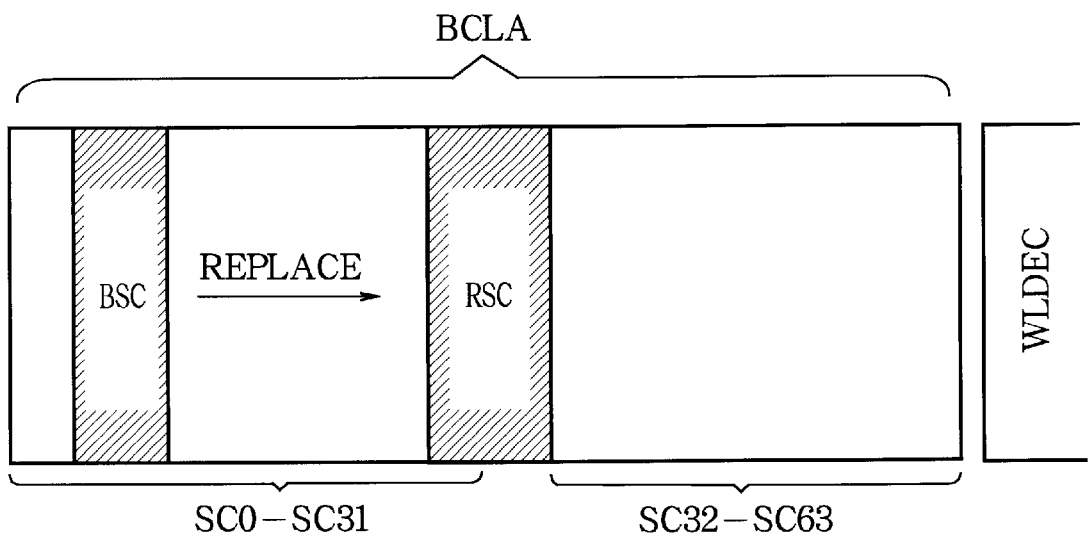
FIG. 24 illustrates redundancy replacement in the second embodiment.

Redundancy replacement in the second embodiment is illustrated in FIG. 24. This drawing shows a cell array BCLA having a single bad sector BSC among the sixty-four sectors SC0–SC63, located among the first thirty-two sectors SC0–SC31. The bad sector BSC is replaced by the redundant sector RSC located in the center of the cell array BCLA.

When the cell array in FIG. 24 is accessed, the sectors are accessed in their usual sequence, except that redundant sector RSC is accessed in place of the bad sector BSC. FIG. 24 illustrates an upper cell array BCLA-LU or BCLA-RU, but the same is true in a lower cell array BCLA-LD or BCLA-RD, in which the word line decoder WLDEC is disposed next to sector SC0.

In the second embodiment, since the redundant sector RSC is disposed in the center of the cell array, redundant replacement causes a change in distance from the word line decoder WLDEC equal to at most half the length of the cell array BCLA. The maximum change in this distance occurs when sector SC0 or SC63 is replaced. This is only half the maximum change that can occur in the conventional redundant memory circuit in which the redundant sector is disposed at one end of the cell array UCLA.

Accordingly, when a redundant memory cell is written or read, the maximum possible departure of the threshold value of the memory transistor from the desired value, due to the parasitic capacitance and resistance of the word line WL or the gate disturb effect, is less than in the conventional memory circuit. Redundancy replacement therefore does not cause such large disturbances to the threshold voltage deviation profile as can occur in the conventional redundant memory circuit, and noticeable degradation of the reproduced audio signal is reduced.

Compared with the first embodiment, the second embodiment provides substantially the same improvement in the quality of the reproduced audio signal in a smaller chip area, since there is only one redundant sector per cell array.

Figure 25:
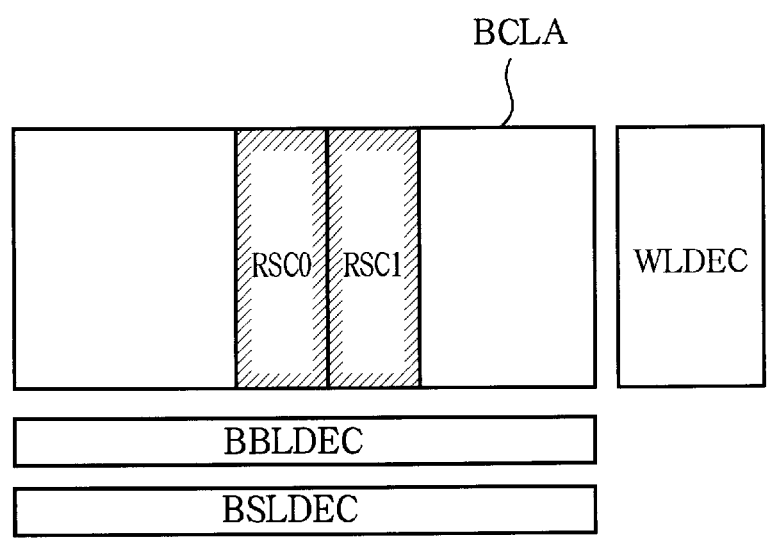
FIG. 25 illustrates a memory unit in a variation of the second embodiment.

FIG. 25 shows the layout of a memory unit in a variation of the second embodiment. In this variation, two redundant sectors RSC0, RSC1 are located in the center of the cell array BCLA. Two bad sectors per cell array can be repaired by replacement with redundant sectors, providing the same improvement in production yield as in the first embodiment. Moreover, even when the two bad sectors occur on the same side of the cell array, the maximum change in distance from the word line decoder WLDEC occasioned by the redundancy replacement is still only half the length of the cell array, so the quality of the reproduced audio signal is improved even more than in the first embodiment.

THIRD EMBODIMENT

Figure 26:
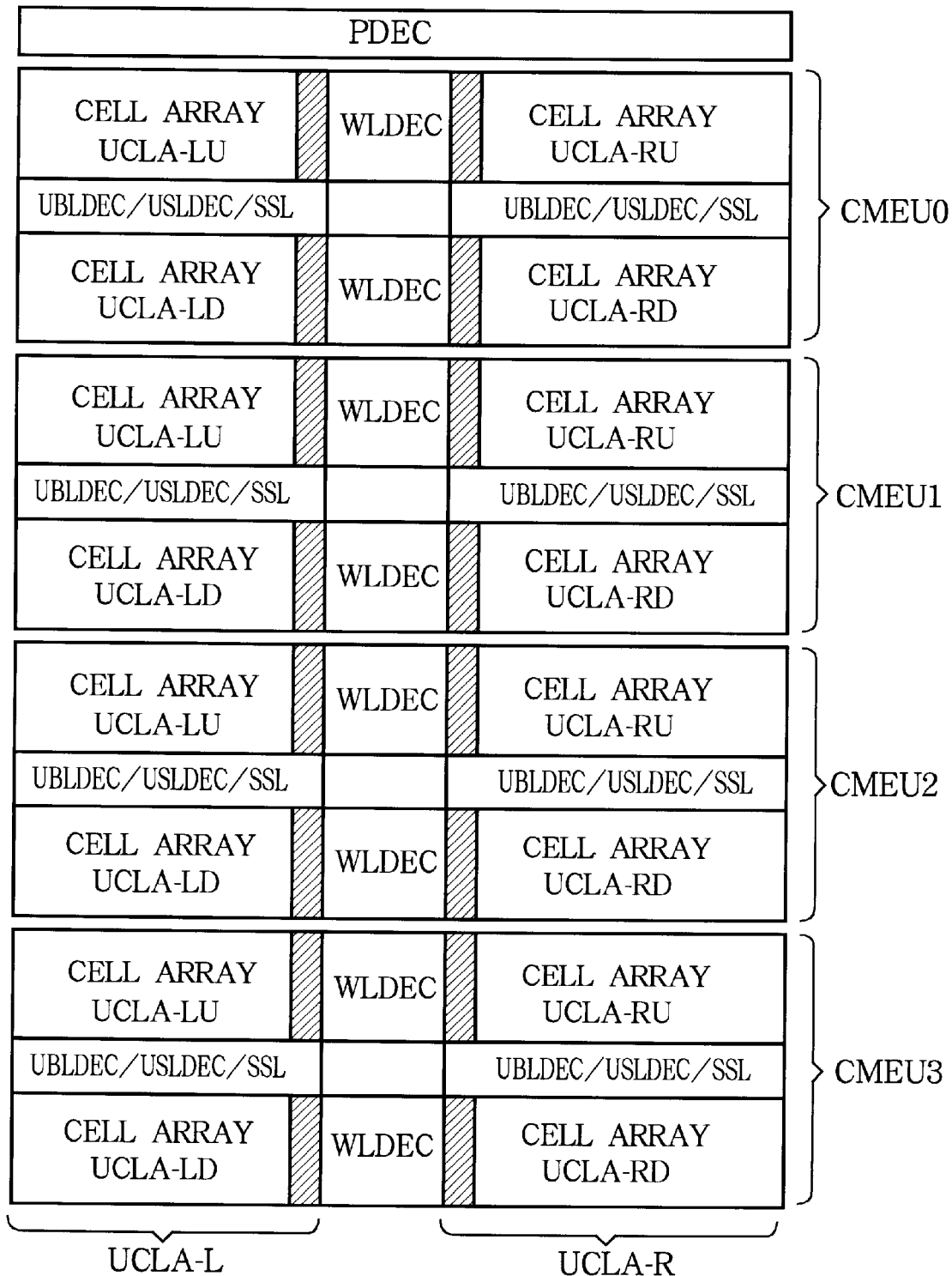
FIG. 26 illustrates the structure of a redundant memory circuit in an analog audio flash memory according to a third embodiment.
Figure 46:
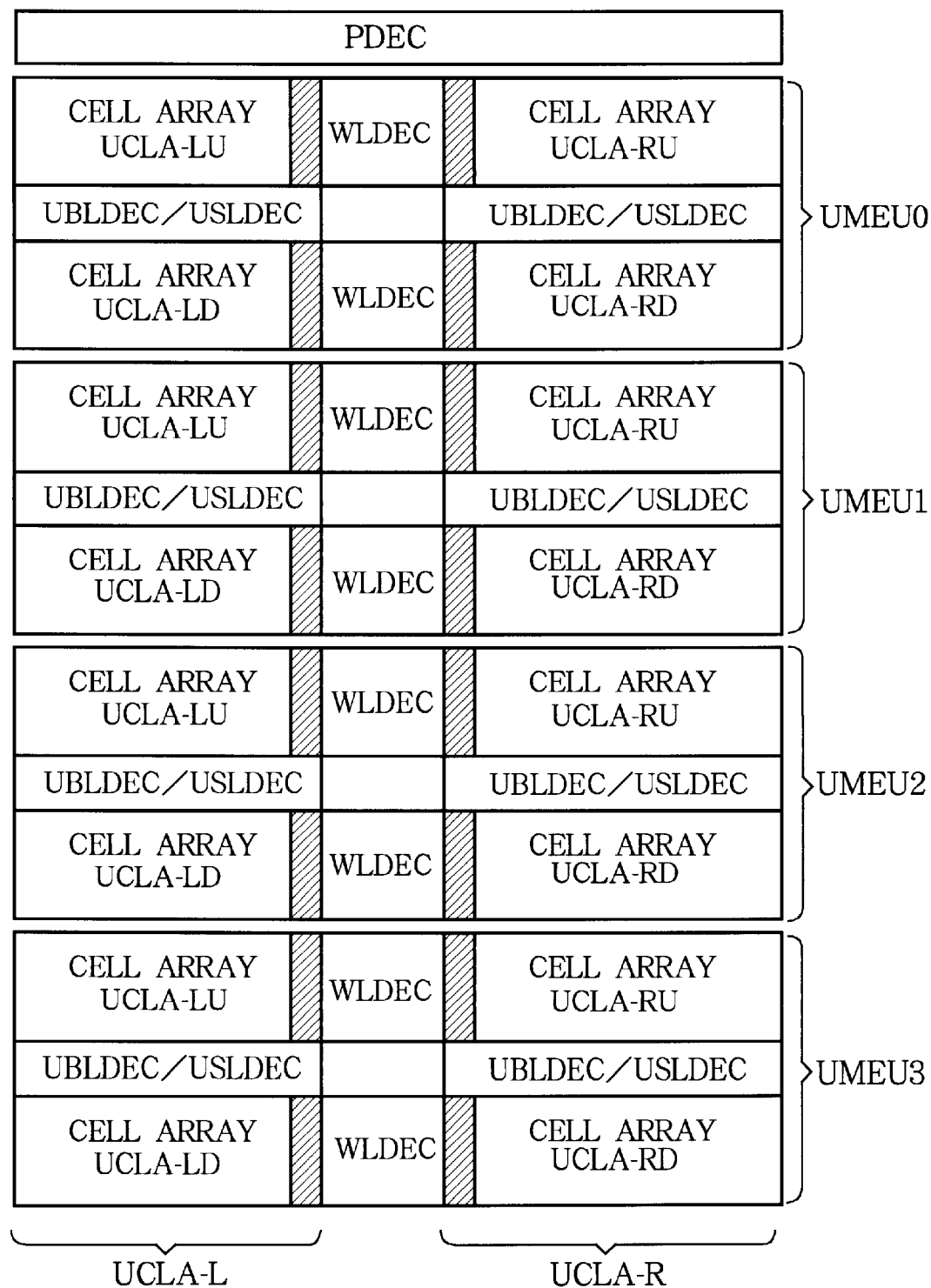
FIG. 46 illustrates the structure of a conventional redundant memory circuit in an analog audio flash memory.

FIG. 26 shows the layout of the redundant memory circuit of an analog audio flash memory according to a third embodiment of the invention. Elements identical to corresponding elements in the conventional redundant memory circuit in FIG. 46 are denoted by the same reference characters. The redundant memory circuit in FIG. 26 includes a predecoder PDEC and four memory units CMEU0, CMEU1, CMEU2, CMEU3, an arbitrary one of which will be denoted CMEU below. These memory units add a sector selection circuit SSL to the conventional memory units shown in FIG. 46.

Figure 27:
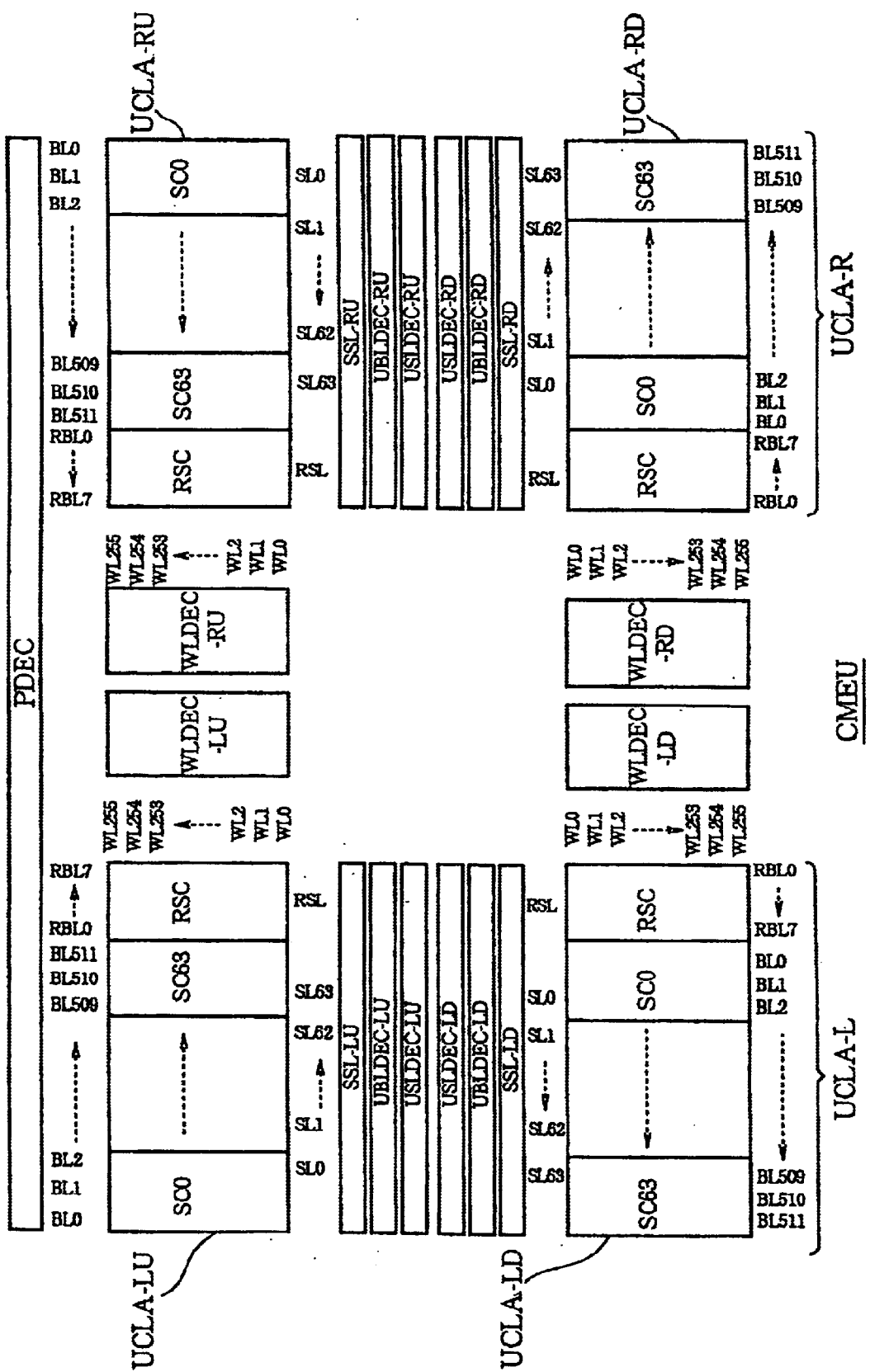
FIG. 27 illustrates the structure of a memory unit in the third embodiment in more detail.

FIG. 27 shows the layout of a memory unit CMEU in FIG. 26, using the same reference characters for elements identical to corresponding elements in FIG. 47. The memory unit CMEU includes four cell arrays UCLA-LU, UCLA-RU, UCLA-LD, UCLA-RD (an arbitrary one of which will be denoted UCLA), four word line decoders WLDEC (WLDEC-LU, WLDEC-RU, WLDEC-LD, WLDEC-RD), four bit-line decoders UBLDEC (UBLDEC-LU, UBLDEC-RU, UBLDEC-LD, UBLDEC-RD), four source line decoders USLDEC (USLDEC-LU, USLDEC-RU, USLDEC-LD, USLDEC-RD), and four sector selection circuits SSL (SSL-LU, SSL-RU, SSL-LD, SSL-RD).

Memory Unit in the Third Embodiment

The memory units CMEU in the third embodiment add sector selection circuits SSL (SSL-LU, SSL-RU, SSL-LD, SSL-RD) to the conventional memory units UMEU shown in FIG. 47. Each cell array UCLA has its own word line decoder WLDEC, bit line decoder UBLDEC, source line decoder USLDEC, and sector selection circuit SSL.

Sector Selection Circuit

The sector selection circuit SSL receives sector selection signals from the predecoder PDEC. The received sector selection signals do not include redundancy logic. The sector selection circuit SSL converts them to sector selection signals including redundancy logic: more specifically, to signals that select the sectors SC0–SC63 and redundant sector RSC in sequence from the first end of the cell array UCLA (the end near the word line decoder WLDEC) to the second end of the cell array UCLA (the end far from the word line decoder WLDEC), or from the second end to the first end, excluding a bad sector if one is present, and excluding the redundant sector if no bad sector is present. These signals are supplied to the bit line decoder UBLDEC and source line decoder USLDEC, which convert them to the sector selection signals and redundant sector selection signals shown in FIGS. 49 and 50 (YA0–YA7, RYA, YC0–YC7, YAB0–YAB7, YCB0–YCB7, RYAB).

Access Procedure in the Third embodiment

Figure 28:
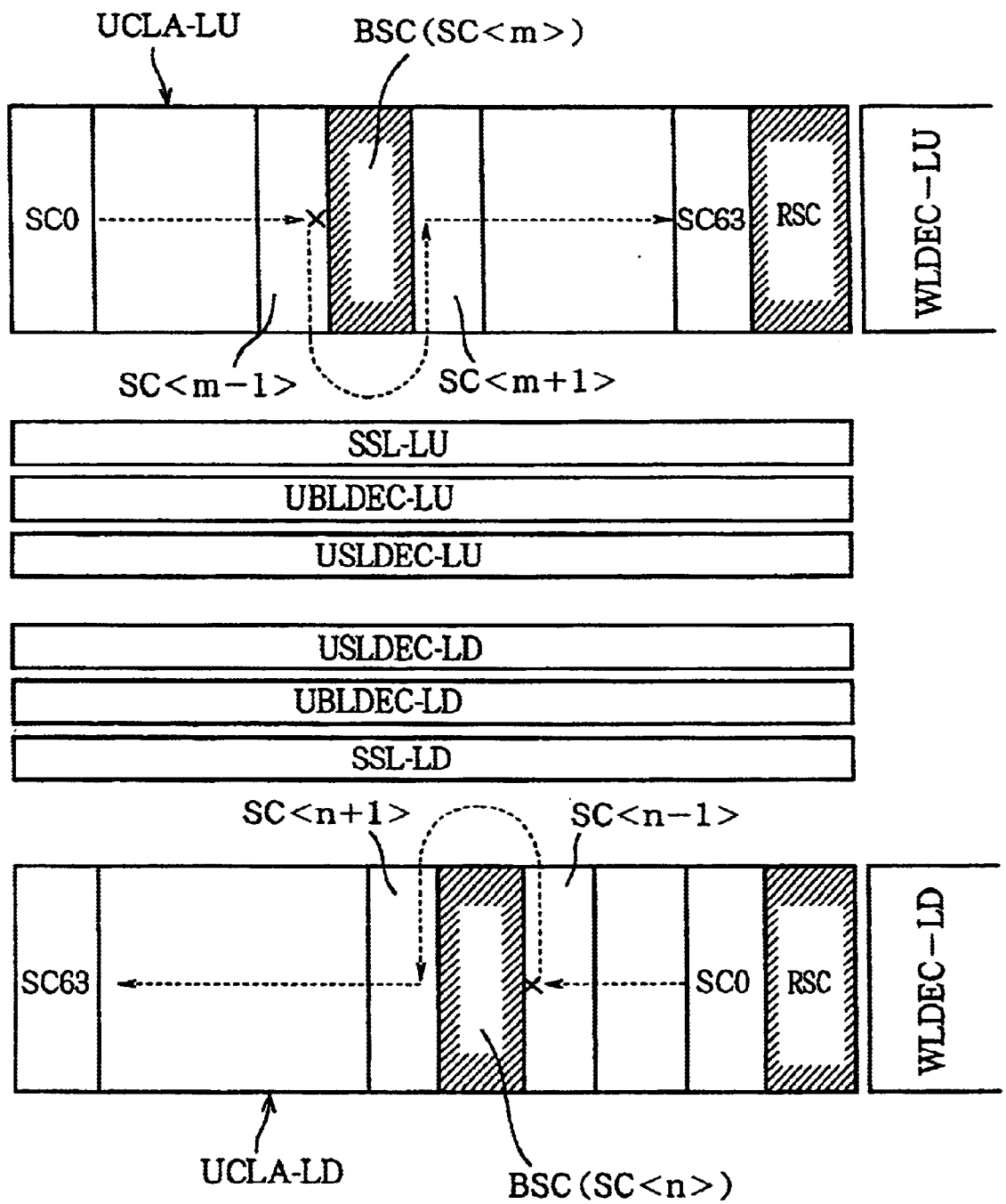
FIG. 28 illustrates redundancy replacement in the third embodiment.

FIG. 28 illustrates the access sequence of the sectors SC and redundant sector RSC when redundancy replacement is performed in the third embodiment. It is assumed that sector SC<m> in cell array UCLA-LU and sector SC<n> in cell array UCLA-LD are bad sectors (where m and n are arbitrary integers from 0 to 63). The bad sectors are also denoted BSC. The addresses of these bad sectors SC<m> and SC<n> are stored in a non-volatile memory in the address decoder, and are read into the predecoder PDEC when the audio flash memory is initialized at, for example, power-up. When cell array UCLA-LU is accessed, the predecoder PDEC supplies sector selection circuit SSL-LU with sector selection control signals generated according to the address of sector SC<m>; when cell array UCLA-LD is accessed, the predecoder PDEC supplies sector selection circuit SSL-LD with sector selection control signals generated according to the address of sector SC<n>.

Operating according to the supplied sector selection control signals, sector selection circuit SSL-LU supplies sector selection signals including redundancy logic to bit line decoder UBLDEC-LU and source line decoder USLDEC-LU, and sector selection circuit SSL-LD supplies sector selection signals including redundancy logic to bit line decoder UBLDEC-LD and source line decoder USLDEC-LD. As a result, in cell array UCLA-LU, sectors SC0 to SC<m−1> are accessed, followed by sectors SC<m+1> to SC63, then redundant sector RSC; in cell array UCLA-LD, the redundant sector RSC is accessed, followed by sectors SC0 to SC<n−1>, then sectors SC<n+1> to SC63.

In FIG. 28, first sector SC0 in cell array UCLA-LU is accessed; next, sector SC0 in cell array UCLA-RU is accessed. Sectors SC1 to SC<m−1> in cell arrays UCLA-LU and UCLA-RU are then accessed in like manner, one by one, alternating between the two cell arrays. After sector SC<m−1> in cell array UCLA-RU has been accessed, the bad sector SC<m> in cell array UCLA-LU is skipped, and sector SC<m+1> in cell array UCLA-LU is accessed next, followed by sector SC<m> in cell array UCLA-RU. Sectors SC<m+2> to SC63 in cell array UCLA-LU and sectors SC<m+1> to SC62 in cell array UCLA-RU are then accessed one by one, alternately as above. After sector SC62 in cell array UCLA-RU has been accessed, the redundant sector RSC in cell array UCLA-LU is accessed, followed by sector SC63 in cell array UCLA-RU. This completes the access to cell arrays UCLA-LU and UCLA-RU.

When the access to cell arrays UCLA-LU and UCLA-RU has been completed, next the redundant sector RSC in cell array UCLA-LD is accessed, followed by sector SC0 in cell array UCLA-RD. Sectors SC0 to SC<n−1> in cell array UCLA-LD and sectors SC1 to SC<n> in cell array UCLA-RD are then accessed alternately, one by one. After sector SC<n> in cell array UCLA-RD has been accessed, the bad sector SC<n> in cell array UCLA-LD is skipped and sector SC<n+1> in cell array UCLA-LD is accessed next, followed by sector SC<n+1> in cell array UCLA-RD. Sectors SC<n+2> to SC63 in cell arrays UCLA-LD and UCLA-RD are then accessed one by one, alternately. This completes the access to cell arrays UCLA-LD and UCLA-RD.

In the third embodiment, accordingly, in the upper cell arrays UCLA-LU and UCLA-RU, access proceeds in order from the second end of the array (distant from the word line decoder WLDEC) toward the first end (near the word line decoder WLDEC), thus from sector SC0 toward the redundant sector RSC, skipping over a bad sector BSC if one is present. In the lower cell arrays UCLA-LD, UCLA-RD, access proceeds in order from the first end toward the second end, thus from sector SC0 or the redundant sector RSC toward sector SC63, again skipping over a bad sector BSC if one is present.

In the conventional redundant memory circuit, when a bad sector BSC is replaced by a redundant sector RSC, the redundant sector RSC takes the place of the bad-sector BSC in the access sequence. In the third embodiment, when a bad sector BSC is replaced by a redundant sector RSC, the redundant sector RSC does not in general take the place of the bad sector BSC in the access sequence. In an upper cell array UCLA-LU or UCLA-RU, the place of a bad sector SC<m> is taken by the next sector SC<m+1>, the place of each sector from SC<m+1> to SC62 is taken by the next sector after it (a sector from SC<m+2> to SC63), and the redundant sector RSC takes the place of sector SC63. In a lower cell array UCLA-LD or UCLA-RD, the redundant sector RSC takes the place of sector SC0, which takes the place of sector SC1, and so on up to the sector SC<n−1> preceding the bad sector SC<n>. After sector SC<n−1> takes the place of the bad sector SC<n>, the remaining sectors SC<n+1> to SC63 are accessed in the normal sequence.

Since the redundant sector in the third embodiment always takes the place of an adjacent sector in the access sequence, the threshold voltage deviation profile of the cell array UCLA is scarcely disturbed at all by the replacement of a bad sector. Redundancy replacement thus causes substantially no degradation in the quality of the reproduced audio signal.

Example of the Structure of the Sector Selection Circuit

Figure 29:
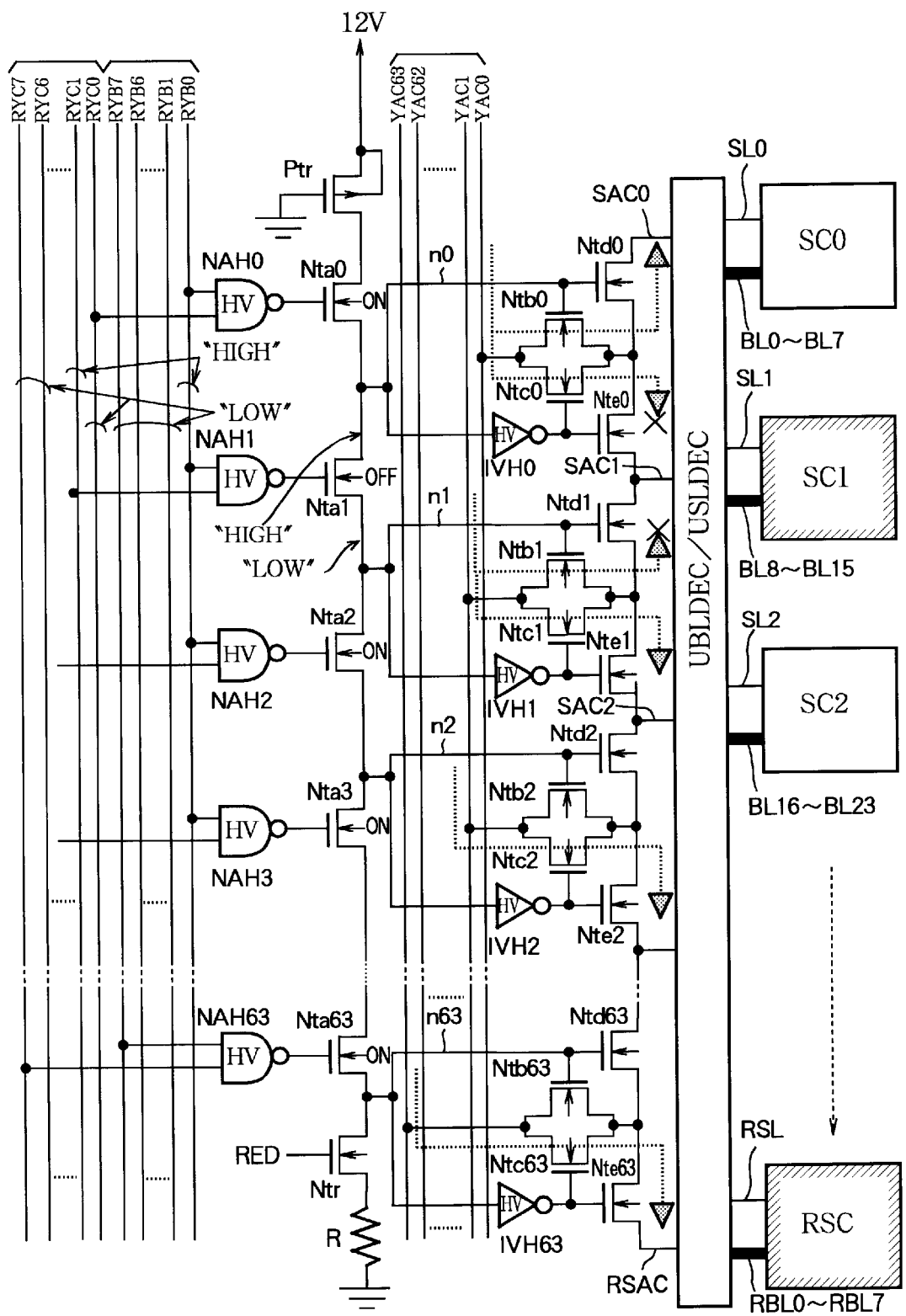
FIG. 29 shows an example of the circuit structure of the upper sector selection circuits in FIG. 27.

FIG. 29 shows an example of the circuit configuration of an upper sector selection circuit SSL-U (SSL-LU or SSL-RU). The sector selection circuit SSL-U comprises NAND gates NAH0, NAH1, NAH2, NAH3, . . . , NAH63, a PMOS transistor Ptr, an NMOS transistor Ntr, a resistor R, NMOS transistors Nta0, Nta1, . . . , Nta63, NMOS transistors Ntb0, Ntb1, . . . , Ntb63, NMOS transistors Ntc0, Ntc1, . . . , Ntc63, NMOS transistors Ntd0, Ntd1, . . . , Ntd63, NMOS transistors Nte0, Nte1, . . . , Nte63, and inverters IVH0, IVH1, . . . , IVH63. The NAND gates NAH0–NAH63 and inverters IVH0–IVH63 are powered from a boosted power supply (for example, 12 V), as indicated by the letters HV (High Voltage) in the drawing.

The first input terminals of NAND gates NAH0–NAH7 receive a sector selection control signal RYB0. Similarly, the first input terminals of NAND gates NAH8–NAH15, NAH16–NAH23, . . . , NAH56–NAH63 receive respective sector selection control signals RYB1, RYB2, . . . , RYB7. The second input terminals of NAND gates NAH0, NAH1, ..., NAH7 receive sector selection signals RYC0, RCY1, ..., RCY7. The second input terminals of NAND gates NAH8, NAH9, ..., NAH63 also receive sector selection signals RYC0, RCY1, ..., RCY7, in the same repeated sequence.

The source electrode of transistor Ptr receives the boosted power supply. The gate electrode of transistor Ptr is grounded. The source electrode of transistor NMOS transistor Ntr is grounded through resistor R; the gate electrode of transistor NMOS transistor NTr receives a control signal RED from the predecoder PDEC. Transistors Nta0 to Nta63 are coupled in series between the drain electrodes of transistors Ptr and NMOS transistor NTr. The gate electrode of each transistor Nta<k> (where k is an integer from 0 to 63) receives the output signal of NAND gate NAH<k>. The source electrode of transistor Nta<k> is coupled to a node n<k>.

Transistors Ntb<k>, Ntc<k>, Ntd<k>, Nte<k>, and inverter IVH<k> constitute a type of transmission gate. The gate electrodes of transistors Ntb<k> and Ntd<k> and the input terminal of inverter IVH<k> are connected to node n<k>. The gate electrodes of transistors Ntc<k> and Nte<k> are coupled to the output terminal of inverter IVH<k>. The drain electrodes of transistors Ntb<k> and Ntc<k> receive from the predecoder PDEC a sector selection signal YAC<k> that does not include redundancy logic. The source electrodes of transistors Ntb<k>, Ntc<k>, and Nte<k> and the drain electrode of transistor Ntd<k> are mutually interconnected.

The source electrode of transistor Ntd0 is coupled to an input terminal that supplies a sector selection signal SAC0 to the bit line decoder UBLDEC and source line decoder USLDEC. The source electrodes of transistors Ntd1, Ntd2, ..., Ntd63 and the drain electrodes of transistors Ntd0, Ntd1, ..., Ntd62 are connected to input terminals that supply sector selection signals SAC1 to SAC63 to the bit line decoder UBLDEC and source line decoder USLDEC. The drain electrode of transistor Ntd63 is connected to an input terminal that supplies a redundant sector selection signal RSAC to the bit line decoder UBLDEC and source line decoder USLDEC.

The sector selection circuit SSL-U in FIG. 29 operates as follows. During operation, control signal RED is held at the high logic level, turning on transistor NTr so that current can flow through resistor R, which has a resistance well above the series resistance of transistors Ptr, Nta0–Nta63, and Ntr in the on-state.

If no redundancy replacement has been performed, sector selection control signals RYB0–RYB7 and RYC0–RYC7 are all held at the low logic level. The output signals of NAND gates NAH0–NAH63 are therefore all high, and transistors Nta0–Nta63 are all turned on. Nodes n0–n63 are all at the high logic level, transistors Ntb0–Ntb63 and Ntd0–Ntd63 are all switched on, and transistors Ntc0–Ntc63 and Nte0–Nte63 are all switched off.

Each sector selection signal YAC<k> is therefore conducted through transistors Ntb<k> and Ntd<k> and input to the bit line decoder UBLDEC and source line decoder USLDEC as sector selection signal SAC<k>. Sector selection signals YAC0, YAC1, ..., YAC63 are driven high sequentially, one at a time; sector selection signals SAC0, SAC1, ..., SAC63 also go high sequentially, one at a time. The redundant sector selection signal RSAC does not go high, because transistor Nte63 is switched off. The bit line decoder UBLDEC and source line decoder USLDEC therefore select sectors SC0, SC1, ..., SC63 in sequence, without selecting the redundant sector RSC.

To write or read data, the bit line decoder UBLDEC generates sector selection signals YA0–YA7 and YC0–YC7 (shown in FIG. 49) according to sector selection signals SAC0–SAC63, and generates the redundant sector selection signal RYA according to redundant sector selection signal RSAC. For example, when sector selection signal SAC0 is high, sector selection signals YA0 and YC0 are driven high, selecting bit lines BL0–BL7; when sector selection signal SAC1 is high, sector selection signals YA0 and YC1 are driven high, selecting bit lines BL8–BL15; if the redundant sector selection signal RSAC is high, redundant sector selection signal RYA is driven high, selecting the redundant bit lines RBL0–RBL7.

To erase data, the source line decoder USLDEC generates sector selection signals YAB0–YAB7 and YCB0–YCB7 (shown in FIG. 50) according to sector selection signals SAC0–SAC63, and generates the redundant sector selection signal RYAB according to redundant sector selection signal RSAC. For example, when sector selection signal SAC0 is high, sector selection signals YAB0 and YCB0 are driven high, selecting source line SL0; when sector selection signal SAC1 is high, sector selection signals YAB0 and YCB1 are driven high, selecting source line SL1; if the redundant sector selection signal RSAC is high, redundant sector selection signal RYAB is driven high, selecting the redundant source line RSL.

If, for example, sector SC1 is a bad sector, sector selection control signals RYB0 and RYC1 in FIG. 29 are driven high while the other sector selection control signals (RYB1–RYB7, RYC0, RYC2–RYC7) are held low. The output signal of NAND gate NAH1 is therefore low, turning off transistor Nta1, while the output signals of the other NAND gates NAH0 and NAH2–NAH63 are high, turning on transistors Nta0 and Nta2–Nta63. As a result, node n0 is at the high logic level, while nodes n1–n63 are at the low logic level; transistors Ntb0 and Ntd0 are switched on; transistors Ntb1–Ntb63 and Ntd1–Ntd63 are switched off; transistors Ntc0 and Nte0 are switched off; transistors Ntc1–Ntc63 and Nte1-Nte63 are switched on.

Sector selection signal YAC0 is therefore conducted to the bit line decoder UBLDEC and source line decoder USLDEC as sector selection signal SAC0, while sector selection signals YAC1, YAC2, ..., YAC62 are conducted to the bit line decoder UBLDEC and source line decoder USLDEC as sector selection signals SAC2, SAC3, ..., SAC63, and sector selection signal YAC63 is conducted to the bit line decoder UBLDEC and source line decoder USLDEC as redundant sector selection signal RSAC. Sector selection signals SAC0, SAC2–SAC63, and redundant sector selection signal RSAC therefore go high sequentially, one by one. Sector selection signal SAC1 does not go high, because transistors Nte0 and Ntd1 are both off. The bit line decoder UBLDEC and source line decoder USLDEC thus select sectors SC0, SC2–SC63, and the redundant sector RSC sequentially, skipping the bad sector SC1. Sectors SC2, ..., SC63 and the redundant sector RSC replace sectors SC1 (the bad sector) and SC2, ..., SC63, respectively, in the access sequence.

Figure 30:
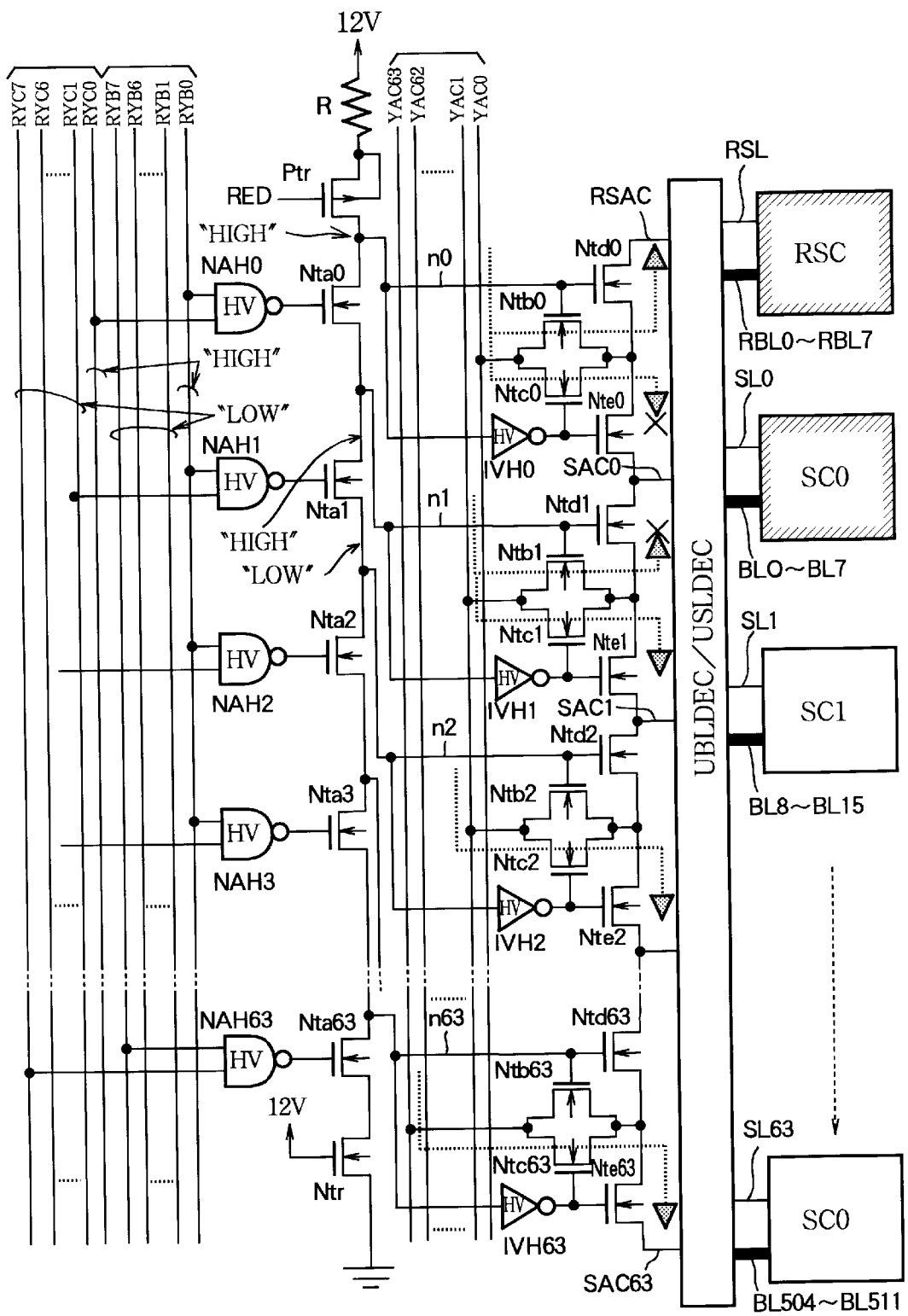
FIG. 30 shows an example of the circuit structure of the lower sector selection circuits in FIG. 27.

FIG. 30 shows an example of the circuit configuration of a lower sector selection circuit SSL-D (SSL-LD or SSL-RD). The sector selection circuit SSL-D in FIG. 30 is ±2, obtained by a slight modification of the upper sector selection circuit SSL-U in FIG. 29. The sector selection circuit SSL-D in FIG. 30 comprises NAND gates NAH0, NAH1, NAH63, a resistor R, a PMOS transistor Ptr, an NMOS transistor Ntr, NMOS transistors Nta0, Nta1, ..., Nta63, NMOS transistors Ntb0, Ntb1, ..., Ntb63, NMOS transistors Ntc0, Ntc1, . . . , Ntc63, NMOS transistors Ntd0, Ntd1, . . . , Ntd63, NMOS transistors Nte0, Nte1, . . . , Nte63, and inverters IVH0, IVH1, . . . , IVH63. The NAND gates NAH0–NAH63 and P inverters IVH0–IVH63 are powered from a boosted power supply (for example, 12 V).

The first input terminals of NAND gates NAH0–NAH7 receive a sector selection control signal RYB0. Similarly, the first input terminals of NAND gates NAH8–NAH15, NAH16–NAH23, . . . , NAH56–NAH63 receive respective sector selection control signals RYB1, RYB2, . . . , RYB7. The second input terminals of NAND gates NAH0, NAH1, . . . , NAH7 receive sector selection signals RYC0, RYC1, . . . , RYC7. The second input terminals of NAND gates NAH8, NAH9, . . . , NAH63 also receive these sector selection signals RYC0, RYC1, . . . , RYC7.

The differences between the lower sector selection circuit SSL-D in FIG. 30 and the upper sector selection circuit SSL are as follows. In the lower sector selection circuit SSL in FIG. 30, the source electrode of transistor NTr is grounded and the gate electrode of transistor NTr receives the boosted power supply. The source electrode of transistor Ptr is coupled through resistor R to the power supply, and the gate electrode of transistor Ptr receives control signal RED from the predecoder PDEC. Node n<k> is connected to the drain electrode of transistor Nta<k> (k=0, 1, . . . , 63). The source electrode of transistor Ntd0 is connected to the RSAC input terminal of the bit line decoder UBLDEC and source line decoder USLDEC. The source electrodes of transistors Ntd1, Ntd2, . . . , Ntd63 and the drain electrodes of transistors Ntd0, Ntd1, . . . , Ntd62 are connected to input terminals that supply sector selection signals SAC0 to SAC62 to the bit line decoder UBLDEC and source line decoder USLDEC. The drain electrode of transistor Ntd63 is connected to the SAC63 input terminal of the bit line decoder UBLDEC and source line decoder USLDEC.

The sector selection circuit SSL-D in FIG. 30 operates as follows. During operation, control signal RED is held at the low logic level, turning on transistor Ptr so that current can flow through resistor R, which has a resistance well above the series resistance of transistors Ptr, Nta0–Nta63, and Ntr in the on-state.

If no redundancy replacement has been performed, sector selection control signals RYB0–RYB7 and RYC0–RYC7 are all held at the low logic level. The output signals of NAND gates NAH0–NAH63 are therefore all high, and transistors Nta0–Nta63 are all turned on. Nodes n0–n63 are therefore all at the low logic level, transistors Ntb0–Ntb63 and Ntd0–Ntd63 are all switched off, and transistors Ntc0–Ntc63 and Nte0–Nte63 are all switched on.

Each sector selection signal YAC<k> is therefore conducted through transistors Ntc<k> and Nte<k> and input to the bit line decoder UBLDEC and source line decoder USLDEC as sector selection signal SAC<k>. Sector selection signals YAC0, YAC1, . . . , YAC63 are driven high sequentially, one at a time, so sector selection signals SAC0, SAC1, . . . , SAC63 also go high sequentially, one at a time. The redundant sector selection signal RSAC does not go high, because transistor Ntd0 is switched off. The bit line decoder UBLDEC and source line decoder USLDEC therefore select sectors SC0, SC1, . . . , SC63 in sequence, without selecting the redundant sector RSC.

If, for example, sector SC0 is a bad sector, sector selection control signals RYB0 and RYC0 in FIG. 30 are driven high while the other sector selection control signals (RYB1–RYB7, RYC1–RYC7) are held low. The output signal of NAND gate NAH0 is therefore low, turning off transistor Nta0, while the output signals of the other NAND gates NAH1–NAH63 are high, turning on transistors Nta1–Nta63. As a result, node n0 is at the high logic level, while nodes n1–n63 are at the low logic level; transistors Ntb0 and Ntd0 are switched on; transistors Ntb1–Ntb63 and Ntd1–Ntd63 are switched off; transistors Ntc0 and Nte0 are switched off; transistors Ntc1–Ntc63 and Nte1–Nte63 are switched on.

Sector selection signal YAC0 is therefore conducted to the bit line decoder UBLDEC and source line decoder USLDEC as the redundant sector selection signal RSAC, while sector selection signals YAC1, YAC2, . . . , YAC63 are conducted to the bit line decoder UBLDEC and source line decoder USLDEC as sector selection signals SAC1, SAC2, . . . , SAC63. Redundant sector selection signal RSAC and sector selection signals SAC1–SAC63 go high sequentially, one by one. Sector selection signal SAC0 does not go high, because transistors Nte0 and Ntd1 are both off. The bit line decoder UBLDEC and source line decoder USLDEC thus select the redundant sector RSC and sectors SC1–SC63, skipping the bad sector SC0, which is replaced by the redundant sector RSC in the access sequence.

By providing a sector selection circuit SSL, when there is a bad sector, the third embodiment enables the redundant sector RSC and the good sectors among SC0–SC63 to be accessed in sequence from the first end of the cell array UCLA (the end near the word line decoder WLDEC) to the second end (the end distant from the word line decoder WLDEC), or in sequence from the second end to the first end. Degradation of the reproduced audio signal due to redundancy replacement is thereby virtually eliminated.

Figure 31A:
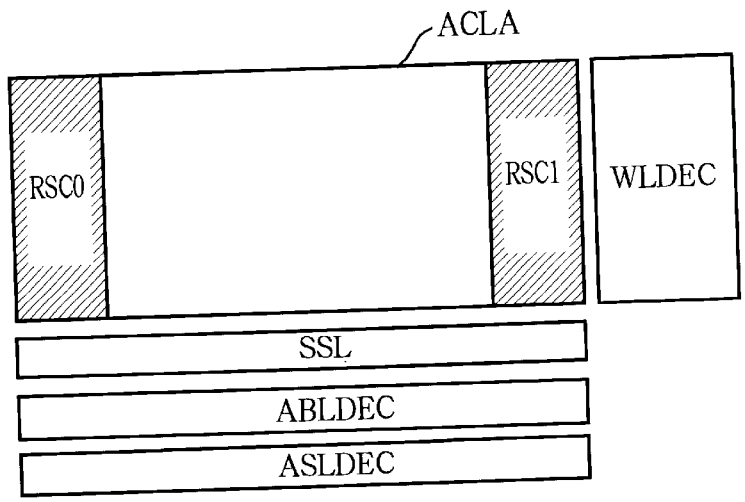
FIGS. 31A, 31B, and 31C illustrate memory units in variations of the third embodiment.
Figure 31B:
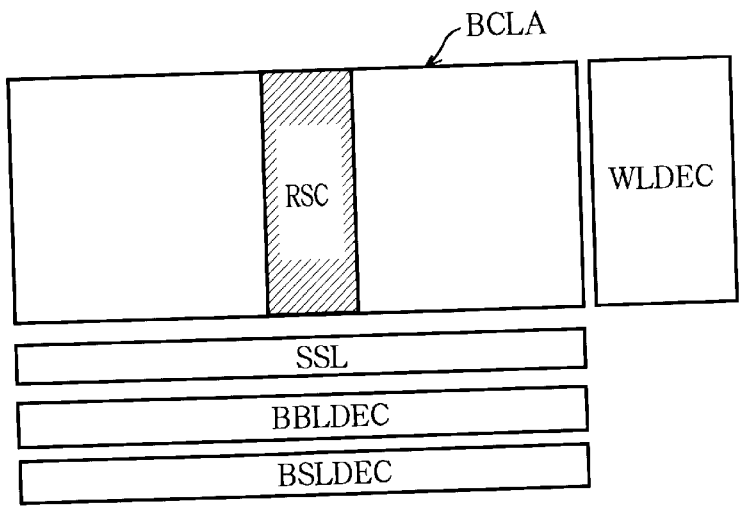
Figure 31C:
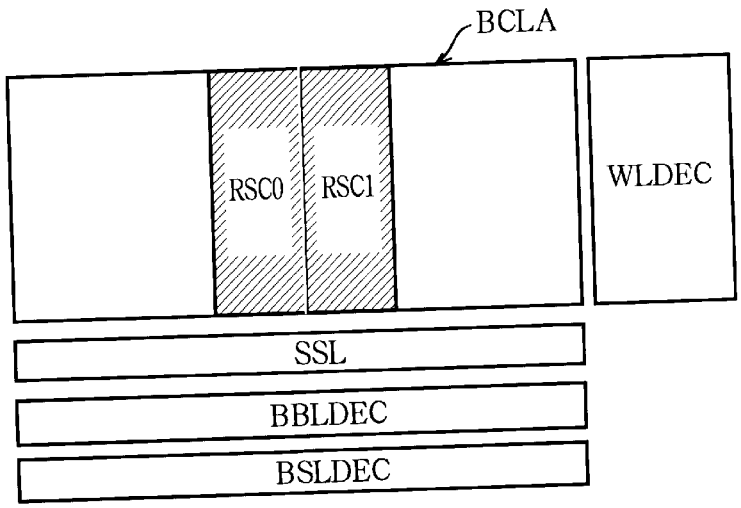

FIGS. 31A, 31B, and 31C show the layout of three variations of the memory unit of the third embodiment. The variation in FIG. 31A uses the cell array ACLA of the first embodiment, with redundant sectors RSC0 and RSC1 disposed at opposite ends. The variation in FIG. 31B uses the cell array BCLA of the second embodiment, with a single centrally located redundant sector RSC. The variation in FIG. 31C uses a variation of the cell array BCLA of the second embodiment having two centrally located redundant sectors RSC0, RSC1. The variations in FIGS. 31A and 31C enable the replacement of two bad sectors per cell array, improving the yield of the analog audio flash memory production process. In all of these variations, access proceeds in sequence from one end of the cell array to the other, skipping any bad sectors that have been replaced by redundant sectors and skipping any unused redundant sectors, so redundancy replacement causes substantially no degradation of the reproduced audio signal.

FOURTH EMBODIMENT

Figure 32:
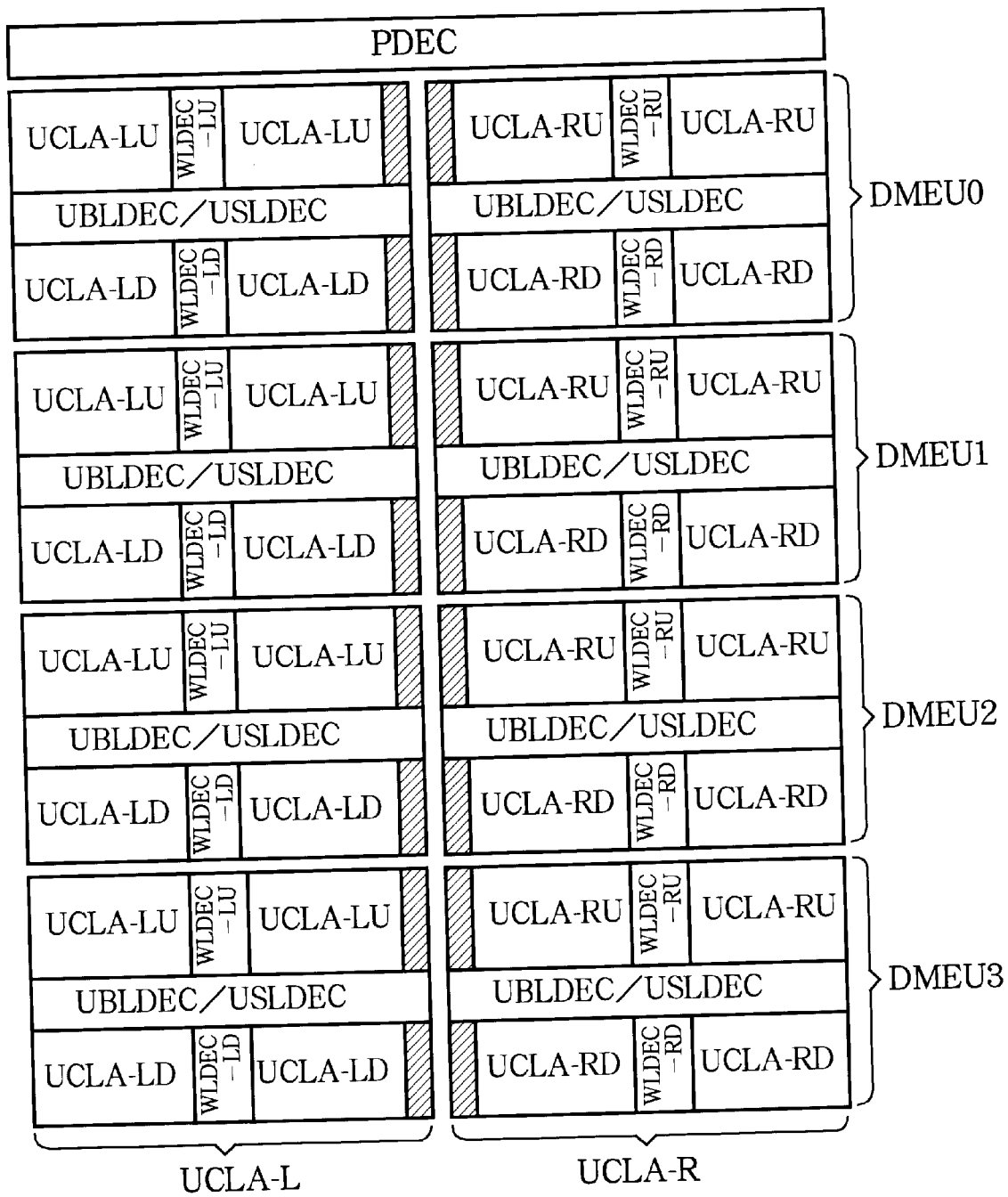
FIG. 32 illustrates the structure of a redundant memory circuit in an analog audio flash memory according to a fourth embodiment.

FIG. 32 shows the layout of the redundant memory circuit of an analog audio flash memory according to a fourth embodiment of the invention. Elements identical to corresponding elements in the conventional redundant memory circuit in FIG. 46 are denoted by the same reference characters. The redundant memory circuit in FIG. 32 includes a predecoder PDEC and four memory units DMEU0, DMEU1, DMEU2, DMEU3, an arbitrary one of which will be denoted DMEU below.

Figure 33:
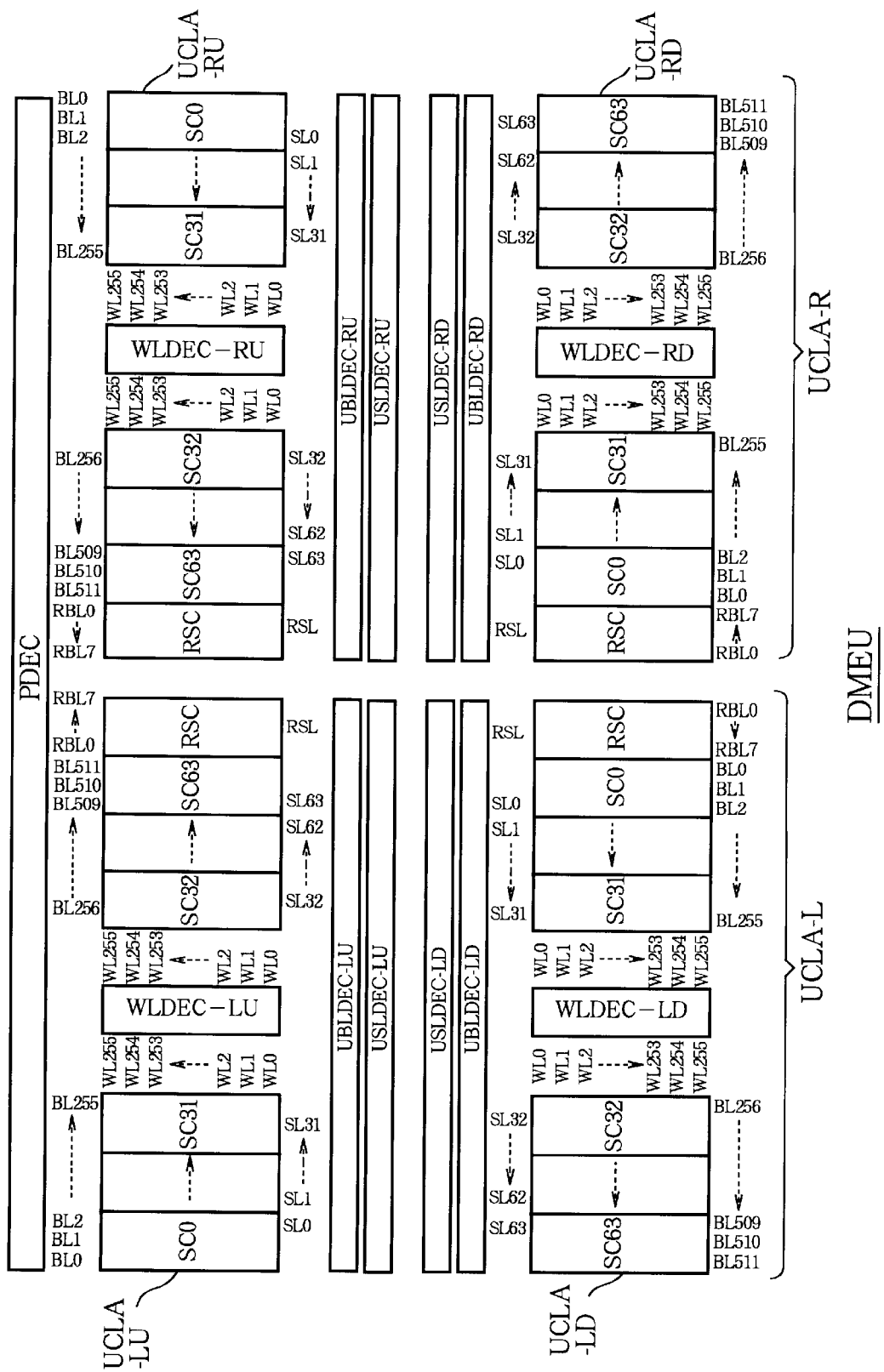
FIG. 33 illustrates the structure of a memory unit in the fourth embodiment in more detail.

FIG. 33 shows the layout of a memory unit DMEU in FIG. 32, using the same reference characters for elements identical to corresponding elements in FIG. 47. The memory unit DMEU includes four cell arrays UCLA (UCLA-LU, UCLA-RU, UCLA-LD, UCLA-RD), four word line decoders WLDEC (WLDEC-LU, WLDEC-RU, WLDEC-LD, WLDEC-RD), four bit-line decoders UBLDEC (UBLDEC-LU, UBLDEC-RU, UBLDEC-LD, UBLDEC-RD), and four source line decoders USLDEC (USLDEC-LU, USLDEC-RU, USLDEC-LD, USLDEC-RD).

Memory Unit in the Fourth Embodiment

The memory units DMEU in the fourth embodiment differ from the conventional memory units UMEU shown in FIG. 47 in that the word line decoders WLDEC are disposed in the center of the cell arrays UCLA, instead of at one end of each cell array. In each cell array UCLA in FIG. 32, the word line decoder WLDEC is disposed between sectors SC31 and SC32. The word line decoder WLDEC is thus located at the centers of the word lines WL0–WL255 extending from left to right across the cell array UCLA, instead of being disposed at the ends of the word lines as in the conventional memory unit UMEU.

Since the word line decoders WLDEC are disposed in the centers of the cell arrays UCLA in the fourth embodiment, the maximum distance from a word line decoder WLDEC to any sector in the cell array is only half the length of the cell array, and this is also the maximum change in the distance to the word line decoder WLDEC that can occur when a bad sector is replaced by a redundant sector. The maximum distance change is thus only half that in the conventional memory unit.

When a redundant sector RSC is accessed in place of a bad sector BSC, accordingly, although the memory transistor threshold voltage may differ from the desired value due to the parasitic capacitance and resistance of the word line WL and the gate disturb effect, the difference is more limited than in the conventional memory unit, because the distance of the two sectors RSC, BSC from the word line decoder WLDEC is limited to half the length of the cell array. The maximum size of any discontinuities in the threshold voltage deviation profile is thus reduced, improving the quality of the reproduced audio signal. Furthermore, the fidelity of the reproduced audio signal is improved even when no redundancy replacement is performed, because the maximum deviation inherent in the threshold voltage deviation profile is reduced, as no sector is farther than half the length of the cell array from the word line decoder WLDEC.

Since there is only one redundant sector per cell array and only the location of the word line decoder WLDEC is changed, the total size of the analog audio flash memory chip in the fourth embodiment is the same as that of the conventional analog audio flash memory chip, so the improved fidelity of the reproduced audio signal and the reduced degradation of the audio signal caused by redundancy replacement are obtained with no chip area penalty.

Figure 34A:
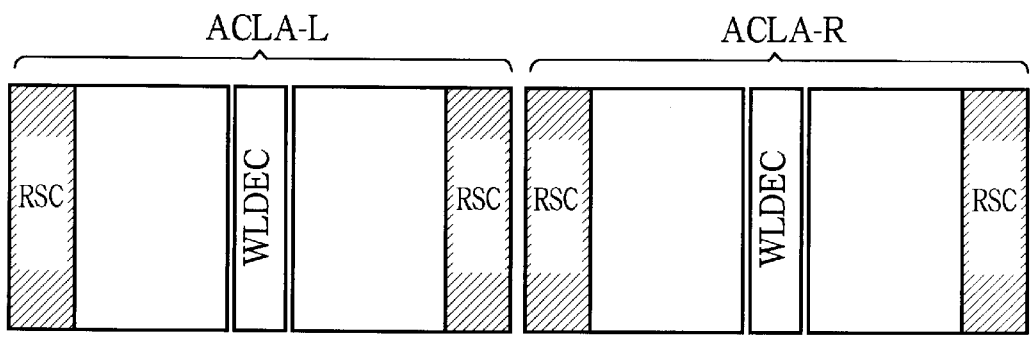
FIGS. 34A, 34B, 34C and 34D show memory units in variations of the fourth embodiment.
Figure 34B:
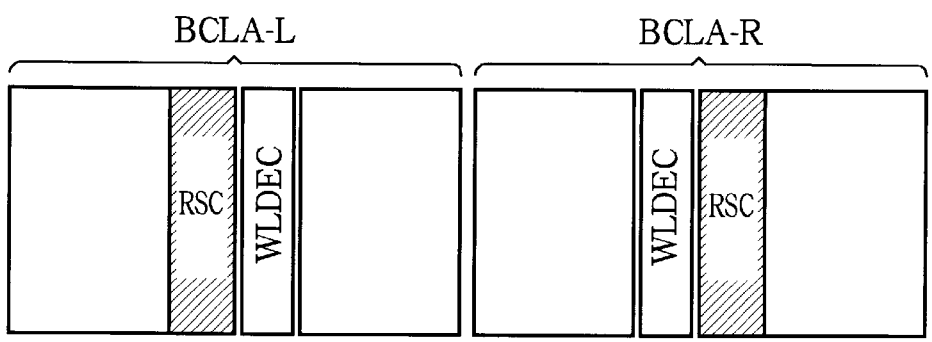
Figure 34C:
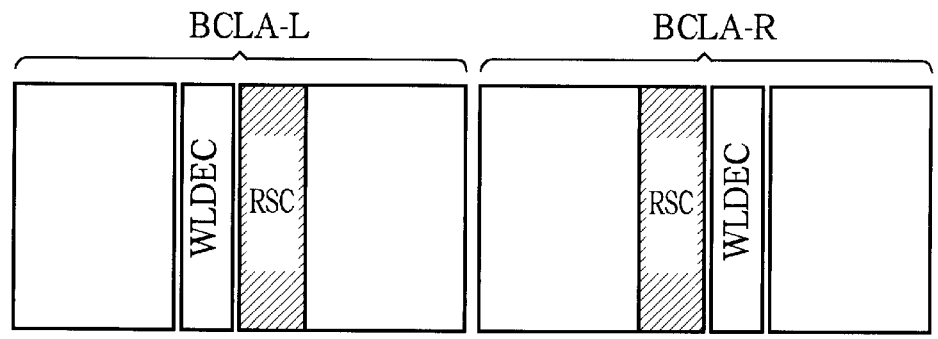
Figure 34D:
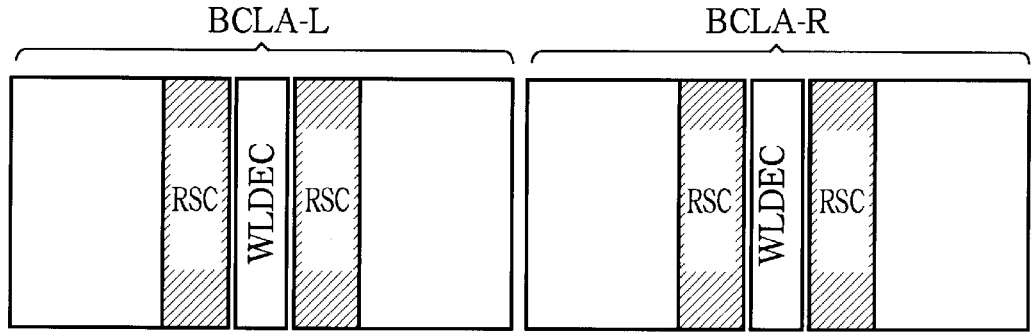

FIGS. 34A, 34B, 34C, and 34D show the layout of right and left cell arrays and their word line decoders in several variations of the fourth embodiment. The variation in FIG. 34A places a word line decoder WLDEC at the center of the cell arrays ACLA-L and ACLA-R of the first embodiment, each of which has two redundant sectors RSC, disposed at opposite ends of the array. The variations in FIGS. 34B and 34C place a word line decoder WLDEC at the center of the cell arrays BCLA-L and BCLA-R of the second embodiment (FIGS. 21 and 24), adjacent to the redundant sector RSC. In FIG. 34B, the word line decoder WLDEC is inwardly adjacent to the redundant sector RSC, as seen from the center of the memory unit; in FIG. 34C, the word line decoder WLDEC is outwardly adjacent to the redundant sector RSC. The variation in FIG. 34D places a word line decoder WLDEC at the centers of the modified cell arrays of the second embodiment (FIG. 25) having two centrally located redundant sectors; in each cell array BCLA-L and BCLA-R, the word line decoder WLDEC is located between the two redundant sectors RSC. The variations in FIGS. 34A and 34D enable the replacement of two bad sectors per cell array, improving the yield of the analog audio flash memory production process.

FIFTH EMBODIMENT

Figure 35:
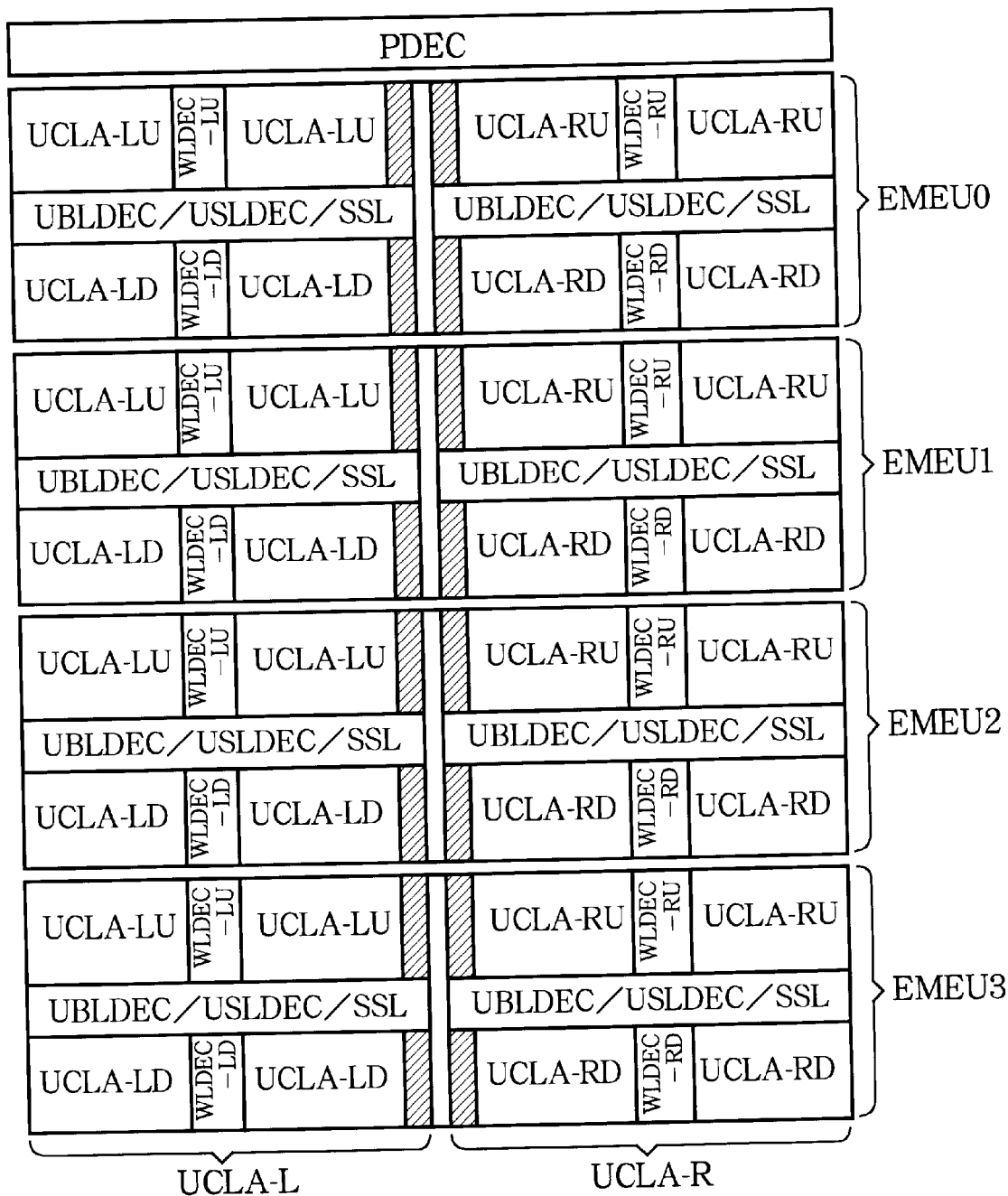
FIG. 35 illustrates the structure of a redundant memory circuit in an analog audio flash memory according to a fifth embodiment.

FIG. 35 shows the layout of the redundant memory circuit of an analog audio flash memory according to a fifth embodiment of the invention. Elements identical to corresponding elements in FIGS. 26 and 32 are denoted by the same reference characters. The redundant memory circuit in FIG. 35 includes a predecoder PDEC and four memory units EMEU0, EMEU1, EMEU2, EMEU3, an arbitrary one of which will be denoted EMEU below.

Figure 36:
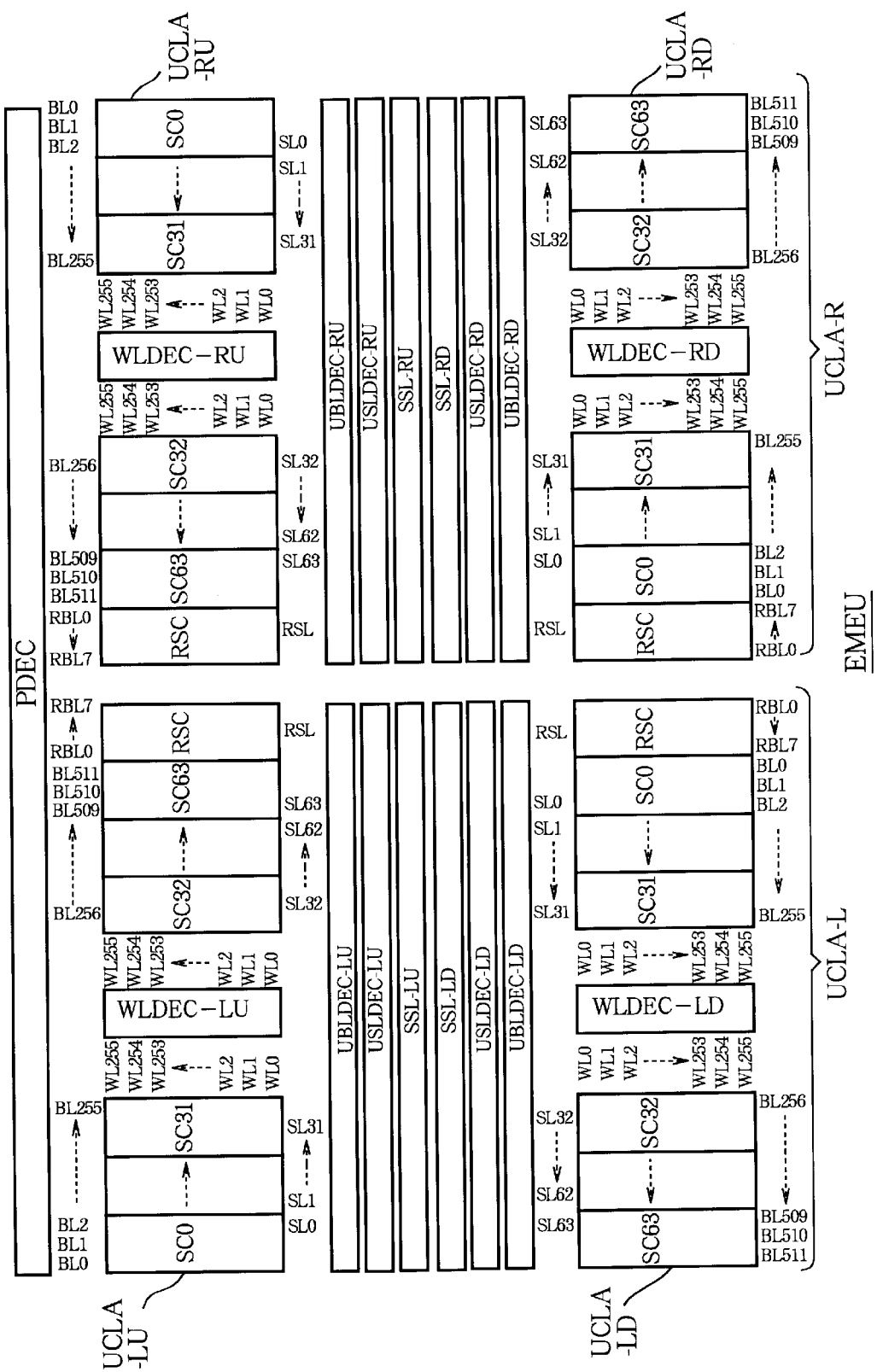
FIG. 36 illustrates the structure of a memory unit in the fifth embodiment in more detail.

FIG. 36 shows the layout of a memory unit EMEU in FIG. 35, using the same reference characters for elements identical to corresponding elements in FIG. 33. The memory unit EMEU includes four cell arrays UCLA (UCLA-LU, UCLA-RU, UCLA-LD, UCLA-RD), four word line decoders WLDEC (WLDEC-LU, WLDEC-RU, WLDEC-LD, WLDEC-RD), four bit-line decoders UBLDEC (UBLDEC-LU, UBLDEC-RU, UBLDEC-LD, UBLDEC-RD), four source line decoders USLDEC (USLDEC-LU, USLDEC-RU, USLDEC-LD, USLDEC-RD), and four sector selection circuits SSL (SSL-LU, SSL-RU, SSL-LD, SSL-RD).

Memory Unit in the Fifth Embodiment

The memory units EMEU in the fifth embodiment add the sector selection circuit SSL of the third embodiment to the memory units DMEU of the fourth embodiment, shown in FIG. 32 and FIG. 33. The word line decoders WLDEC are thus disposed in the center of the cell arrays UCLA, and when redundancy replacement is performed, the sectors SC0–SC63 and redundant sector RSC in a cell array (excluding a bad sector BSC if one is present, and excluding the redundant sector RSC if no bad sector is present) are accessed in sequence from one end of the cell array to the other end.

In the fifth embodiment, as in the third embodiment, a bad sector is replaced by the adjacent sector SC immediately preceding or following it. Redundancy replacement therefore leaves the threshold voltage deviation profile virtually unaltered, and causes substantially no degradation in the quality of the reproduced audio signal. Moreover, the maximum inherent deviation in the threshold voltage deviation profile is reduced because the word line decoder WLDEC is disposed at the center of the cell array UCLA, so the fidelity of the reproduced audio signal is improved even when redundancy replacement is not performed, as in the fourth embodiment.

By placing a word line decoder WLDEC at the center of each cell array UCLA and by adding a sector selection circuit SSL so that the redundant sector RSC and sectors SC0–SC63 can be accessed in sequence from one end of the cell array to the other end even after redundancy replacement, the fifth embodiment is able to reproduce an audio signal with a high degree of fidelity that is substantially unaltered by redundancy replacement.

Figure 37A:
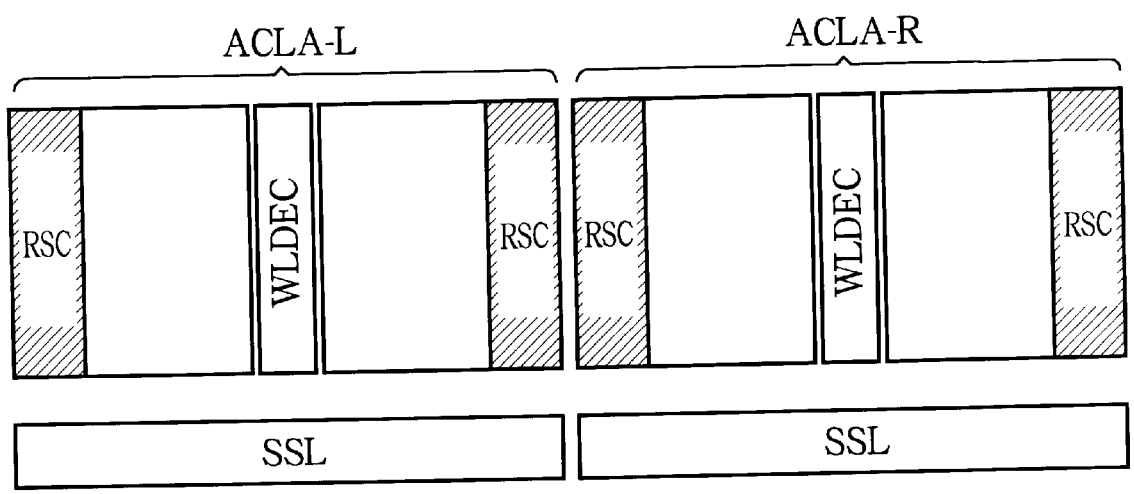
FIGS. 37A and 37B illustrate memory units in variations of the fifth embodiment.
Figure 37B:
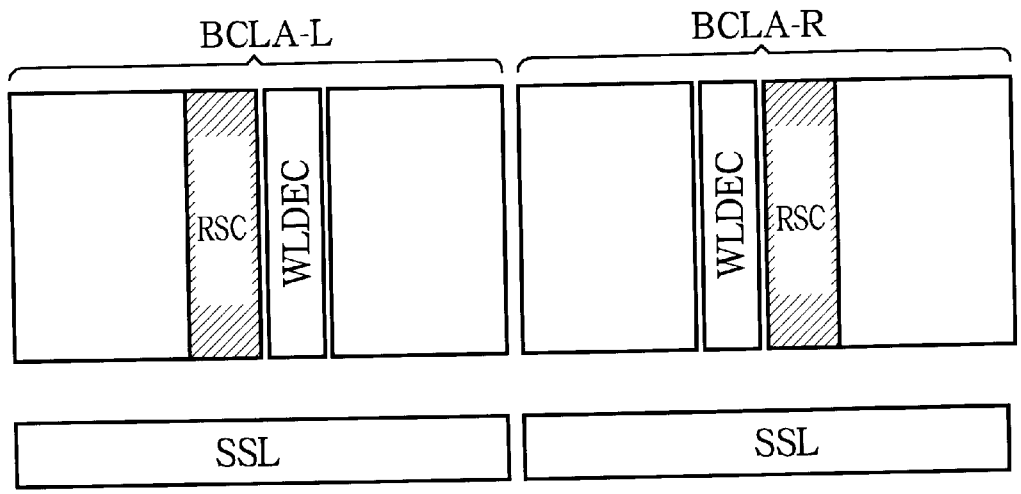

FIGS. 37A and 37B show the layout of right and left cell arrays, with their word line decoders and sector selection circuits, in two variations of the fifth embodiment. The variation in FIG. 37A adds a sector selection circuit SSL to the variation of the fourth embodiment shown in FIG. 34A;

the variation in FIG. 37B adds a sector selection circuit SSL to the variation of the fourth embodiment shown in FIG. 34B. The variation in FIG. 37A enables the replacement of two bad sectors per cell array, improving the yield of the analog audio flash memory production process.

SIXTH EMBODIMENT

Figure 38:
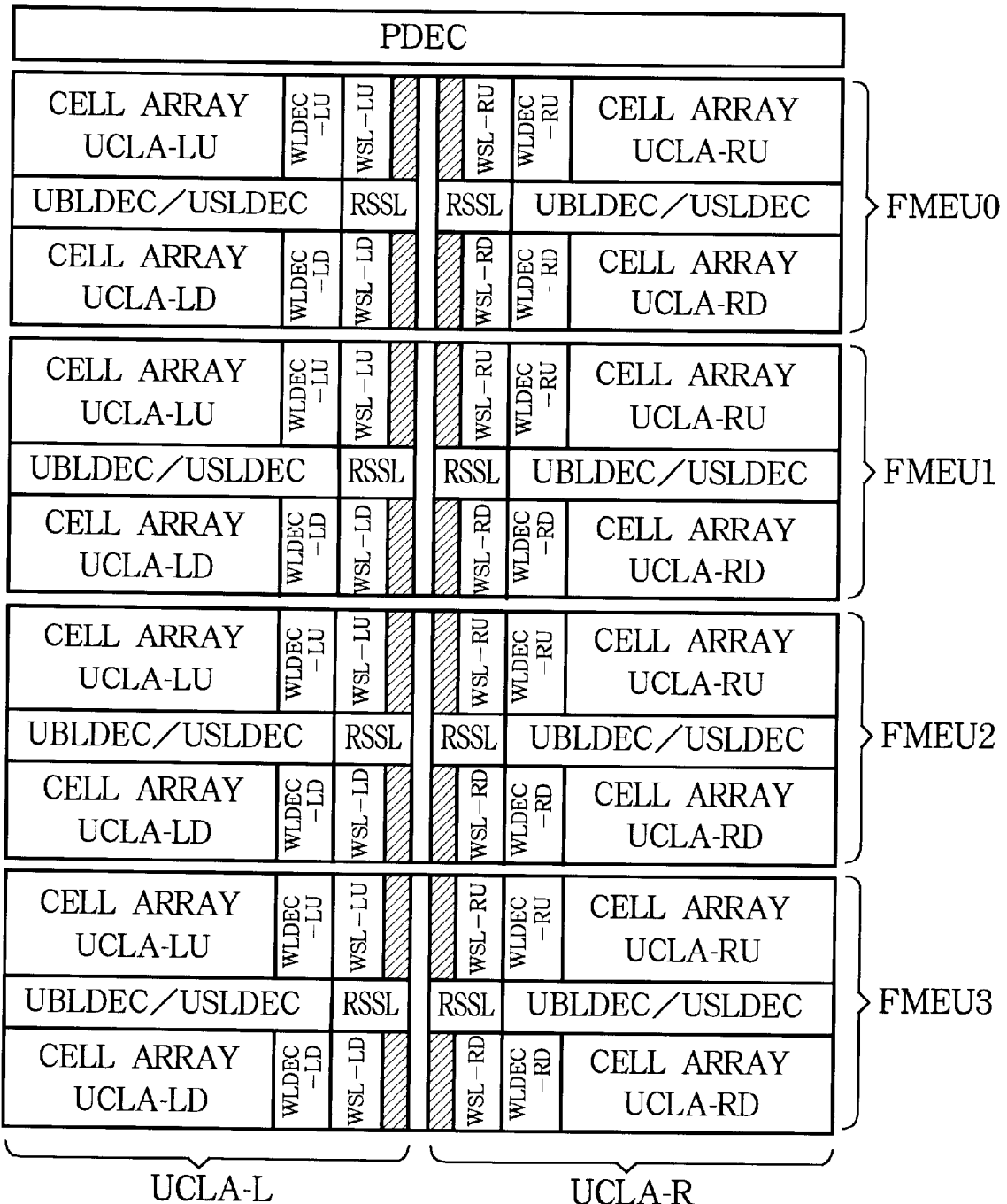
FIG. 38 illustrates the structure of a redundant memory circuit in an analog audio flash memory according to a sixth embodiment.

FIG. 38 shows the layout of the redundant memory circuit of an analog audio flash memory according to a sixth embodiment of the invention. Elements identical to corresponding elements in the conventional redundant memory circuit in FIG. 46 are denoted by the same reference characters. The redundant memory circuit in FIG. 38 includes a predecoder PDEC and four memory units FMEU0, FMEU1, FMEU2, FMEU3, an arbitrary one of which will be denoted FMEU below.

Figure 39:
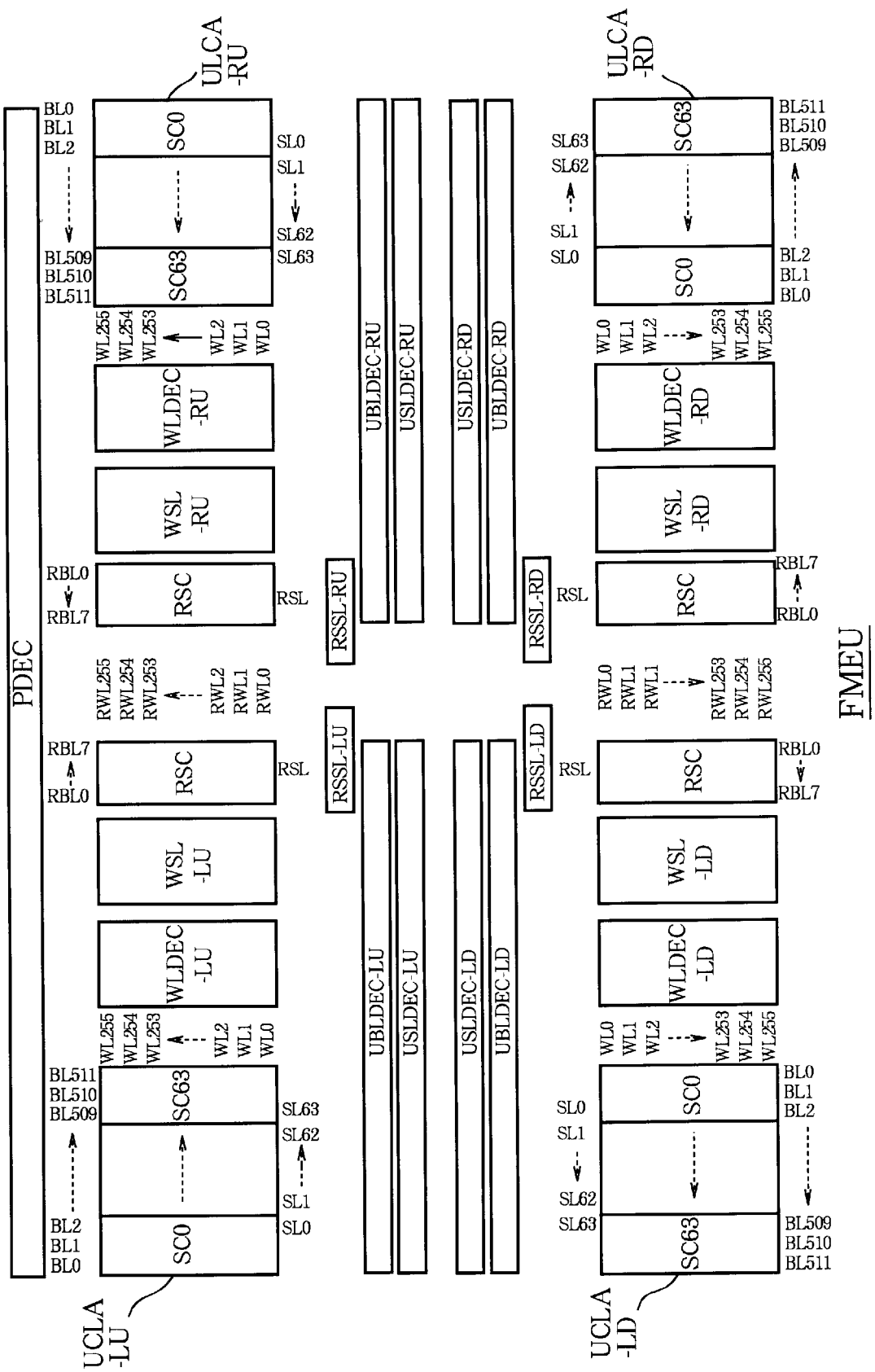
FIG. 39 illustrates the structure of a memory unit in the sixth embodiment in more detail.

FIG. 39 shows the layout of a memory unit FMEU in FIG. 38, using the same reference characters for elements identical to corresponding elements in FIG. 47. The memory unit FMEU includes four cell arrays UCLA (UCLA-LU, UCLA-RU, UCLA-LD, UCLA-RD), four word line decoders WLDEC (WLDEC-LU, WLDEC-RU, WLDEC-LD, WLDEC-RD), four bit-line decoders UBLDEC (UBLDEC-LU, UBLDEC-RU, UBLDEC-LD, UBLDEC-RD), four source line decoders USLDEC (USLDEC-LU, USLDEC-RU, USLDEC-LD, USLDEC-RD), four word line selection circuits WSL (WSL-LU, WSL-RU, WSL-LD, WSL-RD) and four redundant sector selection circuits RSSL (RSSL-LU, RSSL-RU, RSSL-LD, RSSL-RD).

Memory Unit in the Sixth Embodiment

By adding word line selection circuits WSL and redundant sector selection circuits RSSL, the sixth embodiment enables a bad sector in a left cell array UCLA-L to be replaced by a redundant sector RSC in a right cell array UCLA-R (also referred to below as a right redundant sector RSC-R), or a bad sector in a right cell array UCLA-R to be replaced by a redundant sector in a left cell array UCLA-L (also referred to below as a left redundant sector RSC-L). The word line decoder WLDEC of each cell array is disposed between the redundant sector RSC and sector SC0 or SC63. The word line selection circuit WSL is disposed between the redundant sector RSC and the word line decoder WLDEC. Each cell array UCLA has its own word line decoder WLDEC, bit line decoder UBLDEC, source line decoder USLDEC, word line selection circuit WSL, and redundant sector selection circuit RSSL.

The redundant sectors in the sixth embodiment are not connected directly to the word lines WL, but to redundant word lines RWL instead. The left redundant sector RSC-L is connected to left redundant word lines RWL-L; the right redundant sector RSC-R is connected to right redundant word lines RWL-R. If a bad sector in a left cell array UCLA-L is replaced by a redundant sector, at the time when the redundant sector must be accessed in place of the bad sector, the left word line selection circuit WSL-L (WSL-LU or WSL-LD), operating according to word line selection control signals from the predecoder PDEC, selects either the left redundant word lines RWL-L or the right redundant word lines RWL-R, and couples the selected redundant word lines to the left word lines WL-L (the word lines WL connected to the left word line decoder WLDEC-L). Similarly, if a bad sector in a right cell array UCLA-R is replaced by a redundant sector, at the time when the redundant sector must be accessed in place of the bad sector, the right word line selection circuit WSL-R (WSL-RU or WSL-RD), operating according to word line selection control signals from the predecoder PDEC, selects either the left redundant word lines RWL-L or right redundant word lines RWL-R, and couples the selected redundant word lines to the right word lines WL-R (the word lines WL connected to the right word line decoder WLDEC-R).

Redundant Sector Selection Circuit

If a bad sector in a left cell array UCLA-L is replaced by a redundant sector, at the time when the redundant sector must be accessed in place of the bad sector, the left redundant sector selection circuit RSSL-L (RSSL-LU or RSSL-LD), operating according to redundant sector selection control signals from the predecoder PDEC, selects either the left redundant bit lines RBL-L (the redundant bit lines RBL in the left cell array UCLA-L) and the left redundant source line RSL-L (the redundant source line RSL in the left cell array UCLA-L) or the right redundant bit lines RBL-R (redundant bit lines RBL in the right cell array UCLA-R) and right redundant source line RSL-R (the redundant source line RSL in the right cell array UCLA-R). Similarly, if a bad sector in a right cell array UCLA-R is replaced by a redundant sector, at the time when the redundant sector must be accessed in place of the bad sector, the right redundant sector selection circuit RSSL-R (RSSL-RU or RSSL-RD), operating according to redundant sector selection control signals from the predecoder PDEC, selects either the left redundant bit lines RBL-L and left redundant source line RSL-L or the right redundant bit lines RBL-R and right redundant source line RSL-R.

The word line selection circuits WSL and redundant sector selection circuits RSSL constitute a redundant selection means enabling the redundant sector RSC in the right cell array UCLA-R to be accessed in place of a bad sector in the left cell array UCLA-L, and the redundant sector RSC in the left cell array UCLA-L to be accessed in place of a bad sector in the right cell array UCLA-R.

Redundancy Replacement in the Sixth Embodiment

Figure 40:
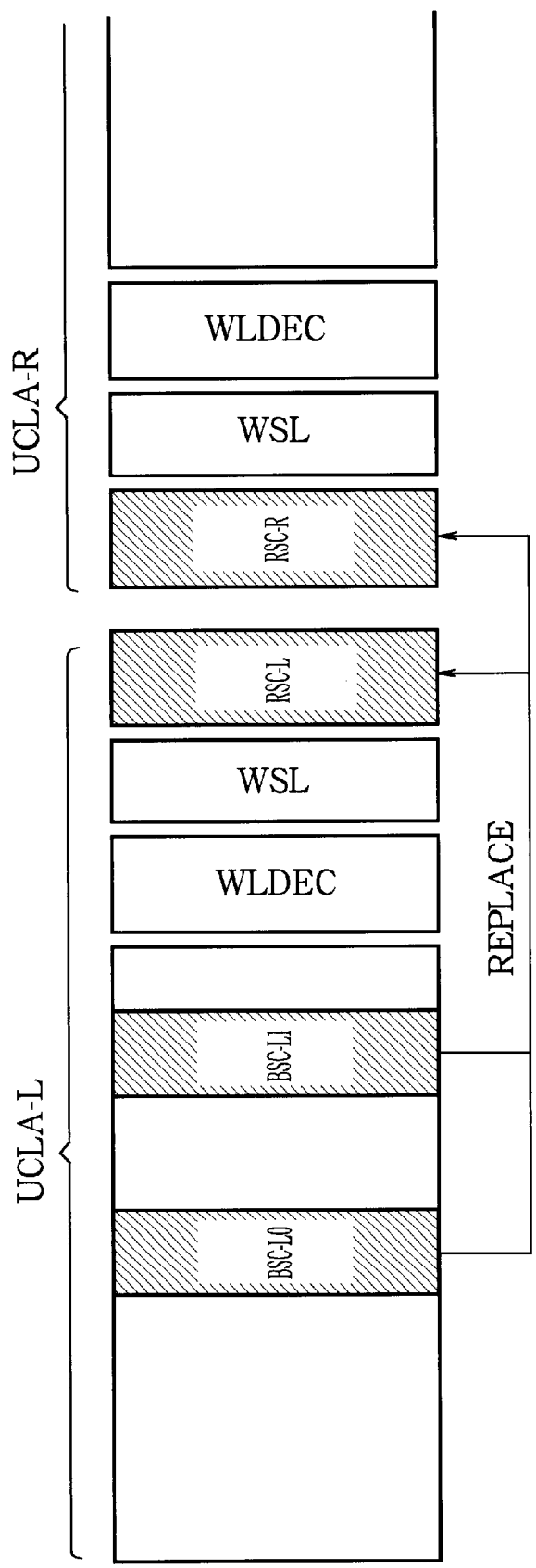
FIG. 40 illustrates redundancy replacement in the sixth embodiment.

FIG. 40 illustrates redundancy replacement in the sixth embodiment, showing a case in which there are two bad sectors BSC-L0, BSC-L1 in a left cell array UCLA-L (and no bad sectors in the corresponding right cell array UCLA-R). Sector BSC-L0 is replaced by the left redundant sector RSC-L, and sector BSC-L1 by the right redundant sector RSC-R. If there were two bad sectors in the right cell array UCLA-R (and none in the left cell array UCLA-L), they would also be replaced by the right redundant sector RSC-R and left redundant sector RSC-L. If there were only one bad sector in the left cell array UCLA-L, it would be replaced by the left redundant sector RSC-L. If there were only one bad sector in the right cell array UCLA-R, it would be replaced by the right redundant sector RSC-R.

Since bad sector BSC-L0 is replaced by the left redundant sector RSC-L and bad sector BSC-L1 is replaced by the right redundant sector RSC-R, redundant sector RSC-L is accessed at the time when bad sector BSC-L0 would be accessed in the normal access sequence, and redundant sector RSC-R is accessed at the time when bad sector BSC-L1 would be accessed in the normal access sequence.

When redundant sector RSC-L is accessed, the left word line selection circuit WSL-L selects the redundant word lines RWL-L connected to redundant sector RSC-L, and couples these redundant word lines RWL-L to word lines WL-L (to the left word line decoder WLDEC-L). The left redundant sector selection circuit RSSL-L selects the redundant bit lines RBL-L and redundant source line RSC-L connected to redundant sector RSC-L, couples the selected redundant bit lines RBL-L to the left bit line decoder UBLDEC-L, and couples the selected redundant source line RSL-L to the left source line decoder USLDEC-L.

When redundant sector RSC-R is accessed, the left word line selection circuit WSL-L selects the redundant word lines RWL-R connected to redundant sector RSC-R, and couples these redundant word lines RWL-L to word lines WL-L (to the left word line decoder WLDEC-L). The left redundant sector selection circuit RSSL-L selects the redundant bit lines RBL-R and redundant source line RSC-R connected to redundant sector RSC-R, couples the selected redundant bit lines RBL-R to the left bit line decoder UBLDEC-L, couples the selected redundant source line RSL-L to the left source line decoder USLDEC-L, and disconnects the left redundant bit lines RBL-L and redundant source line RSL-L from the left bit line decoder UBLDEC-L and source line decoder USLDEC-L. The right word line selection circuit WSL-R also disconnects the right redundant word lines RWL-R from the right word lines WL-R (and from the right word line decoder WLDEC-R). Similarly, the right redundant sector selection circuit RSSL-R disconnects the right redundant bit lines RBL-R and right redundant source line RSL-R from the right bit line decoder UBLDEC-R and right source line decoder USLDEC-R.

By providing word line selection circuits WSL and redundant sector selection circuits RSSL, the sixth embodiment enables a bad sector on the left side of a memory unit to be replaced by either a left redundant sector RSC-L or a right redundant sector RSC-R. Similarly, a bad sector on the right side can be replaced by either a right redundant sector RSC-R or a left redundant sector RSC-L. Accordingly, two bad sectors occurring in the same cell array can both be replaced, even though there is only one redundant sector per cell array (as long as the total number of bad sectors in a paired left cell array UCLA-L and right cell array UCLA-R does not exceed two). By improving the capability for redundancy replacement in this way, the sixth embodiment improves the yield of the analog audio memory production process without increasing the number of redundant sectors RSC, thus without significantly increasing the chip area of the analog flash memory product.

Example of the Structure of the Word Line Selection Circuit

Figure 41:
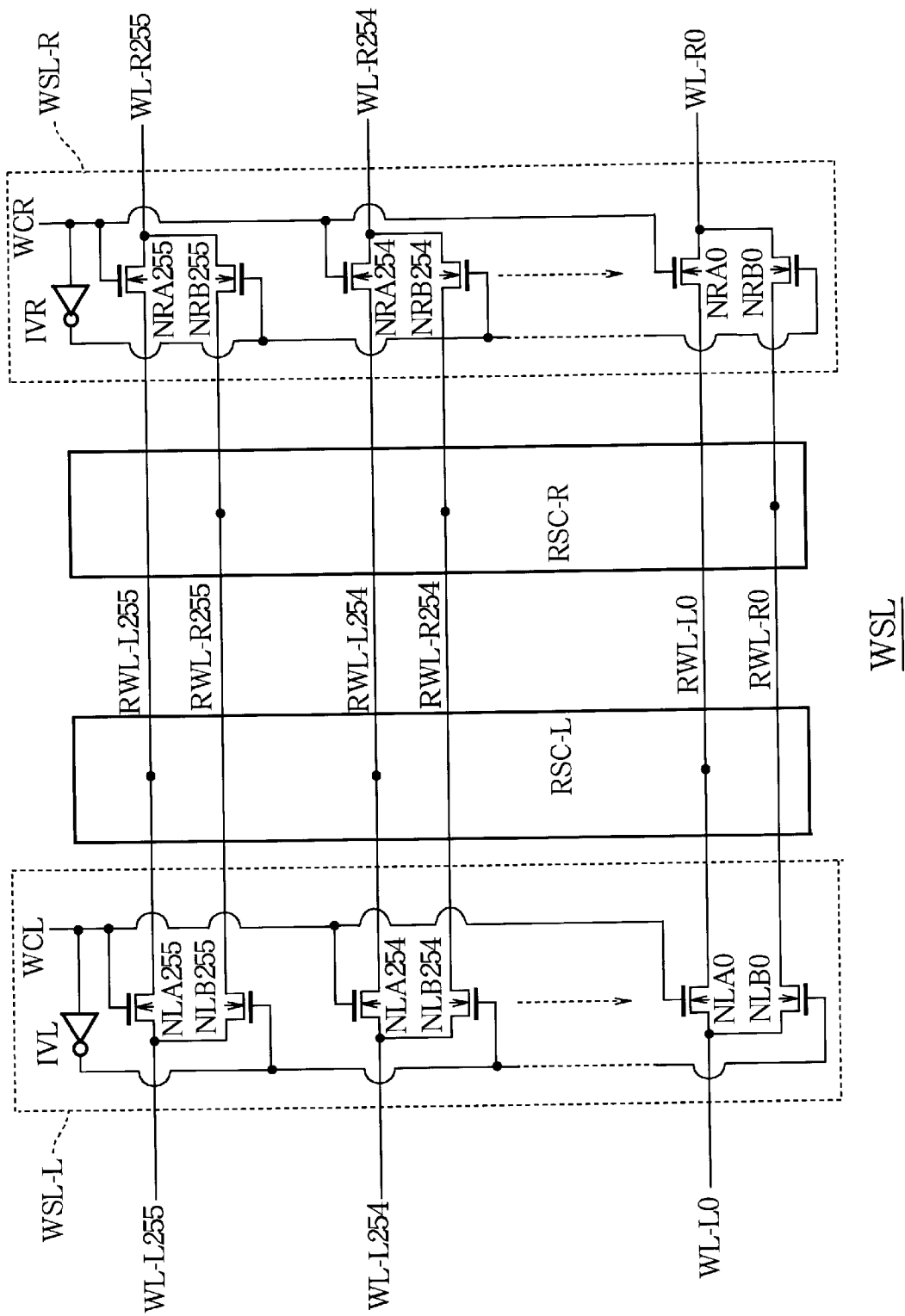
FIG. 41 shows an example of the circuit structure of the word line selection circuits in FIG. 39.

FIG. 41 shows an example of the circuit configuration of the word line selection circuits WSL, showing both a left word line selection circuit WSL-L (WSL-LU or WSL-LD) and a right word line selection circuit WSL-R (WSL-RU or WSL-RD). Redundant word lines RWL-L0, RWL-L1, ..., RWL-L255 are connected to the left redundant sector RSC-L; redundant word lines RWL-R0, RWL-R1, ..., RWL-R255 are connected to the right redundant sector RSC-R. Word lines WL-L0, WL-L1, WL-L255 are connected to the left word line decoder WLDEC-L; word lines WL-R0, WL-R1, ..., WL-R255 are connected to the right word line decoder WLDEC-R.

The left word line selection circuit WSL-L in FIG. 41 comprises NMOS transistors NLA0, NLA1, ..., NLA255, NMOS transistors NLB0, NLB1, ..., NLB255, and an inverter IVL. A word line selection control signal WCL is input to the gate electrodes of NMOS transistors NLA0, NLA1, ..., NLA255, and to the inverter IVL. The inverted signal output from inverter IVL is input to the gate electrodes of NMOS transistors NLB0, NLB1, ..., NLB255. The drain electrodes of transistors NLA0, NLA1, ..., NLA255 and NLB0, NLB1, NLB255 are connected to respective word lines WL-L0, WL-L1, ..., WL-L255. The source electrodes of transistors NLA0, NLA1, ..., NLA255 are connected to respective redundant word lines RWL-L0, RWL-L1, ..., RWL-L255. The source electrodes of transistors NLB0, NLB1, ..., NLB255 are connected to respective redundant word lines RWL-R0, RWL-R1, ..., RWLR255.

When the word line selection control signal WCL is at the high logic level, transistors NLA0–NLA255 are turned on and transistors NLB0–NLB255 are turned off, so redundant word lines RWL-L0, RWL-L1, ..., RWL-L255 are connected to respective word lines WL-L0, WL-L1, ..., WL-L255. When the word line selection control signal WCL is at the low logic level, transistors NLA0–NLA255 are turned off and transistors NLB0–NLB255 are turned on, connecting redundant word lines RWL-R0, RWL-R1, ..., RWL-R255 to respective word lines WL-L0, WL-L1, ..., WL-L255, and disconnecting redundant word lines RWL-L0, RWL-L1, ..., RWL-L255 from word lines WL-L0, WL-L1, ..., WL-L255.

The right word line selection circuit WSL-R in FIG. 41 comprises NMOS transistors NRA0, NRA1, ..., NRA255, NMOS transistors NRB0, NRB1, ..., NRB255, and an inverter IVR. A word line selection control signal WCR is input to the gate electrodes of NMOS transistors NRA0, NRA1, ..., NRA255, and to the inverter IVR. The inverted signal output from inverter IVR is input to the gate electrodes of NMOS transistors NRB0, NRB1, ..., NRB255. The drain electrodes of transistors NRA0, NRA1, ..., NRA255 and NRB0, NRB1, ..., NRB255 are connected to respective word lines WL-R0, WL-R1, ..., WL-R255. The source electrodes of transistors NRA0, NRA1, ..., NRA255 are connected to respective redundant word lines RWL-L0, RWL-L1, ..., RWL-L255. The source electrodes of transistors NRB0, NRB1, ..., NRB255 are connected to respective redundant word lines RWL-R0, RWL-R1, ..., RWLR255.

When the word line selection control signal WCR is at the high logic level, transistors NRA0–NRA255 are turned on and transistors NRB0–NRB255 are turned off, so redundant word lines RWL-L0, RWL-L1, ..., RWL-L255 are connected to respective word lines WL-R0, WL-R1, ..., WL-R255. When the word line selection control signal WCR is at the low logic level, transistors NRA0–NRA255 are turned off and transistors NRB0–NRB255 are turned on, connecting redundant word lines RWL-R0, RWL-R1, ..., RWL-R255 to respective word lines WL-R0, WL-R1, ..., WL-R255, and disconnecting redundant word lines RWL-L0, RWL-L1, ..., RWL-L255 from word lines WL-R0, WL-R1, ..., WL-R255.

Example of the Structure of the Redundant Sector Selection Circuit

Figure 42:
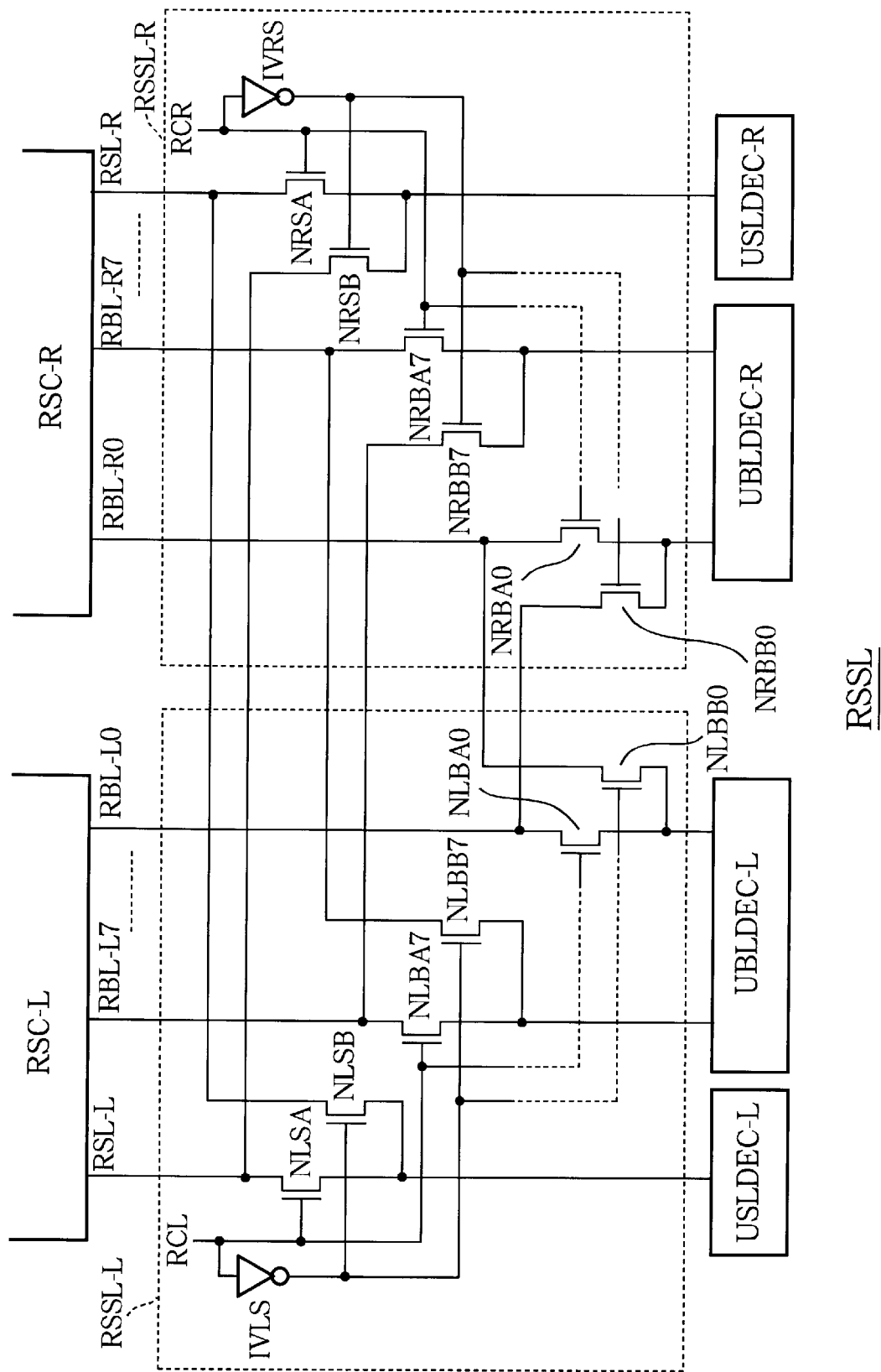
FIG. 42 shows an example of the circuit structure of the redundant sector selection circuits in FIG. 39.

FIG. 42 shows an example of the circuit configuration of the redundant sector selection circuits RSSL, showing both a left redundant sector selection circuit RSSL-L (RSSL-LU or RSSL-LD) and a right redundant sector selection circuit RSSL-R (RSSL-RU or RSSL-RD). Redundant bit lines RBL-L0, RBL-L1, ..., RBL-L7 and redundant source line RSL-L are connected to the left redundant sector RSC-L; redundant bit lines RBL-R0, RBL-R1, ..., RBL-R7 and redundant source line RSL-R are connected to the right redundant sector RSC-R. Also shown are a left bit line decoder UBLDEC-L (UBLDEC-LU or UBLDEC-LD), a right bit line decoder UBLDEC-R (UBLDEC-RU or UBLDEC-RD), a left source line decoder USLDEC-L (USLDEC-LU or USLDEC-LD), and a right source line decoder USLDEC-R (USLDEC-RU or USLDEC-RD).

The left redundant sector selection circuit RSSL-L in FIG. 42 comprises NMOS transistors NLBA0, NLBA1, ..., NLBA7, NMOS transistors NLBB0, NLBB1, ..., NLBB7, NMOS transistors NLSA and NLSB, and an inverter IVLS. The right redundant sector selection circuit RSSL-R comprises NMOS transistors NRBA0, NRBA1, ..., NRBA7, NMOS transistors NRBB0, NRBB1, NRBB7, NMOS transistors NRSA and NRSB, and an inverter IVLS.

A redundant sector selection control signal RCL is input to the gate electrodes of transistors NLBA0–NLBA7 and NLSA and to inverter IVLS. The inverted signal output from inverter IVLS is input to the gate electrodes of transistors NLBB0–NLBB7 and NLSB. A redundant sector selection control signal RCR is input to the gate electrodes of transistors NRBA0–NRBA7 and NRSA and to inverter IVRS. The inverted signal output from inverter IVRS is input to the gate electrodes of transistors NRBB0–NRBB7 and NRSB.

Figure 50:
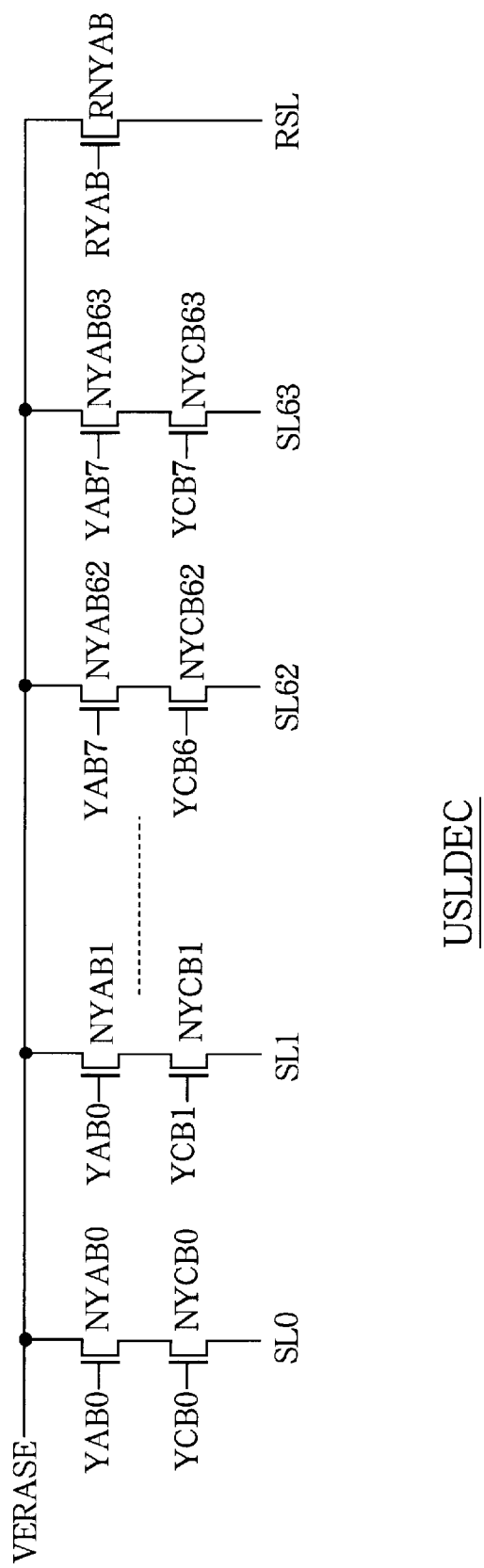
FIG. 50 illustrates the circuit structure of the source line decoders in FIG. 47.
Figure 51:
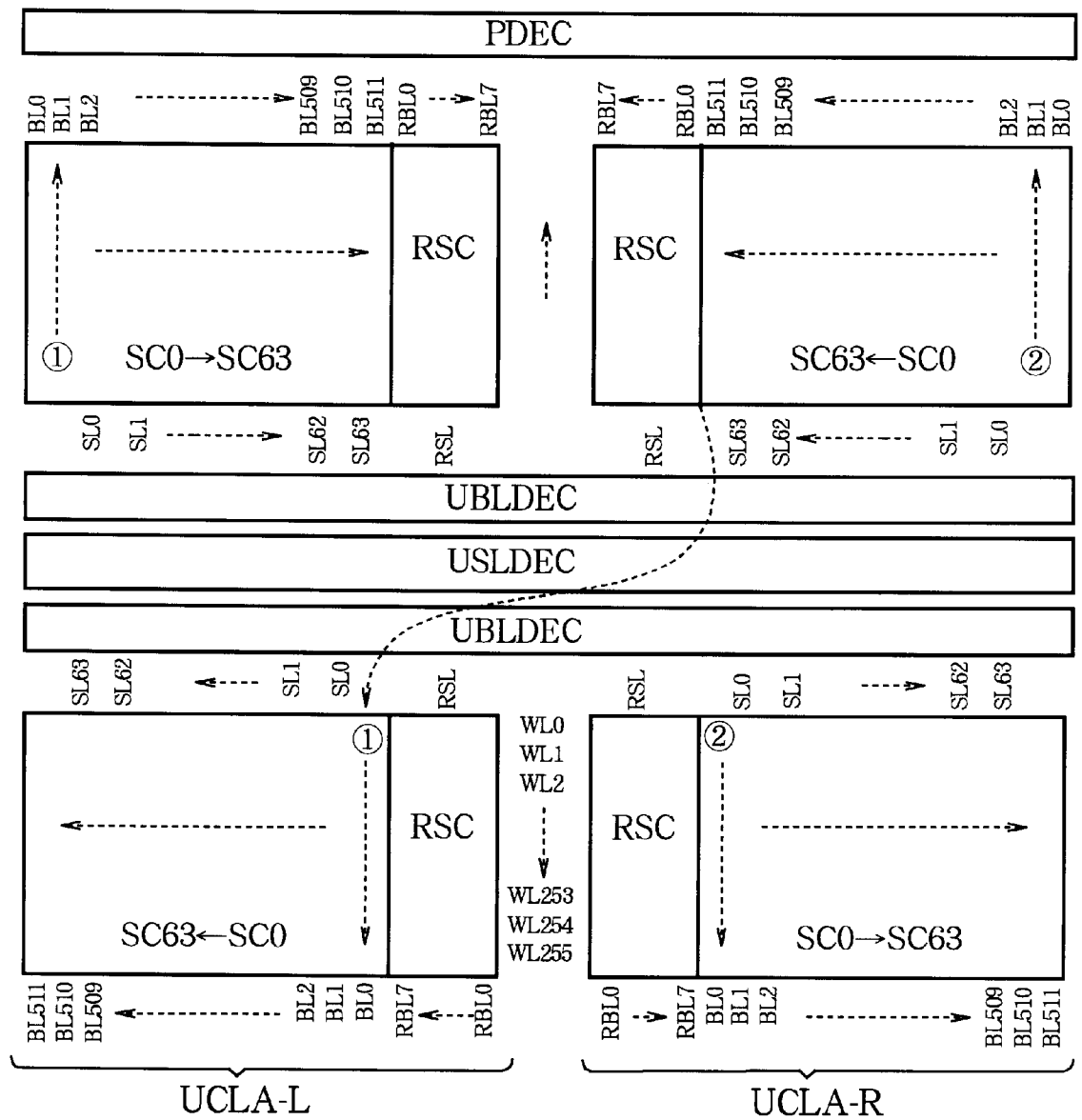
FIG. 51 illustrates the normal sector access sequence in the memory unit in FIG. 47.
Figure 52:
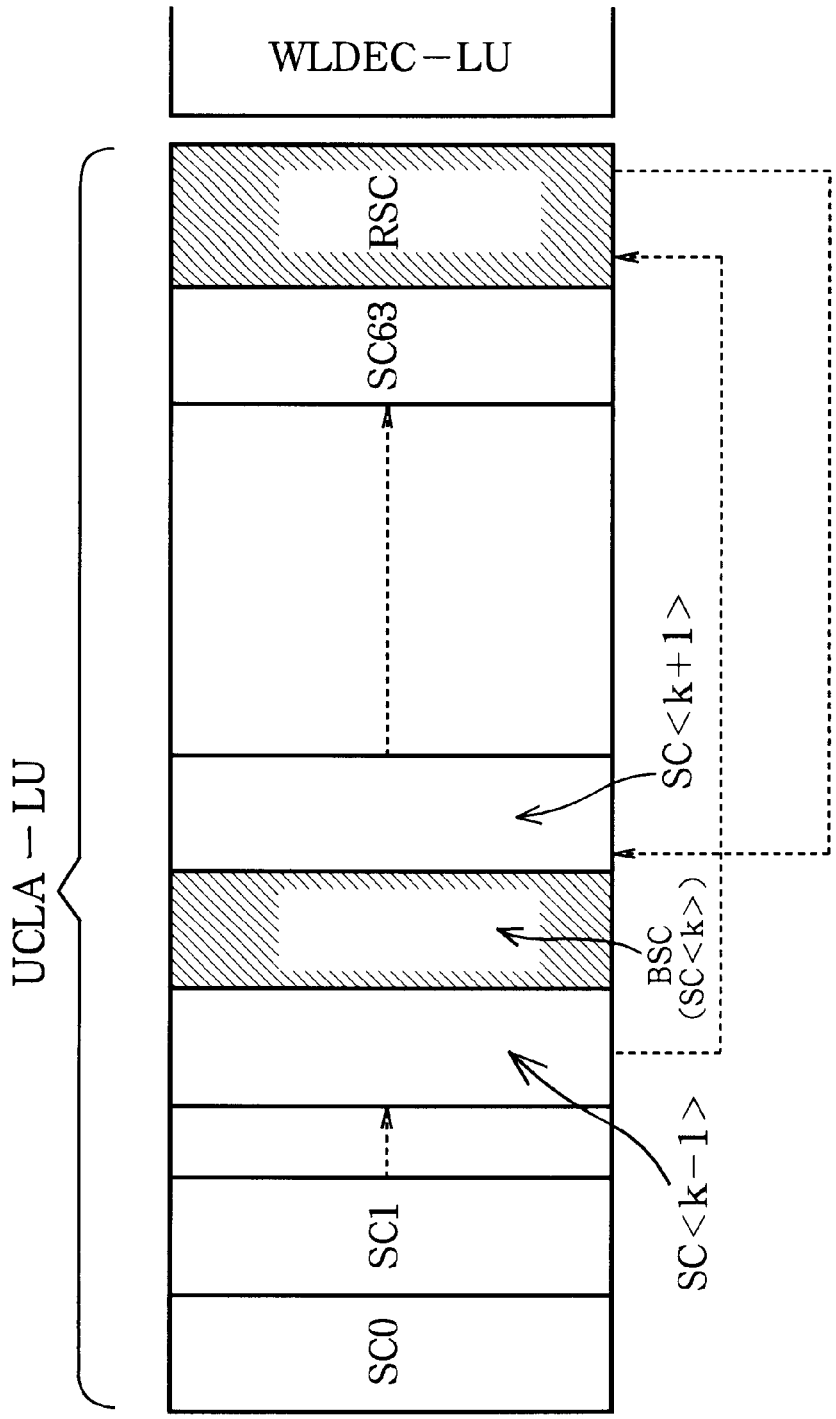
FIG. 52 illustrates the sector and redundant sector access sequence when redundancy replacement is performed in the conventional redundant memory circuit in FIG. 46.
Figure 53:
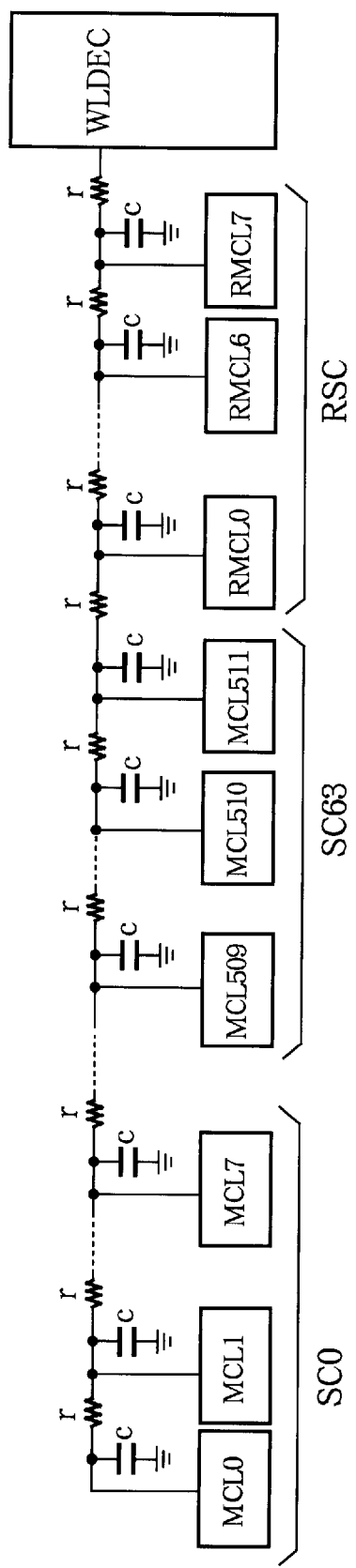
FIG. 53 illustrates parasitic resistance and capacitance on a word line.
Figure 54:
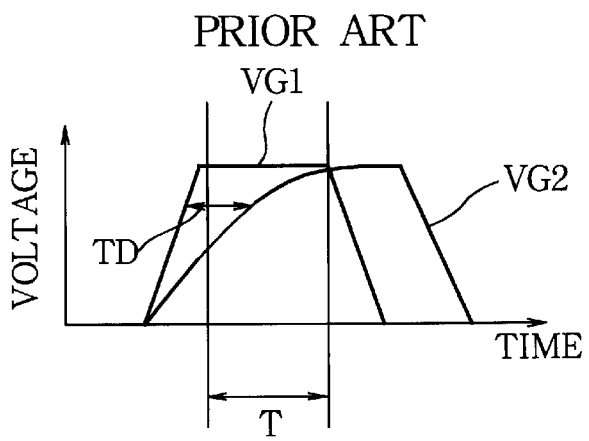
FIG. 54 illustrates the effect that the parasitic resistance and capacitance on a word line have on the rise of the gate voltage of a memory transistor in a memory cell.
Figure 55A:
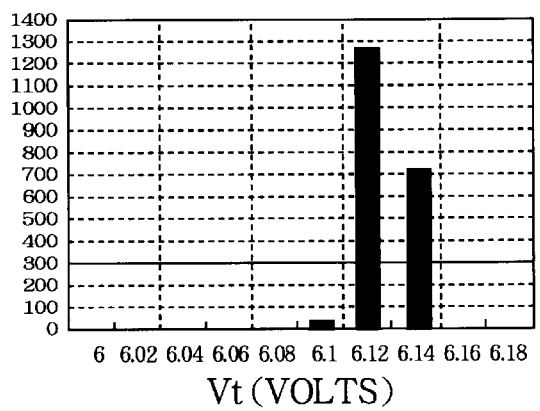
FIG. 55A is a histogram of analog voltage values written in memory cells near the word line decoder in the memory unit in FIG. 47.
Figure 55B:
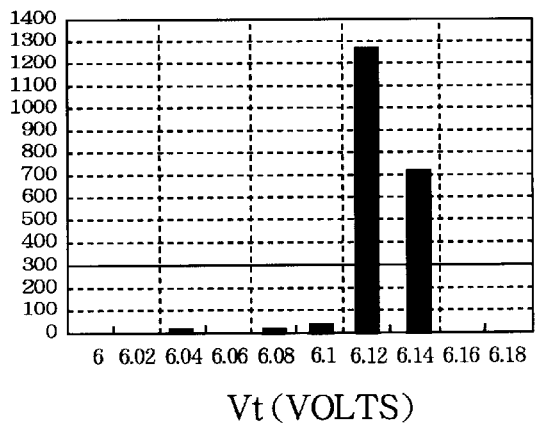
FIG. 55B is a histogram of analog voltage values written in memory cells distant from the word line decoder in the memory unit in FIG. 47.

The drain electrodes of transistors NLBA0, NLBA1, ..., NLBA7 and NLBB0, NLBB1, ..., NLBB7 are connected to the drain electrodes of respective transistors RNYB0, RNYB1, ..., RNYB7 in the left bit line decoder UBLDEC-L (FIG. 49). The drain electrodes of transistors NLSA and NLSB are connected to the drain electrode of transistor RNYAB in the left source line decoder USLDEC-L (FIG. 50). Similarly, the drain electrodes of transistors NRBA0, NRBA1, ..., NRBA7 and NRBB0, NRBB1, ..., NRBB7 are connected to the drain electrodes of respective transistors RNYB0, RNYB1, ..., RNYB7 in the right bit line decoder UBLDEC-R (FIG. 49), and the drain electrodes of transistors NRSA and NRSB are connected to the drain electrode of transistor RNYAB in the right source line decoder USLDEC-R (FIG. 50).

The source electrodes of transistors NLBA0, NLBA1, NLBA7 are connected to respective redundant bit lines RBL-L0, RBL-L1, ..., RBL-L7 and to the source electrodes of respective transistors NRBB0, NRBB1, ..., NRBB7. The source electrode of transistor NLSA is connected to redundant source line RSL-L and to the source electrode of transistor NRSB. Similarly, the source electrodes of transistors NRBA0, NRBA1, ..., NRBA7 are connected to respective redundant bit lines RBL-R0, RBL-R1, ..., RBL-R7 and to the source electrodes of respective transistors NLBB0, NLBB1, ..., NLBB7. The source electrode of transistor NRSA is connected to redundant source line RSL-R and to the source electrode of transistor NLSB.

When redundant sector selection control signal RCL is at the high logic level, transistors NLBA0, NLBA1, ..., NLBA7 and NLSA in the left redundant sector selection circuit RSSL-L are switched on, while transistors NLBB0, NLBB1, ..., NLBB7 and NLSB are switched off, so redundant bit lines RBL-L0 to RBL-L7 are connected to the left bit line decoder UBLDEC-L and redundant source line RSL-L is connected to the left source line decoder USLDEC-L. When redundant sector selection control signal RCL is at the low logic level, transistors NLBA0, NLBA1, ..., NLBA7 and NLSA are switched off, while transistors NLBB0, NLBB1, ..., NLBB7 and NLSB are switched on, coupling redundant bit lines RBL-R0 to RBL-R7 to the left bit line decoder UBLDEC-L and redundant source line RSL-R to the left source line decoder USLDEC-L, and disconnecting redundant bit lines RBL-L0 to RBL-L7 and redundant source line RSL-L from the left bit line decoder UBLDEC-L and left source line decoder USLDEC-L.

When redundant sector selection control signal RCR is at the high logic level, transistors NRBA0, NRBA1, ..., NRBA7 and NRSA in the right redundant sector selection circuit RSSL-R are switched on, while transistors NRBB0, NRBB1, ..., NRBB7 and NRSB are switched off, so redundant bit lines RBL-R0 to RBL-R7 are connected to the right bit line decoder UBLDEC-R and redundant source line RSL-R is connected to the right source line decoder USLDEC-R. When redundant sector selection control signal RCR is at the low logic level, transistors NRBA0, NRBA1, ..., NRBA7 and NRSA are switched off, while transistors NRBB0, NRBB1, ..., NRBB7 and NRSB are switched on, connecting redundant bit lines RBL-L0 to RBL-L7 to the right bit line decoder UBLDEC-R and redundant source line RSL-L to the right source line decoder USLDEC-R, and disconnecting redundant bit lines RBL-R0 to RBL-R7 and redundant source line RSL-R from the right bit line decoder UBLDEC-R and right source line decoder USLDEC-R.

By providing word line selection circuits WSL and redundant sector selection circuits RSSL, and thereby enabling bad sectors on the left side of a memory unit to be replaced by right redundant sectors RSC-R, or bad sectors on the right side to be replaced by left redundant sectors RSC-L, as noted above, the sixth embodiment is able to improve the capability for redundancy replacement (thus improving the yield of the analog audio flash memory production process) with substantially no increase in chip area.

SEVENTH EMBODIMENT

Figure 43:
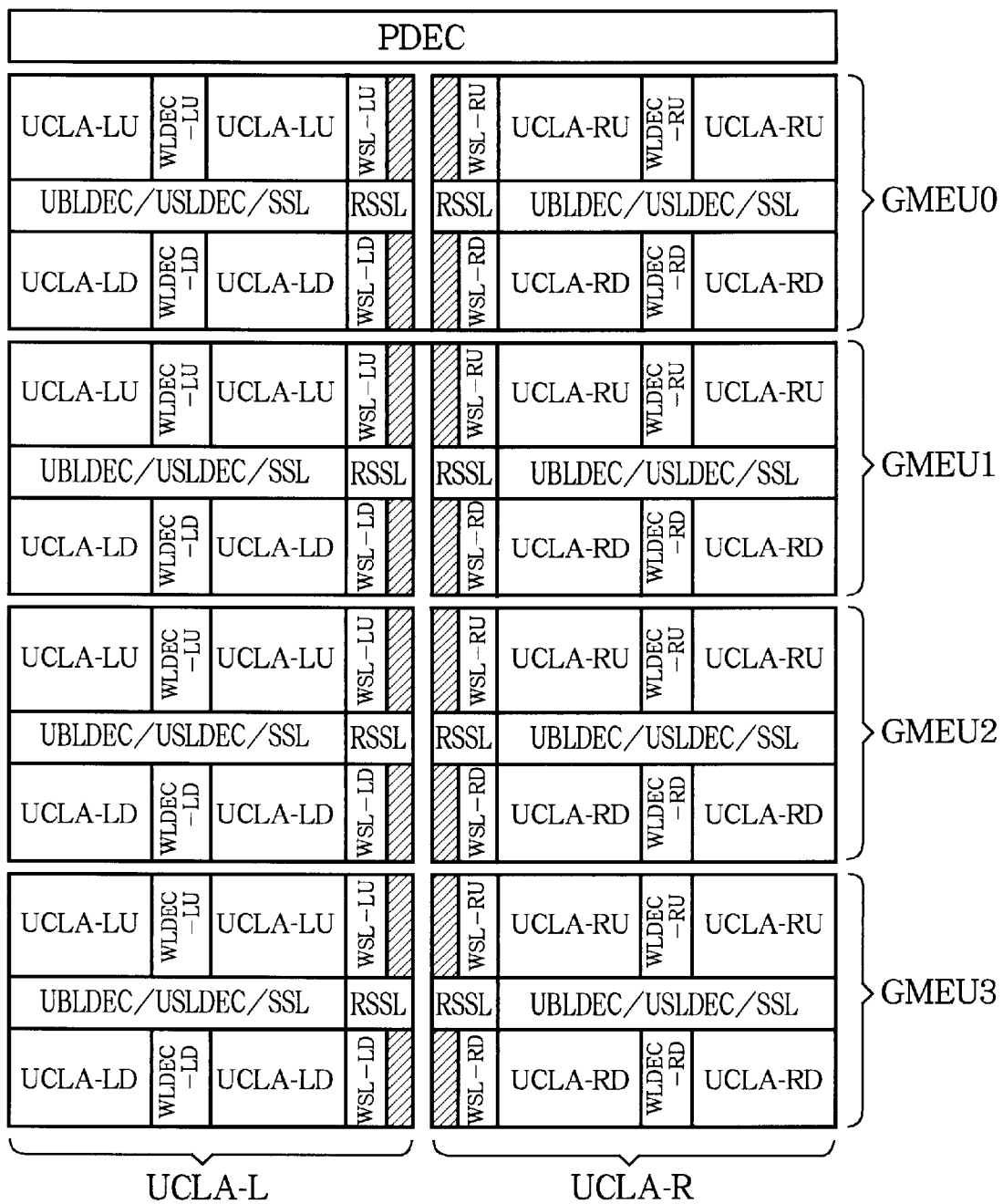
FIG. 43 illustrates the structure of a redundant memory circuit in an analog audio flash memory according to a seventh embodiment.

FIG. 43 shows the layout of the redundant memory circuit of an analog audio flash memory according to a seventh embodiment of the invention. Elements identical to corresponding elements in FIGS. 35 and 38 are denoted by the same reference characters. The redundant memory circuit in FIG. 43 includes a predecoder PDEC and four memory units GMEU0, GMEU1, GMEU2, GMEU3, an arbitrary one of which will be denoted GMEU below.

Figure 44:
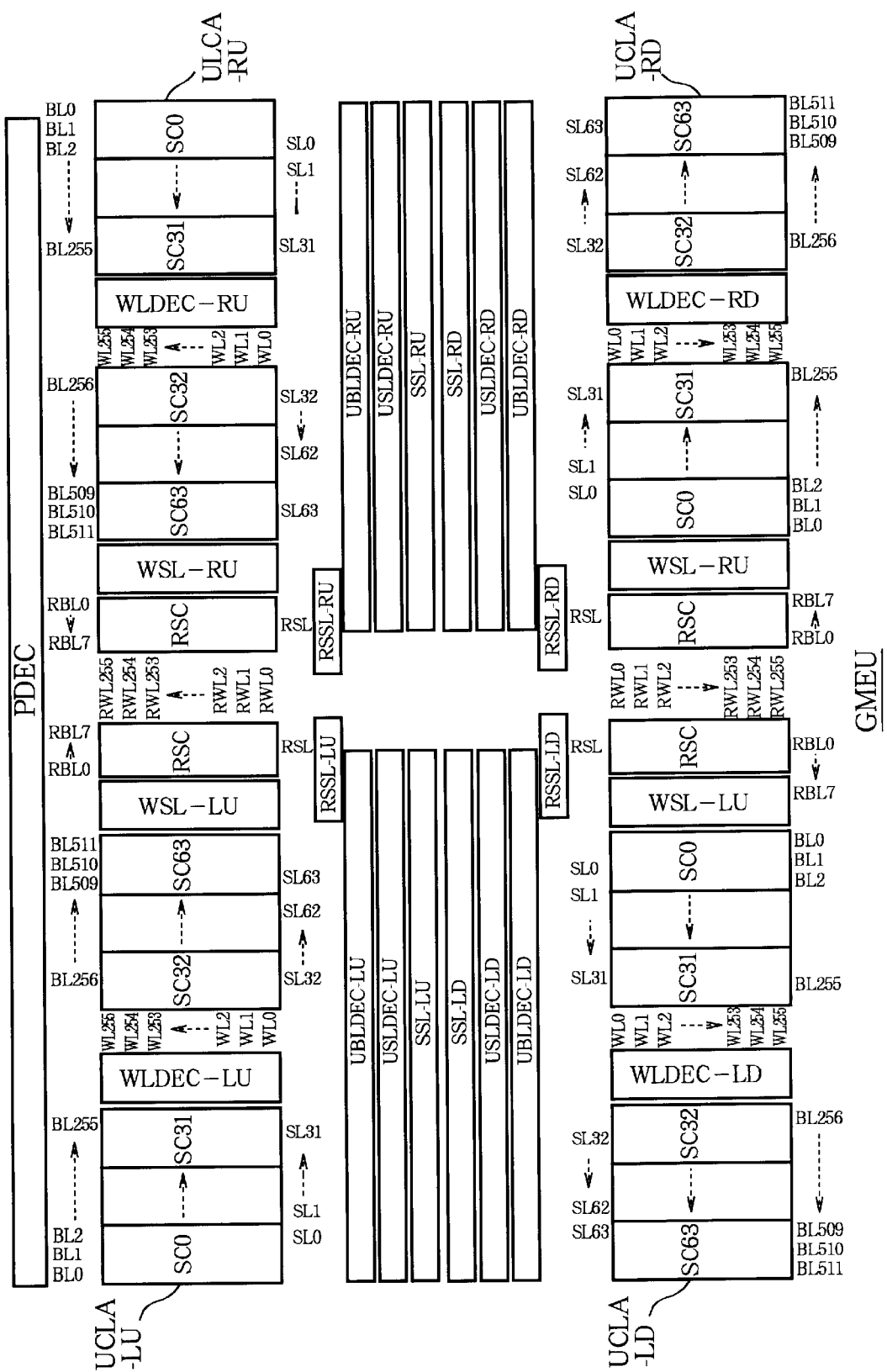
FIG. 44 illustrates the structure of a memory unit in the seventh embodiment in more detail.

FIG. 44 shows the layout of a memory unit GMEU in FIG. 43, using the same reference characters for elements identical to corresponding elements in FIGS. 36 and 39. The memory unit GMEU includes four cell arrays UCLA (UCLA-LU, UCLA-RU, UCLA-LD, UCLA-RD), four word line decoders WLDEC (WLDEC-LU, WLDEC-RU, WLDEC-LD, WLDEC-RD), four bit-line decoders UBLDEC (UBLDEC-LU, UBLDEC-RU, UBLDEC-LD, UBLDEC-RD), four source line decoders USLDEC (USLDEC-LU, USLDEC-RU, USLDEC-LD, USLDEC-RD), four sector selection circuits SSL (SSL-LU, SSL-RU, SSL-LD, SSL-RD), four word line selection circuits WSL (WSL-LU, WSL-RU, WSL-LD, WSL-RD), and four redundant sector selection circuits RSSL (RSSL-LU, RSSL-RU, RSSL-LD, RSSL-RD).

Memory Unit in the Seventh Embodiment

The memory units GMEU in the seventh embodiment differ from the memory units FMEU in the sixth embodiment (FIGS. 38 and 39) in that the word line decoders WLDEC are located in the centers of the cell arrays UCLA, as in the fourth embodiment (FIGS. 32 and 33), and sector selection circuits SSL are provided as in the third embodiment (FIGS. 26 and 27). The word line selection circuits WSL and redundant sector selection circuits RSSL enable a bad sector BSC in one of two cell arrays UCLA-L, UCLA-R forming a left-right pair to be replaced by a redundant sector RSC in the other cell array of the pair. The sector selection circuits SSL enable the sectors SC and redundant sectors RSC to be accessed in the sequence of their physical layout, skipping bad sectors. Since the word line decoders WLDEC are located in the centers of the cell arrays UCLA, threshold voltage deviations are reduced.

Access Procedure in the Seventh Embodiment

If, for example, two bad sectors BSC0, BSC1, both disposed in a left cell array UCLA-L as in FIG. 19, are replaced by the left redundant sector RSC-L and right redundant sector RSC-R, respectively, then cell arrays UCLA-L and UCLA-R are accessed as follows.

For a pair of upper cell arrays UCLA-LU, UCLA-RU, first sectors SC0–SC63 in cell array UCLA-LU and sectors SC0–SC61 in cell array UCLA-RU are accessed alternately, one by one, skipping the bad sectors BSC0, BSC1. Next, the left redundant sector RSC-L is accessed, followed by sector SC62 in cell array UCLA-R, then the right redundant sector RSC-R, and finally sector SC63 in cell array UCLA-R. This completes the access to the pair of cell arrays UCLA-LU and UCLA-RU.

For a pair of lower cell arrays UCLA-LD, UCLA-RD, first the right redundant sector RSC-R is accessed, followed by sector SC0 in cell array UCLA-RD, then the left redundant sector RSC-L, then sector SC1 in cell array UCLA-RD. Next, to complete the access to the pair of cell arrays UCLA-LD and UCLA-RD, sectors SC0–SC63 in cell array UCLA-LD and sectors SC2–SC63 in cell array UCLA-RD are accessed alternately, one by one, skipping the bad sectors BSC0, BSC1.

In the seventh embodiment, as in the third embodiment, a bad sector is replaced by an adjacent sector, either the immediately preceding sector or the immediately following sector, so the replacement leaves the threshold voltage deviation profile substantially unaltered: the deviation profile after the replacement is nearly identical to the deviation profile before the replacement. Redundancy replacement accordingly causes substantially no degradation in the quality of the reproduced audio signal (the quality is substantially the same is if redundancy replacement had not been necessary).

As in the fourth embodiment, since the word line decoders WLDEC are disposed at the centers of the cell arrays UCLA, the fidelity of the reproduced audio signal is improved, regardless of whether redundancy replacement is performed or not, because the threshold voltage deviation profile is improved (the maximum deviation is reduced).

As in the sixth embodiment, the word line selection circuits WSL and redundant sector selection circuits RSSL enable a bad sector on the left side to be replaced by either a left redundant sector RSC-L or a right redundant sector RSC-R, and a bad sector on the right side to be replaced by either a right redundant sector RSC-R or a left redundant sector RSC-L, so up to two bad sectors per cell array can be replaced (provided there are not more than two bad sectors in a single right-left pair of cell arrays UCLA-L, UCLA-R). This improvement in redundancy replacement capability improves the production yield of the analog audio flash memory production process, and the improvement is gained within substantially the same chip area as in a conventional analog audio flash memory.

To summarize the seventh embodiment, the word line decoders WLDEC are located in the center of the cell arrays UCLA, sector selection circuits SSL are provided, the sectors SC0–SC63 in each cell array and the redundant sectors RSC are accessed in the sequence in which they are laid out, word line selection circuits WSL and redundant sector selection circuits RSSL are also provided, and two redundant sectors are available to replace any two bad sectors in a right-left pair of cell arrays. As a result, the fidelity of the reproduced audio signal is improved, regardless of whether or not redundancy replacement is performed; redundancy replacement causes substantially no degradation of the reproduced audio signal; the capability for redundancy replacement is increased; production yields (of the analog audio flash memories) are improved; and the memory chip area remains substantially unchanged.

Figure 45A:
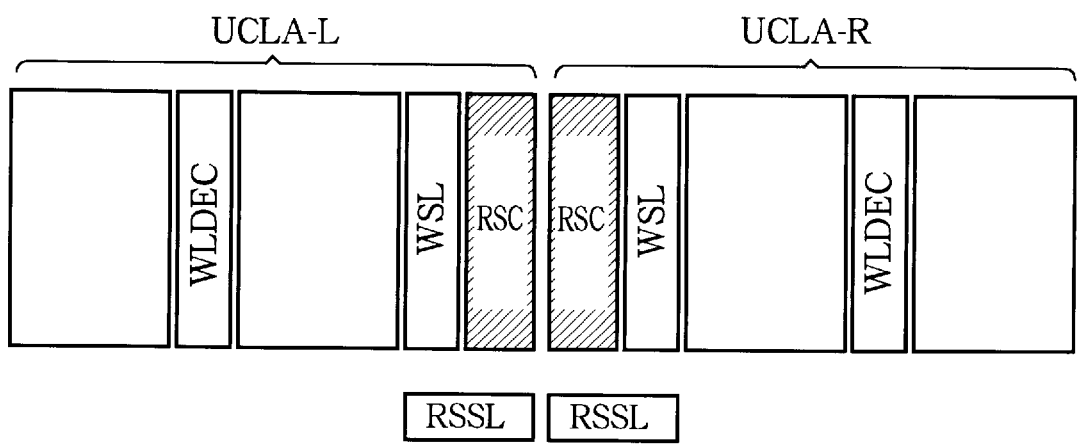
FIGS. 45A and 45B show memory units in variations of the seventh embodiment.
Figure 45B:
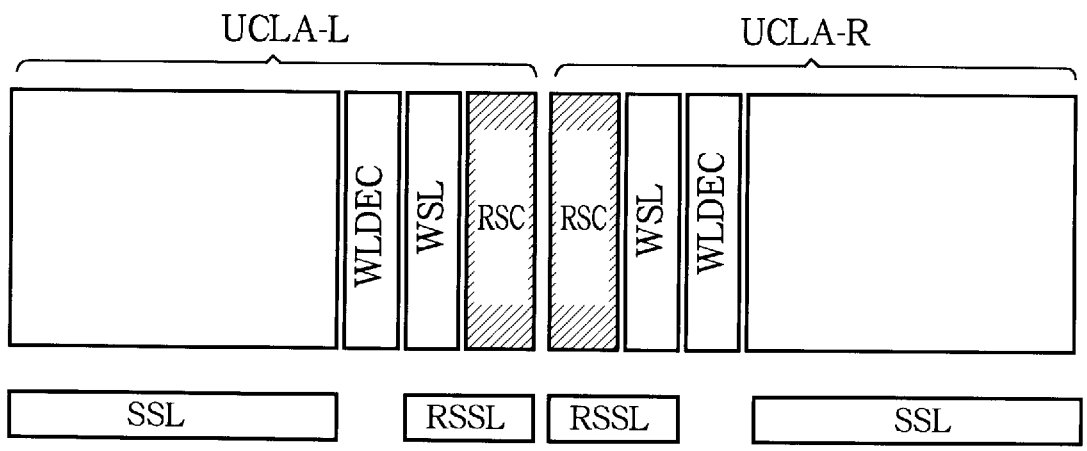

FIGS. 45A and 45B show the layout of a right-left pair of cell arrays and associated circuits in two variations of the seventh embodiment. For simplicity, the bit line decoders and source line decoders are omitted in both drawings. The variation in FIG. 45A modifies the memory units FMEU of the sixth embodiment (FIGS. 38 and 39) by moving the word line decoders WLDEC to the centers of the cell arrays; there are no sector selection circuits SSL. This variation retains the advantage of improved production yields and improved fidelity, and reduces the degradation of the reproduced audio signal, as compared with the conventional redundant memory circuit. The variation in FIG. 45B adds sector selection circuits SSL to the memory units FMEU of the sixth embodiment while leaving the word line decoders WLDEC located at the ends of the cell arrays. This variation also retains the advantage of improved production yields, and substantially eliminates the degradation of the reproduced audio signal caused by redundancy replacement.

The invention is not limited to the embodiments and variations described above. For example, the invention is not limited to an analog audio flash memory, but can be practiced in other types of analog semiconductor memory devices. Those skilled in the art will recognize that further variations are possible within the scope claimed below.

What is claimed is:

1. A redundant memory circuit in an analog semiconductor memory, including:

a cell array having a first end and a second end, a plurality of word lines extending from the first end to the second end of the cell array, and a plurality of memory cells connected to the word lines, each memory cell storing an analog value; and a word line selector for selecting the word lines;

wherein the cell array comprises:

a plurality of sectors disposed sequentially from the first end of the cell array to the second end of the cell array, each sector including a plurality of said memory cells, the sectors being accessed in sequence from one end among the first end and second end of the cell array to another end among the first end and the second end of the cell array; and a pair of redundant sectors, including a first redundant sector disposed at the first end of the cell array and a second redundant sector disposed at the second end of the cell array, for use in replacement of bad sectors among the sectors in the cell array, each redundant sector including a plurality of said memory cells, a single bad sector in the cell array being replaced by the first redundant sector if the bad sector is closer to the first end than to the second end of the cell array, and by the second redundant sector if the bad sector is closer to the second end than to the first end of the cell array, the redundant sector replacing the bad sector being accessed in place of the bad sector in said sequence.

2. The redundant memory circuit of claim 1, wherein the word line selector is disposed at the first end of the cell array.

3. The redundant memory circuit of claim 1, wherein the word line selector is disposed midway between the first end and the second end of the cell array.

4. A redundant memory circuit in an analog semiconductor memory, including:
- a cell array having a first end and a second end, a plurality of word lines extending from the first end to the second end of the cell array, and a plurality of memory cells connected to the word lines, each memory cell storing an analog value; and
- a word line selector for selecting the word lines;

wherein the cell array comprises:
- a plurality of sectors disposed sequentially from the first end of the cell array to the second end of the cell array, each sector including a plurality of said memory cells, the sectors being accessed in sequence from one end among the first end and second end of the cell array to another end among the first end and the second end of the cell array; and
- a redundant sector disposed centrally in the cell array, for use in replacement of a bad sector among the sectors in the cell array, the redundant sector including a plurality of said memory cells, the redundant sector being accessed in place of the bad sector in said sequence.

5. The redundant memory circuit of claim 4, wherein the word line selector is disposed at the first end of the cell array.

6. The redundant memory circuit of claim 4, wherein the word line selector is disposed centrally in the cell array, adjacent the redundant sector.

7. A redundant memory circuit in an analog semiconductor memory, including:
- a cell array having a first end and a second end, a plurality of word lines extending from the first end to the second end of the cell array, and a plurality of memory cells connected to the word lines, each memory cell storing an analog value, the cell array being divided into a plurality of sectors and having at least one redundant sector for replacing a bad sector among said sectors;
- a word line selector for selecting the word lines; and
- a sector selection circuit for selecting the sectors and redundant sector so that, when said bad sector is replaced by the redundant sector, the redundant sector and the sectors, taken together but excluding the bad sector, are accessed in sequence from one end among the first end and second end of the cell array to another end among the first end and the second end of the cell array.

8. The redundant memory circuit of claim 7, wherein the word line selector is disposed at the first end of the cell array.

9. The redundant memory circuit of claim 7, wherein the word line selector is disposed midway between the first end and the second end of the cell array.

10. The redundant memory circuit of claim 7, wherein the redundant sector is disposed at the first end of the cell array.

11. The redundant memory circuit of claim 7, wherein the redundant sector is disposed midway between the first end and the second end of the cell array.

12. The redundant memory circuit of claim 7, wherein the cell array has a pair of redundant sectors, enabling replacement of up to two bad sectors.

13. A redundant memory circuit in an analog semiconductor memory, including:
- a cell array having a first end and a second end, a plurality of word lines extending from the first end to the second end of the cell array, and a plurality of memory cells connected to the word lines, each memory cell storing an analog value, the cell array being divided into a plurality of sectors and having at least one redundant sector for replacing a bad sector among said sectors; and
- a word line selector, disposed midway between the first and the second end of the cell array, for selecting the word lines;

wherein the sectors are accessed in a sequence from the first end to the second end of the cell array, and when said bad sector is replaced by the redundant sector, the redundant sector is accessed in place of the bad sector in said sequence.

14. A redundant memory circuit in an analog semiconductor memory, including:
- a first cell array having a plurality of word lines and a plurality of memory cells connected to the word lines, each memory cell storing an analog value, the first cell array being divided into a plurality of sectors and having at least one first redundant sector;
- a second cell array having another plurality of word lines and another plurality of memory cells connected to the word lines, each memory cell storing an analog value, the second cell array being divided into another plurality of sectors and having at least one second redundant sector;
- a first word line selector for selecting the word lines in the first cell array;
- a second word line selector for selecting the word lines in the second cell array; and
- a redundant sector selection circuit for selecting the first redundant sector and the second redundant sector, thereby enabling any two bad sectors in the first cell array and the second cell array to be replaced by the first redundant sector and the second redundant sector, even if the two bad sectors are both disposed in the same cell array among the first cell array and the second cell array.

15. The redundant memory circuit of claim 14, wherein the first word line selector is disposed centrally in the first cell array, and the second word line selector is disposed centrally in the second cell array.

16. The redundant memory circuit of claim 14, wherein the first cell array has a first end and a second end, further comprising a sector selection circuit for selecting the sectors in the first cell array so that, when said two bad sectors are disposed in the first cell array, the sectors in the first cell array, excluding the two bad sectors, are accessed in sequence from the first end to the second end of the first cell array.

* * * * *